(12) United States Patent
Namai

(10) Patent No.: US 10,331,031 B2
(45) Date of Patent: Jun. 25, 2019

(54) RESIN COMPOSITION, RESIST PATTERN-FORMING METHOD AND POLYMER

(71) Applicant: JSR CORPORATION, Tokyo (JP)

(72) Inventor: Hayato Namai, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 15/402,514

(22) Filed: Jan. 10, 2017

(65) Prior Publication Data

US 2017/0115570 A1    Apr. 27, 2017

Related U.S. Application Data

(60) Division of application No. 15/066,436, filed on Mar. 10, 2016, now abandoned, which is a continuation of
(Continued)

(30) Foreign Application Priority Data

Sep. 12, 2013 (JP) .................................. 2013-189913

(51) Int. Cl.
*G03F 7/09* (2006.01)
*G03F 7/11* (2006.01)
(Continued)

(52) U.S. Cl.
CPC ........ *G03F 7/0397* (2013.01); *C08F 216/165* (2013.01); *C08F 220/28* (2013.01);
(Continued)

(58) Field of Classification Search
CPC .. C08F 220/28; C08F 216/165; C08F 220/68; C08F 2220/283; C09D 129/10; C09D 133/10; C09D 133/14
See application file for complete search history.

(56) References Cited

U.S. PATENT DOCUMENTS

| 4,910,122 A | 3/1990 | Arnold et al. |
| 2002/0009668 A1* | 1/2002 | Nishimura ............ G03F 7/0046 |
| | | 430/270.1 |

(Continued)

FOREIGN PATENT DOCUMENTS

| JP | S59-93448 A | 5/1984 |
| JP | H6-12452 B2 | 2/1994 |

(Continued)

OTHER PUBLICATIONS

International Search Report dated Nov. 4, 2014, in PCT/JP2014/073407 filed Sep. 4, 2014 (w/ English translation).

Office Action dated Dec. 5, 2017 in Japanese Patent Application. No. 2015-536553 (w/ computer-generated English translation).
Japanese Office Action dated Mar. 13, 2018 in Patent Application No. 2015-536553, (with English translation) 4 pages.
Office Action dated Dec. 19, 2017 (received Dec. 21, 2017) in Taiwan Patent Application No. 103131150, citing document AO therein (w/ English translation).

(Continued)

*Primary Examiner* — Cynthia Hamilton
(74) *Attorney, Agent, or Firm* — Oblon, McClelland, Maier & Neustadt, L.L.P.

(57) ABSTRACT

A resin composition comprises a polymer comprising a structural unit that comprises a group represented by formula (1), and a solvent. In the formula (1), $R^1$ to $R^4$ each independently represent a hydrogen atom, a fluorine atom or a monovalent organic group having 1 to 20 carbon atoms, wherein at least one of $R^1$ to $R^4$ has the fluorine atom or a group including the fluorine atom. $R^5$ represents a substituted or unsubstituted trivalent chain hydrocarbon group having 1 to 7 carbon atoms. * denotes a binding site to other moiety of the structural unit. The structural unit is preferably represented by any one of formulae (2-1) to (2-3). In the formulae (2-1) to (2-3), Z represents a group represented by formula (1).

(1)

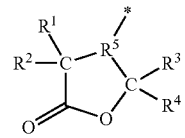

(2-1)

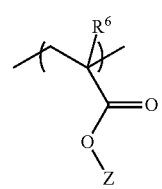

(2-2)

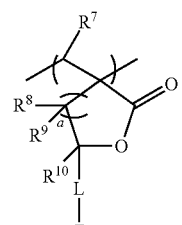

(2-3)

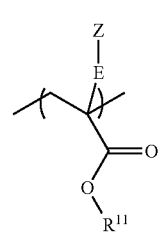

12 Claims, No Drawings

Related U.S. Application Data application No. PCT/JP2014/073407, filed on Sep. 4, 2014.

(51) Int. Cl.

| | | |
|---|---|---|
| G03F 7/16 | (2006.01) | |
| G03F 7/20 | (2006.01) | |
| G03F 7/32 | (2006.01) | |
| G03F 7/38 | (2006.01) | |
| G03F 7/004 | (2006.01) | |
| G03F 7/038 | (2006.01) | |
| G03F 7/039 | (2006.01) | |
| C08F 216/16 | (2006.01) | |
| C08F 220/28 | (2006.01) | |
| C08F 220/68 | (2006.01) | |
| C09D 129/10 | (2006.01) | |
| C09D 133/10 | (2006.01) | |
| C09D 133/14 | (2006.01) | |

(52) U.S. Cl.
CPC .......... *C08F 220/68* (2013.01); *C09D 129/10* (2013.01); *C09D 133/10* (2013.01); *C09D 133/14* (2013.01); *G03F 7/0045* (2013.01); *G03F 7/0046* (2013.01); *G03F 7/038* (2013.01); *G03F 7/091* (2013.01); *G03F 7/11* (2013.01); *G03F 7/162* (2013.01); *G03F 7/168* (2013.01); *G03F 7/20* (2013.01); *G03F 7/2004* (2013.01); *G03F 7/2037* (2013.01); *G03F 7/2041* (2013.01); *G03F 7/32* (2013.01); *G03F 7/322* (2013.01); *G03F 7/38* (2013.01); *C08F 2220/281* (2013.01); *C08F 2220/282* (2013.01); *C08F 2220/283* (2013.01)

(56) References Cited

U.S. PATENT DOCUMENTS

| | | | |
|---|---|---|---|
| 2002/0058201 A1* | 5/2002 | Miyaji | ............ G03F 7/038 430/270.1 |
| 2005/0208419 A1 | 9/2005 | Inabe | |
| 2012/0040294 A1 | 2/2012 | Maeda | |
| 2012/0295197 A1 | 11/2012 | Kiridoshi | |

FOREIGN PATENT DOCUMENTS

| | | |
|---|---|---|
| JP | H11-212265 A | 8/1999 |
| JP | 2003-5375 A | 1/2003 |
| JP | 2005-29516 A | 2/2005 |
| JP | 2005-325293 A | 11/2005 |
| JP | 2006-79048 A | 3/2006 |
| JP | 2007-153982 A | 6/2007 |
| JP | 2007-182488 A | 7/2007 |
| JP | 2008-83370 A | 4/2008 |
| JP | 2009-134088 A | 6/2009 |
| JP | 2011-118318 A | 6/2011 |
| JP | 2013-76789 A | 4/2013 |
| TW | 201033733 A1 | 9/2010 |
| WO | WO 2005/069076 A1 | 7/2005 |
| WO | WO 2011/062168 A1 | 5/2011 |
| WO | WO 2011/145703 A1 | 11/2011 |
| WO | WO 2012/133352 A1 | 10/2012 |

OTHER PUBLICATIONS

Office Action dated Aug. 31, 2018 in Taiwanese Patent Application No. 103131150 (with English language translation).
Office Action dated Feb. 19, 2019, in Japanese Patent Application No. 2018-008201 (w/ Computer-generated English translation).

\* cited by examiner

RESIN COMPOSITION, RESIST PATTERN-FORMING METHOD AND POLYMER

CROSS-REFERENCE TO RELATED APPLICATIONS

The present application is a divisional application of U.S. patent application Ser. No. 15/066,436, filed Mar. 10, 2016, which in turn is a continuation application of International Application No. PCT/JP2014/073407, filed Sep. 4, 2014, which claims priority to Japanese Patent Application No. 2013-189913, filed Sep. 12, 2013. The contents of these applications are incorporated herein by reference in their entirety.

BACKGROUND OF THE INVENTION

Field of the Invention

The present invention relates to a resin composition, a resist pattern-forming method and a polymer.

Discussion of the Background

Resist pattern-forming methods by photolithography are used for formation of various types of electronic device structures such as semiconductor devices and liquid crystal devices. Various resin compositions are used for these resist pattern-forming methods, and are exemplified by a radiation-sensitive resin composition for forming a resist pattern on the upper face side of a substrate, a resin composition for forming a protective film for liquid immersion lithography, which is used for forming a protective film on the upper face side of the resist film formed from the radiation-sensitive resin composition. According to the radiation-sensitive resin composition, an acid is generated in light-exposed regions upon irradiation with exposure light, e.g., a far ultraviolet ray such as an ArF excimer laser, an electron beam, etc., and a catalytic action of the acid produces a difference in rate of dissolution in a developer solution between the light-exposed regions and light-unexposed regions, thereby enabling the resist pattern to be formed on the substrate. In addition, according to the resin composition for forming a protective film for liquid immersion lithography, since the surface of the protective film formed therefrom generally exhibits water repellency, high speed scanning in liquid immersion lithography can be facilitated, leading to efficient formation of the resist pattern.

Such resin compositions are required to enable a resist pattern to be formed which exhibits not only a high resolution and superior rectangularity of cross-sectional shape, as well as low Line Width Roughness (LWR) and superior Critical Dimension Uniformity (CDU), but also a great depth of focus and exposure latitude, and are further required to form a pattern with high accuracy in a high process yield. To address the demand, the structure of the polymer contained in the resin compositions has been extensively studied, and it is known that incorporation of a lactone structure such as a butyrolactone structure and a norbornanelactone structure can enhance the adhesiveness of the resist pattern to a substrate, and improve the aforementioned performances (see Japanese Unexamined Patent Application, Publication Nos. H11-212265, 2003-5375 and 2008-83370).

At present when microfabrication of the resist pattern has proceeded to a level for a line width of no greater than 45 nm, demanded levels for the aforementioned performances have further raised.

SUMMARY OF THE INVENTION

According to one aspect of the present invention, a resin composition comprises: a polymer comprising a structural unit that comprises a group represented by formula (1); and a solvent.

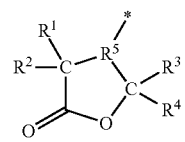

(1)

In the formula (1), $R^1$ to $R^4$ each independently represent a hydrogen atom, a fluorine atom or a monovalent organic group having 1 to 20 carbon atoms, wherein at least one of $R^1$ to $R^4$ represents the fluorine atom or a group comprising the fluorine atom; $R^5$ represents a substituted or unsubstituted trivalent chain hydrocarbon group having 1 to 7 carbon atoms; and * denotes a binding site to other moiety of the structural unit.

According to another aspect of the present invention, a laminate structure comprises: a resist film; and a protective film which is a cured product of the resin composition according to claim 1, and which is overlaid on the resist film.

According to further aspect of the present invention, a resist pattern-forming method comprises: applying the resin composition directly or indirectly on a substrate to form a resist film. The resist film is exposed. The resist film is exposed.

According to further aspect of the present invention, a resist pattern-forming method comprises: forming a resist film. The resin composition is applied on the resist film to form a protective film overlaid on the resist film. The resist film having the protective film overlaid thereon is subjected to liquid immersion lithography. The resist film subjected to the liquid immersion lithography is developed.

According to further aspect of the present invention, a polymer comprises a structural unit that comprises a group represented by formula (1).

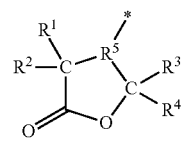

(1)

In the formula (1), $R^1$ to $R^4$ each independently represent a hydrogen atom, a fluorine atom or a monovalent organic group having 1 to 20 carbon atoms, wherein at least one of $R^1$ to $R^4$ represents the fluorine atom or a group comprising the fluorine atom; $R^5$ represents a substituted or unsubstituted trivalent chain hydrocarbon group having 1 to 7 carbon atoms; and * denotes a binding site to other moiety of the structural unit.

DESCRIPTION OF THE EMBODIMENTS

According to an embodiment of the invention, a resin composition contains: a first polymer (hereinafter, may be also referred to as "(A) polymer" or "polymer (A)") having a structural unit (hereinafter, may be also referred to as "structural unit (I)") that includes a group represented by the following formula (1) (hereinafter, may be also referred to as "group (1)"); and a solvent (hereinafter, may be also referred to as "(B) solvent" or "solvent (B)"),

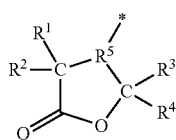

(1)

wherein, in the formula (1), $R^1$ to $R^4$ each independently represent a hydrogen atom, a fluorine atom or a monovalent organic group having 1 to 20 carbon atoms, wherein at least one of $R^1$ to $R^4$ represents the fluorine atom or a group including the fluorine atom; $R^5$ represents a substituted or unsubstituted trivalent chain hydrocarbon group having 1 to 7 carbon atoms; and * denotes a binding site to other moiety of the structural unit.

According to another embodiment of the invention, a resist pattern-forming method includes the steps of: forming a resist film; exposing the resist film; and developing the resist film exposed, wherein the resist film is formed from the resin composition according to the embodiment of the present invention.

According to still another embodiment of the invention, a resist pattern-forming method includes the steps of: forming a resist film; overlaying a protective film on the resist film; subjecting the resist film having a protective film overlaid thereon to liquid immersion lithography; and developing the resist film subjected to the liquid immersion lithography, wherein the protective film is formed from the resin composition according to the embodiment of the present invention.

According to yet still another embodiment of the invention, a polymer is provided which has a structural unit that includes the group represented by the above formula (1).

The "organic group" as referred to herein means a group that contains at least one carbon atom.

Moreover, the "hydrocarbon group" as referred to includes chain hydrocarbon groups, alicyclic hydrocarbon groups and aromatic hydrocarbon groups. This "hydrocarbon group" may be a saturated hydrocarbon group or an unsaturated hydrocarbon group. The "chain hydrocarbon group" as referred to means a hydrocarbon group that is constituted with only a chain structure without having a cyclic structure, and the term "chain hydrocarbon group" includes both linear hydrocarbon groups and branched hydrocarbon groups. The "alicyclic hydrocarbon group" as referred to means a hydrocarbon group that has as a ring structure not an aromatic ring structure but only an alicyclic structure, and the term "alicyclic hydrocarbon group" includes both monocyclic alicyclic hydrocarbon groups and polycyclic alicyclic hydrocarbon groups. However, it is not necessary for the alicyclic hydrocarbon group to be constituted with only an alicyclic structure, and a part thereof may have a chain structure. The "aromatic hydrocarbon group" as referred to means a hydrocarbon group that has an aromatic ring structure as a ring structure. However, it is not necessary for the aromatic hydrocarbon group to be constituted with only an aromatic ring structure, and a part thereof may have a chain structure and/or an alicyclic structure.

The resin composition and the resist pattern-forming methods according to the embodiments of the present invention enable a resist pattern that is superior in LWR performance, CDU performance, resolution and rectangularity of cross-sectional shape to be formed while a greater depth of focus and exposure latitude are exhibited. The polymer according to the yet still another embodiment of the present invention can be suitably used as a polymer component of the resin composition according to the embodiment of the present invention. Therefore, these can be suitably used for pattern formation in production of semiconductor devices, and the like, in which further progress of miniaturization is expected in the future. Hereinafter, the embodiments will be explained in detail.

Resin Composition

The resin composition contains the polymer (A) and the solvent (B).

A suitable embodiment of the resin composition is exemplified by a radiation-sensitive resin composition (hereinafter, may be also referred to as "resin composition (A)"), a resin composition for forming a protective film for liquid immersion lithography (hereinafter, may be also referred to as "resin composition (B)"), and the like.

Resin Composition (A)

In a case where the resin composition is the resin composition (A) (i.e., a radiation-sensitive resin composition), the resin composition contains the polymer (A) and the solvent (B), further contains a radiation-sensitive acid generator (hereinafter, may be also referred to as "(C) acid generator" or "acid generator (C)"), may contain as a favorable component, (D) an acid diffusion controller, (E) a fluorine atom-containing polymer other than the polymer (A) (hereinafter, may be also referred to as "(E) polymer" or "polymer (E)"), a second polymer (hereinafter, may be also referred to as "(F) polymer" or "polymer (F)") having a lower percentage content of fluorine atoms than that of the polymer (A) and having a structural unit that includes an acid-labile group, and may also contain other optional component within a range not leading to impairment of the effects of the present invention.

The resin composition (A) may contain a base polymer alone as a polymer component, or may contain a water repellent polymer additive in addition to the base polymer. The "base polymer" as referred to means a polymer that is contained in the resist film formed from the resin composition (A) as a principal component, and preferably a polymer that will account for no less than 50% by mass with respect to the total polymer constituting the resist film. Moreover, the "water repellent polymer additive" as referred to means a polymer that, when contained in the resin composition (A), tends to be localized in the surface region of the formed resist film. A polymer having higher hydrophobicity than that of the polymer contained as the base polymer tends to be localized in the surface region of the resist film, and can function as the water repellent polymer additive. When the resin composition (A) contains the water repellent polymer additive, elution of the acid generator and the like from the resist film can be inhibited, and the surface of the formed resist film can achieve a greater dynamic contact angle; thus, the surface of the resist film can exhibit superior water draining properties. Thus, in the liquid immersion lithography process, it is unnecessary to additionally provide an upper layer film that isolates the surface of the resist film from a liquid immersion medium, whereby an exposure by high speed scanning is enabled. In a case where the resin composition (A) contains the water repellent polymer additive, the content of the water repellent polymer additive with respect to 100 parts by mass of the base polymer is preferably 0.1 parts by mass to 20 parts by mass, more preferably 0.3 parts by mass to 15 parts by mass, and still more preferably 0.5 parts by mass to 10 parts by mass. The content of the base polymer in the resin composition (A) with respect to the total solid content in resin composition (A) is preferably no less than 70% by mass, more preferably no less than 80% by mass, and still more preferably no less than 85% by mass.

In order for a polymer to favorably function as the water repellent polymer additive in the resin composition (A), the polymer constituting the water repellent polymer additive is preferably a fluorine atom-containing polymer, and the polymer more preferably has a greater percentage content of fluorine atoms than that of the base polymer. When the water repellent polymer additive has a greater percentage content of fluorine atoms than that of the base polymer, the water repellent polymer additive further tends to be localized in the surface region of the formed resist film, characteristics such as superior water draining properties of the resist film surface due to the hydrophobicity of the water repellent polymer additive may be further effectively exhibited. The percentage content of fluorine atoms of the polymer constituting the water repellent polymer additive is preferably no less than 1% by mass, more preferably no less than 3% by mass, still more preferably no less than 5% by mass, and particularly preferably no less than 7% by mass. It is to be noted that the percentage content (% by mass) of fluorine atoms is calculated based on the structure of the polymer determined by $^{13}$C-NMR.

More specific polymer component(s) contained in the resin composition (A) may be exemplified by the following: (1) the polymer (A) as the base polymer; (2) the polymer (A) as the base polymer and the polymer (A) as the water repellent polymer additive; (3) the polymer (A) as the base polymer and the polymer (E) as the water repellent polymer additive; (4) the polymer (F) as the base polymer and the polymer (A) as the water repellent polymer additive; and the like.

Resin Composition (B)

In a case where the resin composition is the resin composition (B) (i.e., a resin composition for forming a protective film for liquid immersion lithography), the resin composition contains the polymer (A) and the solvent (B), may contain the polymer (E) as a favorable component, and may also contain other optional component within a range not leading to impairment of the effects of the present invention.

The content of the polymer component in the resin composition (B) with respect to the total solid content in resin composition (B) is preferably no less than 80% by mass, more preferably no less than 90% by mass, and still more preferably no less than 95% by mass.

Hereinafter, each component will be described.

(A) Polymer

The polymer (A) has the structural unit (I). Due to the polymer (A) having the structural unit (I), the resin composition can form a resist pattern that is superior in LWR performance, CDU performance, resolution and rectangularity of cross-sectional shape while a greater depth of focus and exposure latitude are exhibited (hereinafter, these characteristics may be also referred to as "lithography performances"). Although not necessarily clarified, the reason for achieving the effects described above due to the resin composition having the aforementioned constitution is inferred as in the following, for example. Specifically, the structural unit (I) has a lactone ring having a fluorine atom as shown in the above formula (1), and would be highly polar. Thus, the solubility of the polymer (A) in a developer solution could be adjusted more appropriately. Moreover, in the case of the resin composition (A), the diffusion length of the acid generated from the acid generator (C) would be decreased more appropriately. As a result of these, according to the resin composition, the lithography performances of the formed resist pattern would be improved. In addition, in the structural unit (I), since at least one of $R^1$ to $R^4$ that bond to any one of the carbon atoms adjacent to —COO— of the lactone ring in the above formula (1) has a fluorine atom, a property of the lactone ring to be hydrolyzed by an action of an alkali would be enhanced. When this lactone ring gives a carboxy group and a hydroxy group upon the opening through hydrolysis, the polymer (A) would have high hydrophilicity in a development with an alkali, and consequently the solubility of the polymer (A) in an alkaline developer solution would be further increased. As a result, according to the resin composition, the lithography performances of the formed resist pattern would be further improved.

The polymer (A) as the base polymer in the resin composition (A) (hereinafter, may be also referred to as "(A1) polymer" or "(A1) polymer") has, in addition to the structural unit (I), preferably a structural unit (II) that includes an acid-labile group, and a structural unit (III) that includes at least one selected from the group consisting of a lactone structure, a cyclic carbonate structure and a sultone structure, and may have a structural unit (IV) that includes a polar group, and a structural unit other than the structural units (I) to (IV).

The polymer (A) as the water repellent polymer additive in the resin composition (A) (hereinafter, may be also referred to as "(A2) polymer" or "polymer (A2)") has, in addition to the structural unit (I), preferably the structural unit (II) and a structural unit (V) that is a structural unit other than the structural unit (I) and has a fluorine atom. Further, the polymer (A2) may have the structural unit (III) and/or the structural unit (IV), and may have a structural unit other than the structural units (I) to (V).

The polymer (A) in the resin composition (B) (hereinafter, may be also referred to as "(A3) polymer" or "polymer (A3)") has, in addition to the structural unit (I), preferably a structural unit (VI) that includes a group (z) having a hydroxy group at the end thereof and at least one fluorine atom or a fluorinated alkyl group on a carbon atom adjacent to the hydroxy group. Further, the polymer (A3) may have the structural unit (V) and/or a structural unit (VII) that includes a sulfo group, and may have a structural unit other than the structural units (I) and (V) to (VII).

The polymer (A) may have either one, or two or more types of each structural unit.

Hereinafter, each structural unit will be described.

Structural Unit (I)

The structural unit (I) includes a group represented by the following formula (I).

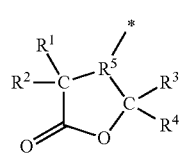

(1)

In the above formula (1), $R^1$ to $R^4$ each independently represent a hydrogen atom, a fluorine atom or a monovalent organic group having 1 to 20 carbon atoms, wherein at least one of $R^1$ to $R^4$ represents the fluorine atom or a group including the fluorine atom; $R^5$ represents a substituted or unsubstituted trivalent chain hydrocarbon group having 1 to 7 carbon atoms; and * denotes a binding site to other moiety of the structural unit.

The monovalent organic group having 1 to 20 carbon atoms which may be represented by $R^1$ to $R^4$ is exemplified by: a monovalent hydrocarbon group having 1 to 20 carbon atoms; a group obtained from the hydrocarbon group by incorporating a divalent hetero atom-containing group between adjacent carbon atoms or at the end on the atomic bonding side of the hydrocarbon group; a group obtained by substituting with a monovalent hetero atom-containing group, a part or all of hydrogen atoms included in the hydrocarbon group or the group obtained from the hydrocarbon group by incorporating a divalent hetero atom-containing group; and the like.

The monovalent hydrocarbon group having 1 to 20 carbon atoms is exemplified by a chain hydrocarbon group having 1 to 20 carbon atoms, an alicyclic hydrocarbon group having 3 to 20 carbon atoms, an aromatic hydrocarbon group having 6 to 20 carbon atoms, and the like.

Examples of the chain hydrocarbon group include:
alkyl groups such as a methyl group, an ethyl group, a propyl group, a to butyl group and a pentyl group;
alkenyl groups such as an ethenyl group, a propenyl group, a butenyl group and a pentenyl group;
alkynyl groups such as an ethynyl group, a propynyl group, a butynyl group and a pentynyl group; and the like.

Examples of the alicyclic hydrocarbon group include:
monocyclic cycloalkyl groups such as a cyclopropyl group, a cyclobutyl group, a cyclopentyl group and a cyclohexyl group;
polycyclic cycloalkyl groups such as a norboniyl group, an adamantyl group, a tricyclodecyl group and a tetracyclododecyl group;
monocyclic cycloalkenyl groups such as a cyclopropenyl group, a cyclobutenyl group, a cyclopentenyl group and a cyclohexenyl group;
polycyclic cycloalkenyl groups such as a norbomenyl group and a tricyclodecenyl group; and the like.

Examples of the aromatic hydrocarbon group include:
aryl groups such as a phenyl group, a tolyl group, a xylyl group, a naphthyl group and an anthryl group;
aralkyl groups such as a benzyl group, a phenethyl group, a naphthylmethyl group and an anthrylmethyl group; and the like.

Examples of the hetero atom included in the monovalent hetero atom-containing group or the divalent hetero atom-containing group include an oxygen atom, a sulfur atom, a nitrogen atom, a silicon atom, a phosphorus atom, and the like. Of these, the oxygen atom, the sulfur atom and the nitrogen atom are preferred, and the oxygen atom is more preferred.

Examples of the divalent hetero atom-containing group include —O—, —CO—, —CS—, —NR'—, a combination thereof, and the like, wherein R' represents a hydrogen atom or a monovalent hydrocarbon group having 1 to 10 carbon atoms.

Examples of the monovalent hetero atom-containing group include a hydroxy group, a carboxy group, a sulfanyl group (—SH), an amino group, a cyano group, and the like.

At least one of $R^1$ to $R^4$ in the above formula (1) represents the fluorine atom or a group including the fluorine atom. Since such a group including the fluorine atom bonds to the lactone ring in the structural unit (I), the polymer (A) can exhibit superior water repellency, and stresses generated in the formed resist film or the like during a development and rinsing can be reduced. As a result, superior lithography performances, e.g., inhibition of pattern collapse, can be exhibited.

In a case where at least one of $R^1$ and $R^2$ has a fluorine atom, it is preferred that at least one of $R^1$ and $R^2$ represents a fluorine atom or a fluorinated alkyl group, it is more preferred that both $R^1$ and $R^2$ represent a fluorine atom or a fluorinated alkyl group, it is still more preferred that both $R^1$ and $R^2$ represent a fluorine atom or a perfluoroalkyl group, it is particularly preferred that both $R^1$ and $R^2$ represent a fluorine atom or a trifluoromethyl group, and it is further particularly preferred that both $R^1$ and $R^2$ represent a fluorine atom.

In a case where at least one of $R^3$ and $R^4$ has a fluorine atom, one of $R^3$ and $R^4$ represents preferably a monovalent group including the fluorine atom, more preferably a fluorinated alkyl group, or a group having —COO— and a fluorine atom, still more preferably a perfluoroalkyl group, a hydrocarbonoxycarbonyldifluoromethyl group, or a fluorinated alkoxycarbonyldifluoromethyl group, and particularly preferably a trifluoromethyl group, an alkoxycarbonyldifluoromethyl group or a fluorinated alkoxycarbonyldifluoromethyl group. It is further particularly preferred that both $R^3$ and $R^4$ represent a trifluoromethyl group.

The at least one of $R^1$ to $R^4$ which has the fluorine atom represents preferably a fluorine atom or a group represented by the following formula (a). When the at least one of $R^1$ to $R^4$ which has the fluorine atom represents the group described above, the fluorine atom is situated in the vicinity of —COO— of the lactone ring in the above formula (1), leading an improvement of the alkali-cleavability of the lactone ring. As a result, the lithography performances of the resin composition may be improved.

In the above formula (a), $R^a$ and $R^b$ each independently represent a hydrogen atom, a fluorine atom or a monovalent organic group having 1 to 19 carbon atoms.

Examples of the monovalent organic group having 1 to 19 carbon atoms which may be represented by $R^a$ and $R^b$ include monovalent organic groups having 1 to 19 carbon atoms among the monovalent organic groups exemplified in connection with $R^1$ to $R^4$, and the like.

$R^a$ preferably represents a fluorine atom, an alkoxycarbonyl group or a fluorinated alkoxycarbonyl group.

$R^b$ preferably represents a fluorine atom.

Examples of the trivalent chain hydrocarbon group having 1 to 7 carbon atoms represented by $R^5$ include:
alkanetriyl groups such as a rnethanetriyl group, an ethanetriyl group, a propanetriyl group, a butanetriyl group, a pentanetriyl group, a hexanetriyl group and a heptanetriyl group;
alkenetriyl groups such as an ethenetriyl group, a propenetriyl group and a butenetriyl group;
alkynetriyl groups such as a propynetriyl group and a butynetriyl group; and the like.

Of these, the alkanetriyl group is preferred, and the methanetriyl group, the ethanetriyl group and the propanetriyl group are more preferred.

Examples of the substituent which may be incorporated into the trivalent chain hydrocarbon group include halogen atoms such as a fluorine atom, a chlorine atom, a bromine atom and an iodine atom, a hydroxy group, a carboxy group, an alkoxy group, an alkoxycarbonyl group, an acyl group, an acyloxy group, a cyano group, a nitro group, and the like.

Of these, the fluorine atom and the alkoxycarbonyl group are preferred, and the fluorine atom and a methoxycarbonyl group are more preferred.

Examples of the structural unit (I) include structural units represented by the following formulae (2-1) to (2-3) (hereinafter, may be also referred to as "structural units (I-1) to (I-3)"), and the like.

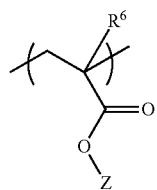

(2-1)

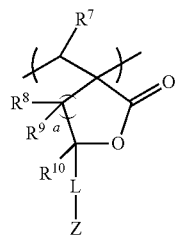

(2-2)

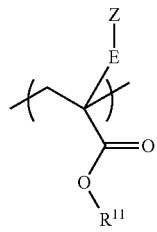

(2-3)

In the above formulae (2-1) to (2-3), Z represents the group represented by the above formula (1).

In the above formula (2-1), $R^6$ represents a hydrogen atom, a fluorine atom, a methyl group or a trifluoromethyl group.

In the above formula (2-2), $R^7$ represents a hydrogen atom or a methyl group; $R^8$, $R^9$ and $R^{10}$ each independently represent a hydrogen atom, a halogen atom, a hydroxy group or a monovalent organic group having 1 to 20 carbon atoms, or at least two of one or a plurality of $R^8$(s) and one or a plurality of $R^9$(s) and $R^{10}$ may taken together represent a ring structure having 3 to 20 ring atoms; a is an integer of 1 to 4, wherein in a case where a is no less than 2, a plurality of $R^8$s may be identical or different with each other, and a plurality of $R^9$s may be identical or different with each other; L represents a single bond or a divalent linking group, wherein $R^{10}$ and L may taken together represent a ring structure having 3 to 20 ring atoms, together with the carbon atom to which $R^{10}$ and L bond.

In the above formula (2-3), $R^{11}$ represents a hydrogen atom or a monovalent organic group having 1 to 20 carbon atoms; and E represents a single bond or a divalent linking group.

In light of the copolymerizability of a monomer that gives the structural unit (I), $R^6$ in the above formula (2-1) represents preferably a hydrogen atom or a methyl group, and more preferably a methyl group.

$R^6$ in the above formula (2-2) preferably represents a hydrogen atom in light of the copolymerizability of a monomer that gives the structural unit (I).

Examples of the monovalent organic group having 1 to 20 carbon atoms which may be represented by $R^8$, $R^9$, $R^{10}$ or $R^{11}$ include monovalent organic groups similar to those exemplified in connection with $R^1$ to $R^4$, and the like.

$R^8$ and $R^9$ each independently represent preferably a hydrogen atom or an alkyl group, and more preferably a hydrogen atom.

$R^{10}$ represents preferably a monovalent hydrocarbon group, more preferably a monovalent chain hydrocarbon group, or a monovalent alicyclic hydrocarbon group, still more preferably an alkyl group or a cycloalkyl group, and particularly preferably a methyl group, an ethyl group, a cyclohexyl group or an adamantyl group.

$R^{11}$ represents preferably a monovalent hydrocarbon group, more preferably a monovalent acid-labile group, or a nonlabile monovalent chain hydrocarbon group, still more preferably a nonlabile alkyl group, and particularly preferably a methyl group or an ethyl group.

Examples of the divalent linking group which may be represented by L or E include —O—, —S—, —CO—, —CS—, —NR'—, a divalent hydrocarbon group, a combination thereof, and the like, wherein R' represents a monovalent hydrocarbon group having 1 to 10 carbon atoms.

Examples of the ring structure having 3 to 20 ring atoms which may be taken together represented by at least two of one or a plurality of $R^8$(s) and one or a plurality of $R^9$(s) and $R^{10}$ include: alicyclic structures such as a cyclopropane structure, a cyclobutane structure, a cyclopentane structure, a cyclohexane structure, a norbornane structure and an adamantane structure; aliphatic heterocyclic structures such as oxacyclopentane structure, a thiacyclopentane structure and an azacyclopentane structure; and the like.

In the above formula (2-2), a is preferably 1 or 2, and more preferably 1.

Examples of the structural unit (I-1) include structural units represented by the following formula (2-1-1) or (2-1-2) (hereinafter, may be also referred to as "structural unit (I-1-1) or (I-1-2)"), examples of the structural unit (I-2) include structural units represented by the following formulae (2-2-1) to (2-2-3) (hereinafter, may be also referred to as "structural units (I-2-1) to (I-2-3)"), and examples of the structural unit (I-3) include structural units represented by the following formula (2-3-1) or (2-3-2) (hereinafter, may be also referred to as "structural unit (I-3-1) or (I-3-2)"), and the like.

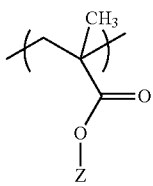

(2-1-1)

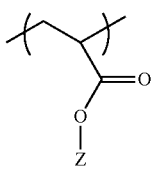

(2-1-2)

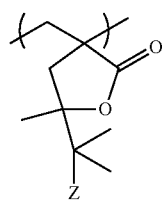 (2-2-1)
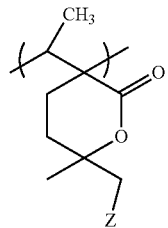 (2-2-2)
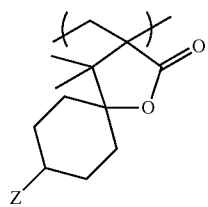 (2-2-3)
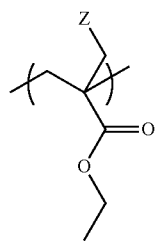 (2-3-1)
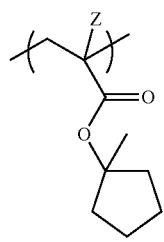 (2-3-2)
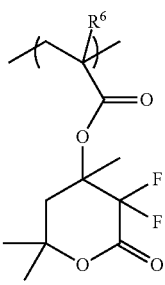 (2-1-1)
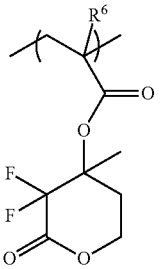 (2-1-2)
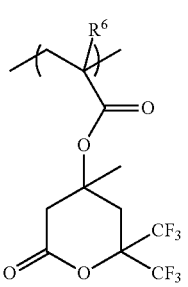 (2-1-3)
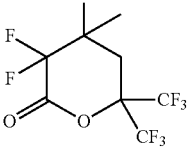 (2-1-4)
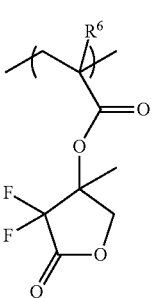 (2-1-5)
In the above formulae (2-1-1) to (2-3-2), Z is as defined in the above formulae (2-1) to (2-3).
Of these, the structural unit (I-1-1) is preferred.
Examples of the structural unit (I) include structural units represented by the following formulae (2-1-1) to (2-3-1) (hereinafter, may be also referred to as "structural units (I-1-1) to (I-3-1)"), and the like.

(2-1-6) 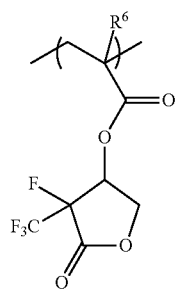
(2-1-7) 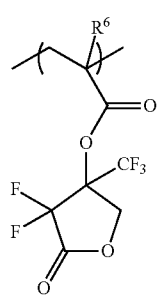
(2-1-8) 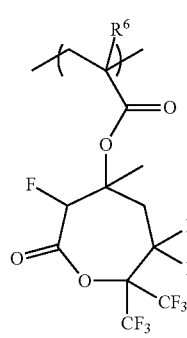
(2-1-9) 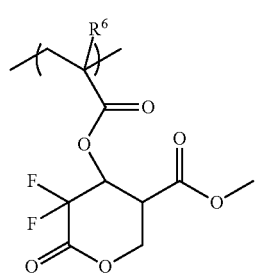
(2-1-10) 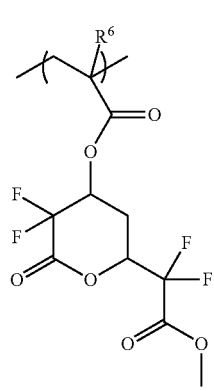
(2-1-11) 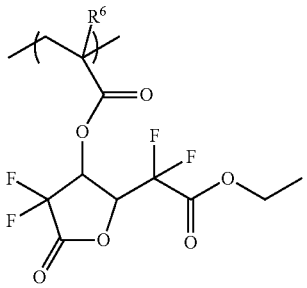
(2-1-12) 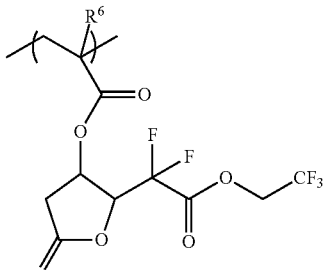
(2-1-13) 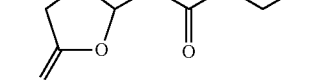
(2-1-14) 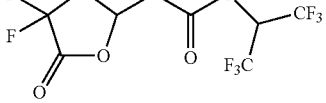
(2-1-15) 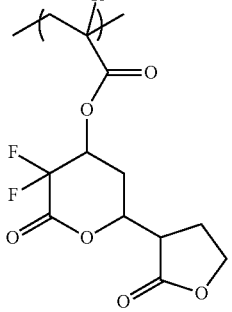

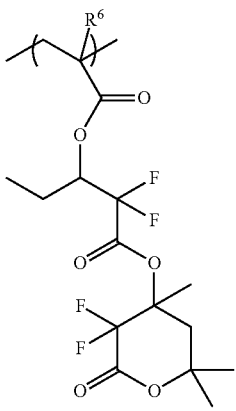
(2-1-16)

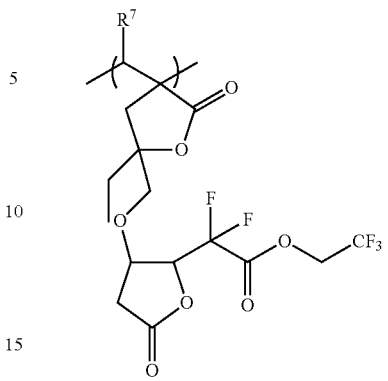
(2-2-2)

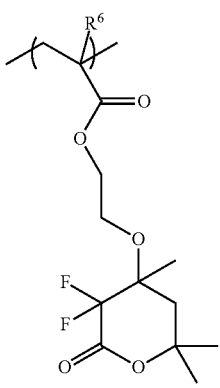
(2-1-17)

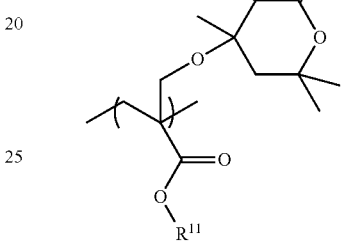
(2-3-1)

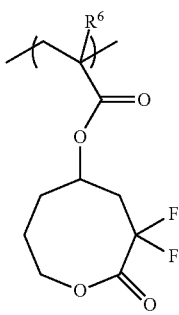
(2-1-18)

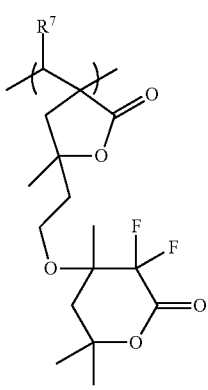
(2-2-1)

In the above formulae (2-1-1) to (2-1-18), $R^6$ is as defined in the above formula (2-1). In the above formulae (2-2-1) and (2-2-2), $R^7$ is as defined in the above formula (2-2). In the above formula (2-3-1), $R^{11}$ is as defined in the above formula (2-3).

Of these, the structural units (I-1-1) to (I-1-17) are preferred.

The lower limit of the proportion of the structural unit (I) in the polymer (A1) with respect to the total structural units constituting the polymer (A1) is preferably 1 mol %, more preferably 3 mol %, still more preferably 5 mol %, and particularly preferably 10 mol %. The upper limit of the proportion of the structural unit (I) is preferably 90 mol %, more preferably 70 mol %, still more preferably 50 mol %, and particularly preferably 30 mol %.

The lower limit of the proportion of the structural unit (I) in the polymer (A2) with respect to the total structural units constituting the polymer (A2) is preferably 10 mol %, more preferably 30 mol %, still more preferably 50 mol %, and particularly preferably 60 mol %. The upper limit of the proportion of the structural unit (I) is preferably 95 mol %, more preferably 90 mol %, still more preferably 85 mol %, and particularly preferably 80 mol %.

The lower limit of the proportion of the structural unit (I) in the polymer (A3) with respect to the total structural units constituting the polymer (A3) is preferably 10 mol %, more preferably 20 mol %, still more preferably 30 mol %, and particularly preferably 35 mol %. The upper limit of the proportion of the structural unit (I) is preferably 90 mol %, more preferably 80 mol %, still more preferably 70 mol %, and particularly preferably 60 mol %.

When the proportion of the structural unit (I) in the polymer (A) falls within the above range, the lithography performances of the resin composition can be improved.

The monomer that gives the structural unit (I) is exemplified by a compound represented by the following formula (i) (hereinafter, may be also referred to as "compound (i)"), and the like.

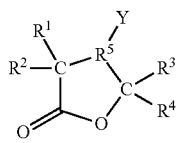

(i)

In the above formula (i), $R^1$ to $R^4$ each independently represent a hydrogen atom, a fluorine atom or a monovalent organic group having 1 to 20 carbon atoms, wherein at least one of $R^1$ to $R^4$ represents a fluorine atom or a group including a fluorine atom; $R^5$ represents a substituted or unsubstituted trivalent chain hydrocarbon group having 1 to 7 carbon atoms; and Y represents a monovalent group having a polymerizable carbon-carbon double bond.

Examples of the monovalent group having a polymerizable carbon-carbon double bond represented by Y include a vinyl group, an allyl group, a (meth)acryloyloxy group, a (meth)acryloyloxyalkyl group, a (meth)acryloyloxyalkylcarbonyloxy group, a (meth)acryloyloxydifluoromethylcarbonyloxy group, and the like.

In a case where the compound (i) is, for example, the following compound (i') which may be represented by the above formula (i), wherein $R^1$ and $R^2$ represent a fluorine atom, $R^5$ represents $(CR^cR^d)p-C(R^e)$, and p is an integer of 0 to 6, the compound (i) can be synthesized according to the following scheme conveniently in a favorable yield.

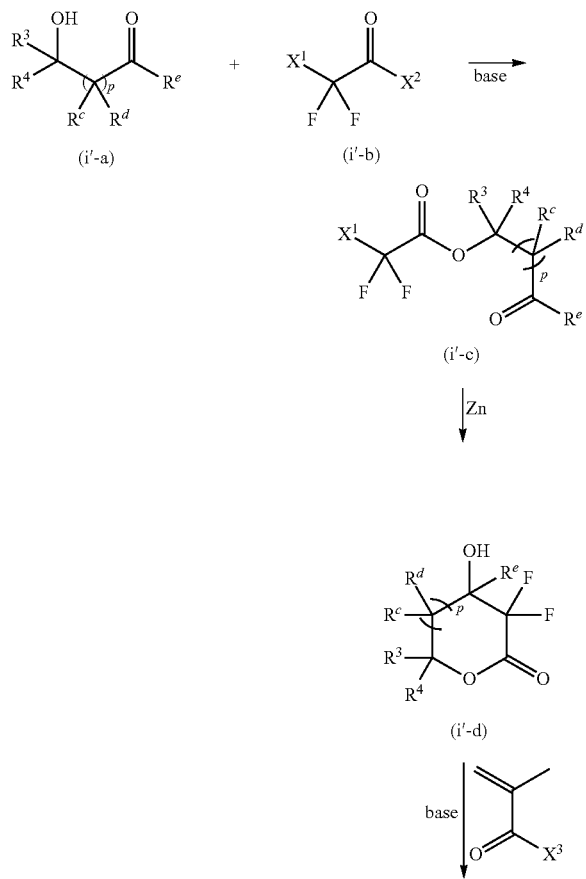

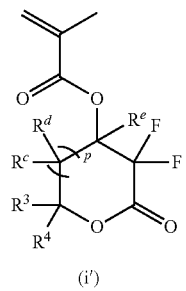

(i')

In the scheme, $R^3$ and $R^4$ each independently represent a hydrogen atom, a fluorine atom or a monovalent organic group having 1 to 20 carbon atoms; $R^c$, $R^d$ and $R^e$ each independently represent a hydrogen atom, a fluorine atom or a monovalent organic group having 1 to 20 carbon atoms; p is an integer of 0 to 6, wherein in a case where p is no less than 2, a plurality of $R^c$S may be identical or different with each other, and a plurality of $R^d$s may be identical or different with each other; $X^1$ and $X^2$ each independently represent a halogen atom; and $X^3$ represents a halogen atom, a hydroxy group or OCOR", wherein R" represents a monovalent hydrocarbon group having 1 to 20 carbon atoms.

$X^1$ represents preferably a chlorine atom or a bromine atom, and more preferably a bromine atom.

$X^2$ represents preferably a chlorine atom or a bromine atom, and more preferably a chlorine atom.

$X^3$ represents preferably a halogen atom, and more preferably a chlorine atom.

A compound represented by the above formula (i'-c) can be obtained by reacting a compound represented by the above formula (i'-a) with a compound represented by the above formula (i'-b) in a solvent such as acetonitrile in the presence of a base such as triethylamine or 1,4-diazabicyclo[2.2.2]octane (DABCO). Next, a compound represented by the above formula (i'-d) can be obtained by subjecting the compound (i'-c) to a reaction in a solvent such as tetrahydrofuran in the presence of an activator e.g., zinc and trimethylsilyl chloride, and the like. Further, the compound (i'-d) is reacted with (meth)acryloyl chloride or the like in a solvent such as acetonitrile in the presence of a base such as triethylamine or DABCO to form the compound (i'). The product can be isolated after purification by washing with a solvent, column chromatography, recrystallization, distillation, and/or the like.

Structural Unit (II)

The structural unit (II) includes an acid-labile group. The "acid-labile group" as referred to means a group that substitutes for the hydrogen atom of a carboxy group or a phenolic hydroxyl group and is dissociated by an action of an acid. When the polymer (A) has the structural unit (II), the sensitivity of the resin composition (A) may be improved, and consequently lithography performances can be improved.

The structural unit (II) is exemplified by a structural unit represented by the following formula (3-1) (hereinafter, may be also referred to as "structural unit (II-1)"), a structural unit represented by the following formula (3-2) (hereinafter, may be also referred to as "structural unit (II-2)"), and the like.

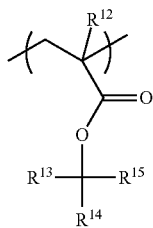

(3-1)

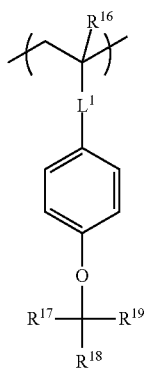

(3-2)

In the above formula (3-1), $R^{12}$ represents a hydrogen atom, a fluorine atom, a methyl group or a trifluoromethyl group; $R^{13}$ represents a monovalent chain hydrocarbon group having 1 to 10 carbon atoms or a monovalent alicyclic hydrocarbon group having 3 to 20 carbon atoms; and $R^{14}$ and $R^{15}$ each independently represent a monovalent chain hydrocarbon group having 1 to 10 carbon atoms or a monovalent alicyclic hydrocarbon group having 3 to 20 carbon atoms, or $R^{14}$ and $R^{15}$ taken together represent an alicyclic structure having 3 to 20 carbon atoms, together with the carbon atom to which $R^{14}$ and $R^{15}$ bond.

In the above formula (2-2), $R^{16}$ represents a hydrogen atom or a methyl group; $L^1$ represents a single bond, —COO— or —CONH—; and $R^{17}$, $R^{18}$ and $R^{19}$ each independently represent a monovalent hydrocarbon group having 1 to 20 carbon atoms or a monovalent oxyhydrocarbon group having 1 to 20 carbon atoms.

In light of the copolymerizability of a monomer that gives the structural unit (II), $R^{12}$ represents preferably a hydrogen atom or a methyl group, and more preferably a methyl group.

Examples of the monovalent chain hydrocarbon group having 1 to 10 carbon atoms which may be represented by $R^{13}$, $R^{14}$ or $R^{15}$ include:

alkyl groups such as a methyl group, an ethyl group, a n-propyl group and an i-propyl group;

alkenyl groups such as an ethenyl group, a propenyl group and a butenyl group;

alkynyl groups such as an ethynyl group, a propynyl group and a butynyl group; and the like.

Examples of the monovalent alicyclic hydrocarbon group having 3 to 20 carbon atoms represented by $R^{13}$, $R^{14}$ or $R^{15}$ include:

monocyclic cycloalkyl groups such as a cyclopentyl group and a cyclohexyl group;

monocyclic cycloalkenyl groups such as a cyclopentenyl group and a cyclohexenyl group;

polycyclic cycloalkyl groups such as a norbornyl group, an adamantyl group and a tricyclodecyl group;

polycyclic cycloalkenyl groups such as a norbornenyl group and a tricyclodecenyl group; and the like.

Examples of the alicyclic structure having 3 to 20 carbon atoms which may be taken together represented by $R^{14}$ and $R^{15}$, together with the carbon atom to which $R^{14}$ and $R^{15}$ bond include:

monocyclic cycloalkane structures such as a cyclopropane structure, a cyclobutane structure, a cyclopentane structure, a cyclohexane structure, a cycloheptane structure and a cyclooctane structure;

polycyclic cycloalkane structures such as a norbornane structure, an adamantane structure, a tricyclodecane structure and a tetracyclododecane structure; and the like.

As the structural unit (II-1), structural units represented by the following formulae (3-1-1) to (3-1-5) (hereinafter, may be also referred to as "structural units (II-1-1) to (II-1-5)") are preferred.

As the structural unit (II-2), a structural unit represented by the following formula (3-2-1) (hereinafter, may be also referred to as "structural unit (II-2-1)") is preferred.

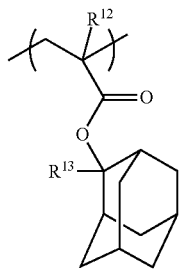

(3-1-1)

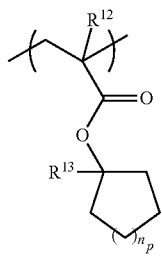

(3-1-2)

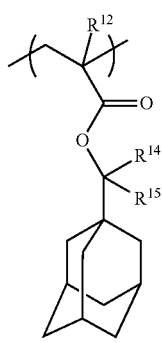

(3-1-3)

-continued

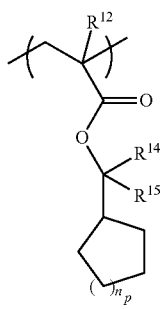
(3-1-4)

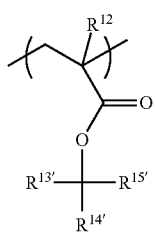
(3-1-5)

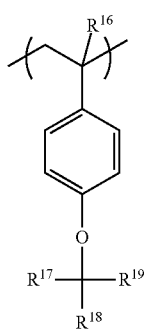
(3-2-1)

In the above formulae (3-1-1) to (3-1-5), $R^{12}$ to $R^{15}$ are as defined in the above formula (3-1); $R^{13\prime}$, $R^{14\prime}$ and $R^{15\prime}$ each independently represent a monovalent chain hydrocarbon group having 1 to 10 carbon atoms; and np is each independently an integer of 1 to 4.

In the above formula (3-2-1), $R^{16}$ to $R^{19}$ are as defined in the above formula (3-2).

Examples of the structural units (II-1-1) to (II-1-5) include structural units represented by the following formulae, and the like.

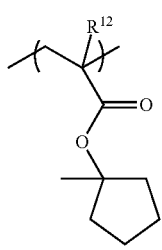 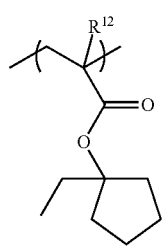 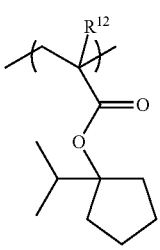

-continued

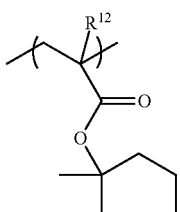

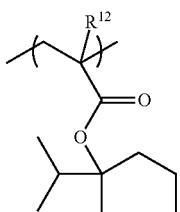

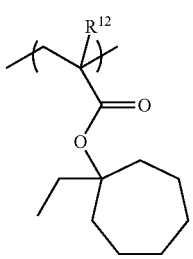

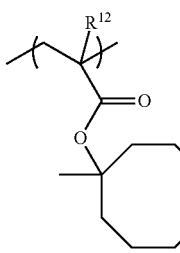

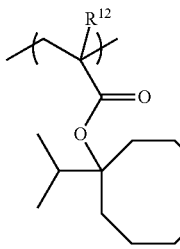

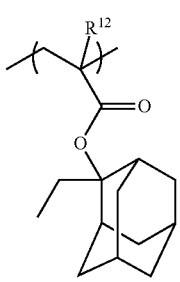

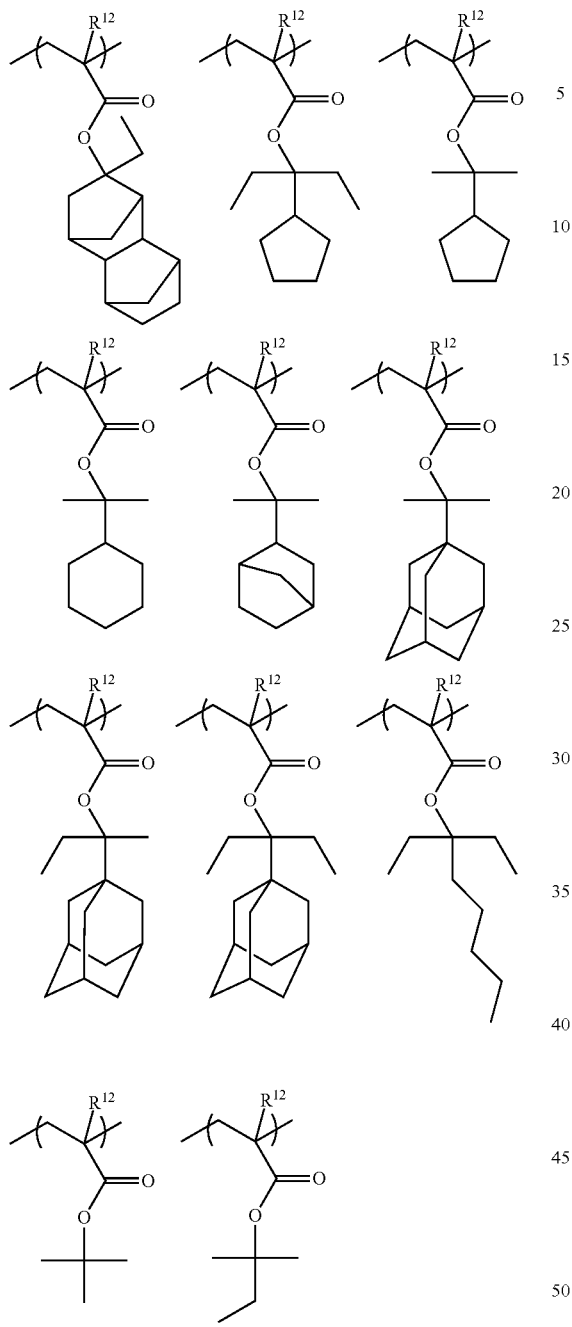
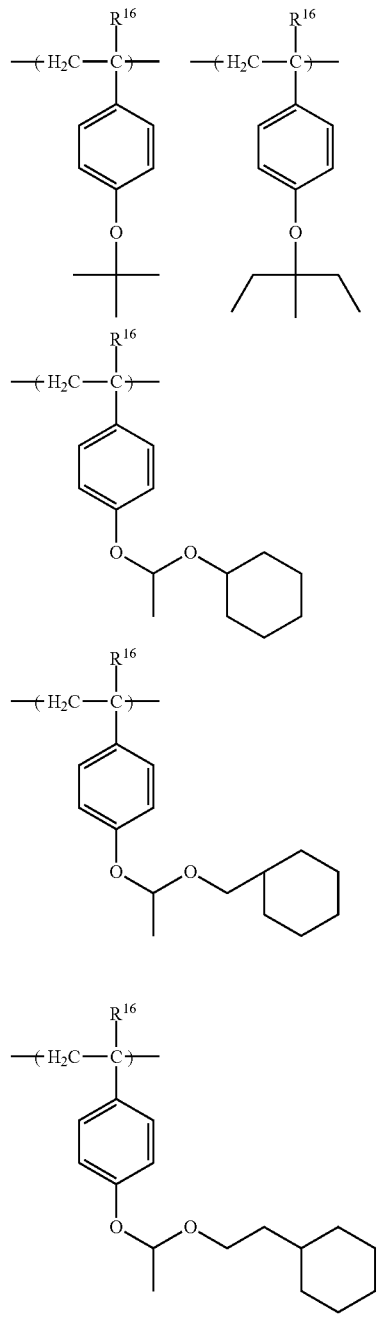

In the above formulae, $R^{12}$ is as defined in the above formula (3-1).

Of these, a structural unit derived from 2-alkyl-2-adamantyl (meth)acrylate, a structural unit derived from 1-alkyl-1-cyclopentyl (meth)acrylate, a structural unit derived from 2-(1-adamantyl)-2-propyl (meth)acrylate, a structural unit derived from 2-alkyl-2-tetracyclododecan-yl (meth)acrylate, a structural unit derived from 2-(1-cyclohexyl)-2-propyl (meth)acrylate, a structural unit derived from t-decan-yl (meth)acrylate, and a structural unit derived from 1-alkyl-1-cyclooctyl (meth)acrylate are preferred.

Examples of the structural unit (II-2) include structural units represented by the following formulae, and the like.

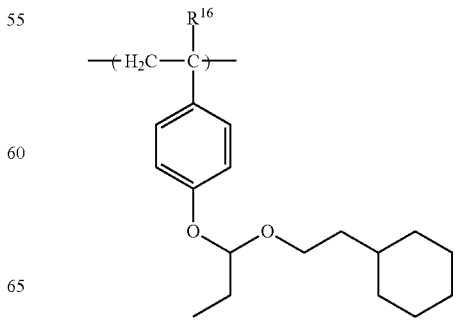

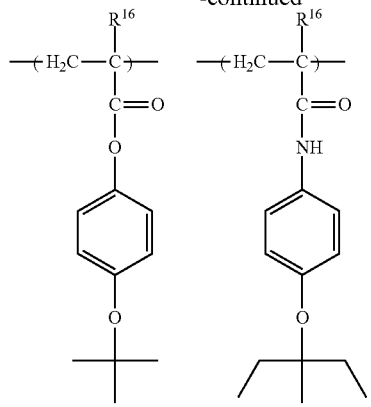

In the above formulae, $R^{16}$ is as defined in the above formula (3-2).

As the structural unit (II-2), a structural unit derived from p-t-butoxystyrene is preferred.

The proportion of the structural unit (II) in the polymer (A1) with respect to the total structural units constituting the polymer (A1) is preferably 10 mol % to 80 mol %, more preferably 20 mol % to 70 mol %, still more preferably 25 mol % to 60 mol %, and particularly preferably 30 mol % to 55 mol %.

The proportion of the structural unit (II) in the polymer (A2) with respect to the total structural units constituting the polymer (A2) is preferably 10 mol % to 80 mol %, more preferably 15 mol % to 60 mol %, still more preferably 20 mol % to 50 mol %, and particularly preferably 25 mol % to 45 mol %.

When the proportion of the structural unit (II) in the polymer (A) falls within the above range, the sensitivity of the resin composition (A) can be more increased, and consequently the lithography performances can be more improved.

Structural Unit (III)

The structural unit (III) includes at least one selected from the group consisting of a lactone structure, a cyclic carbonate structure and a sultone structure (except for the structural unit (I)). When the polymer (A) further has the structural unit (III), the solubility of the polymer (A) in a developer solution can be appropriately adjusted, and consequently the lithography performances of the resin composition can be more improved. Moreover, the adhesiveness between a substrate and the resist pattern formed from the resin composition can be improved.

Examples of the structural unit (III) include structural units represented by the following formulae, and the like.

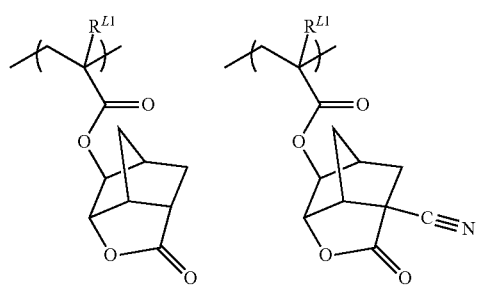

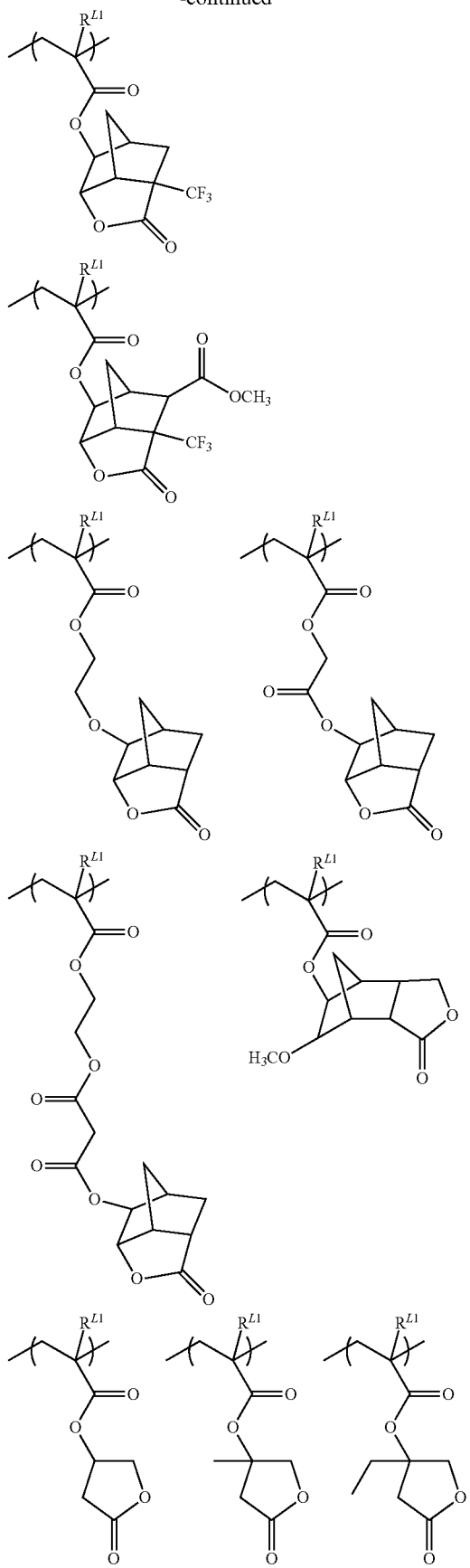

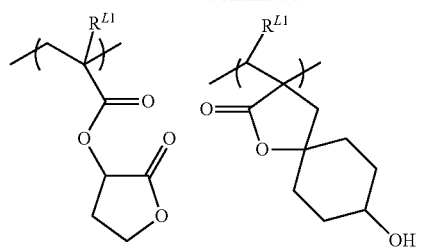
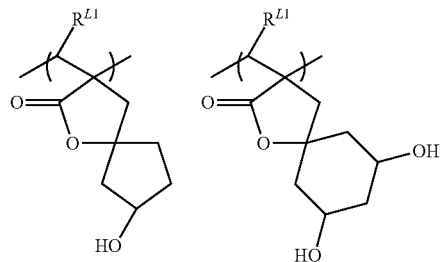
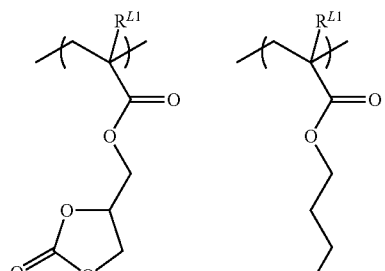
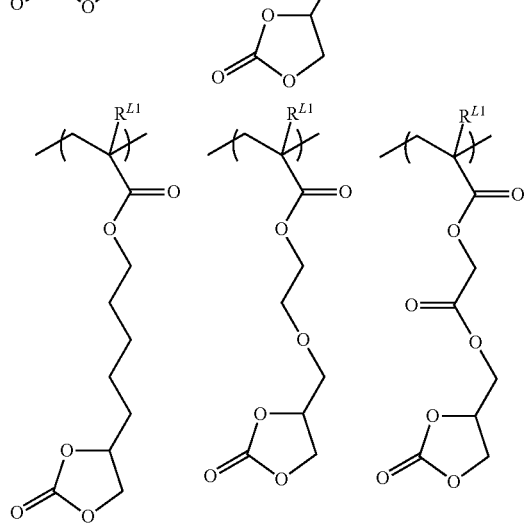
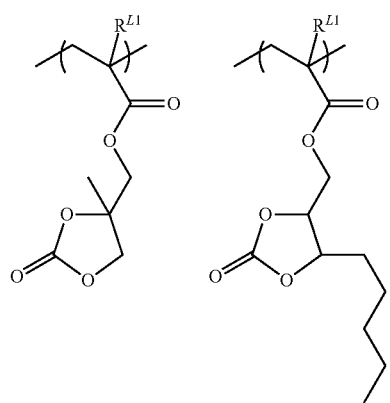
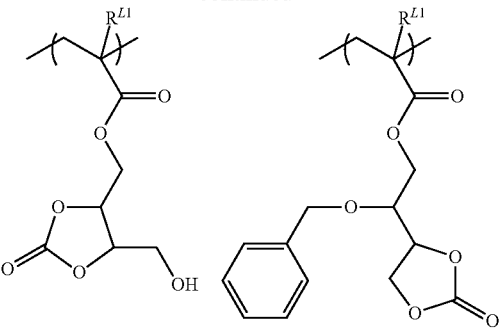
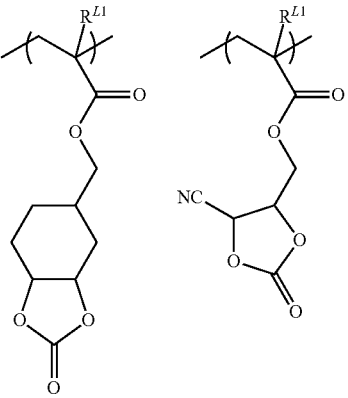
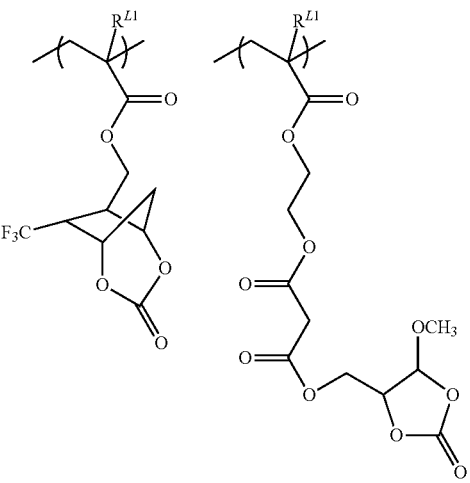
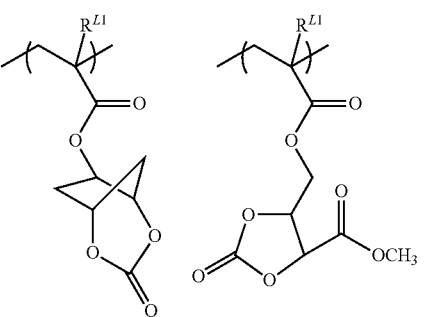

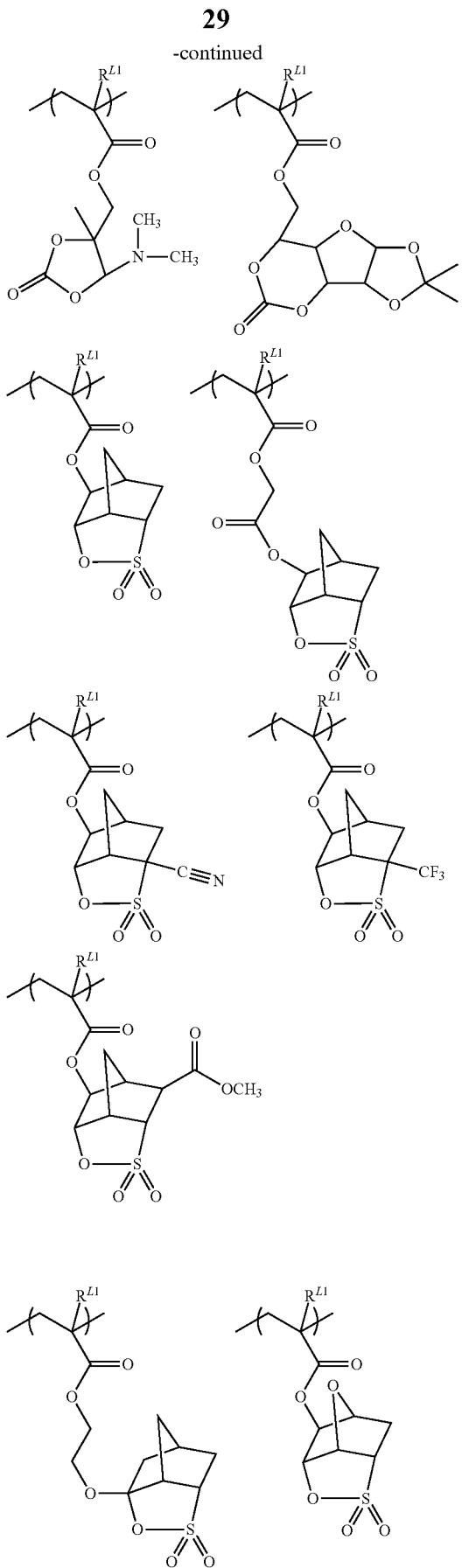
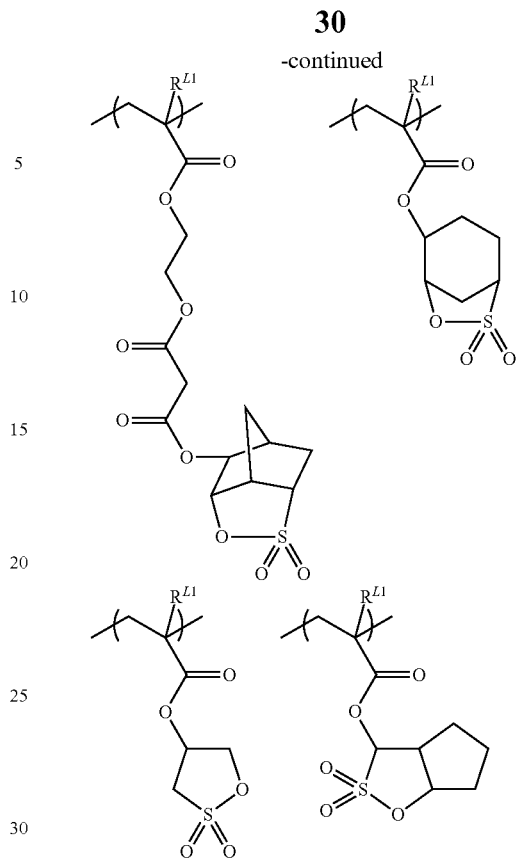

In the above formulae, $R^{L1}$ represents a hydrogen atom, a fluorine atom, a methyl group or a trifluoromethyl group.

Of these, as the structural unit (III), a structural unit having a lactone structure is preferred, a structural unit having a norbornanelactone structure, a structural unit having an oxynorbornanelactone structure and a structural unit having a γ-butyrolactone structure are more preferred, and a structural unit derived from norbornanelactone-yl (meth)acrylate, a structural unit derived from cyano-substituted norbornanelactone-yl (meth)acrylate, a structural unit derived from oxynorbornanelactone-yl (meth)acrylate and a structural unit derived from γ-butyrolactone-3-yl (meth)acrylate are still more preferred.

The proportion of the structural unit (III) in the polymer (A1) with respect to the total structural units constituting the polymer (A1) is preferably 0 mol % to 80 mol %, more preferably 5 mol % to 70 mol %, still more preferably 20 mol % to 60 mol %, and particularly preferably 25 mol % to 50 mol %.

When the proportion of the structural unit (III) in the polymer (A) falls within the above range, the solubility of the polymer (A) in a developer solution can be adjusted more appropriately, and consequently the lithography performances of the resin composition can be more improved. Moreover, the adhesiveness between a substrate and the resist pattern formed from the resin composition can be more improved.

Structural Unit (IV)

The structural unit (IV) includes a polar group. When the polymer (A) further has the structural unit (IV), the solubility of the polymer (A) in a developer solution can be adjusted more appropriately, and consequently the lithography performances of the resin composition can be improved. Moreover, the adhesiveness between the substrate and the resist pattern formed from the resin composition can be improved.

Examples of the polar group include a hydroxy group, a keto group (=O), a carboxy group, a nitro group, a cyano group, a sulfonamide group, and the like. Of these, the hydroxy group and the keto group are preferred.

Examples of the structural unit that includes a polar group include structural units represented by the following formulae, and the like.

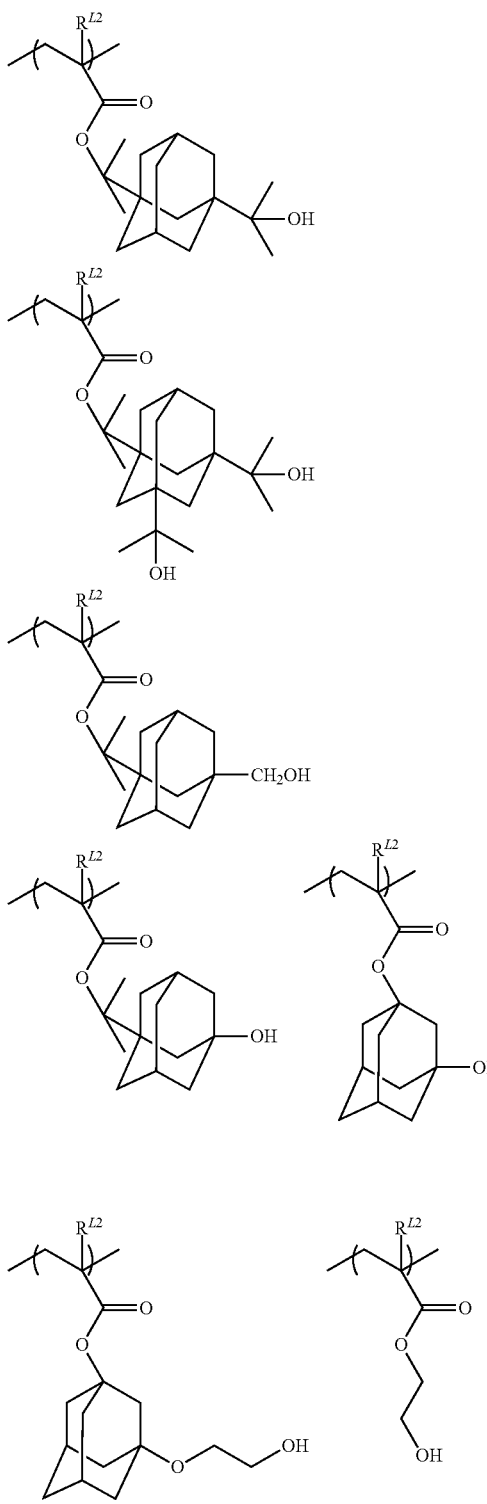

-continued

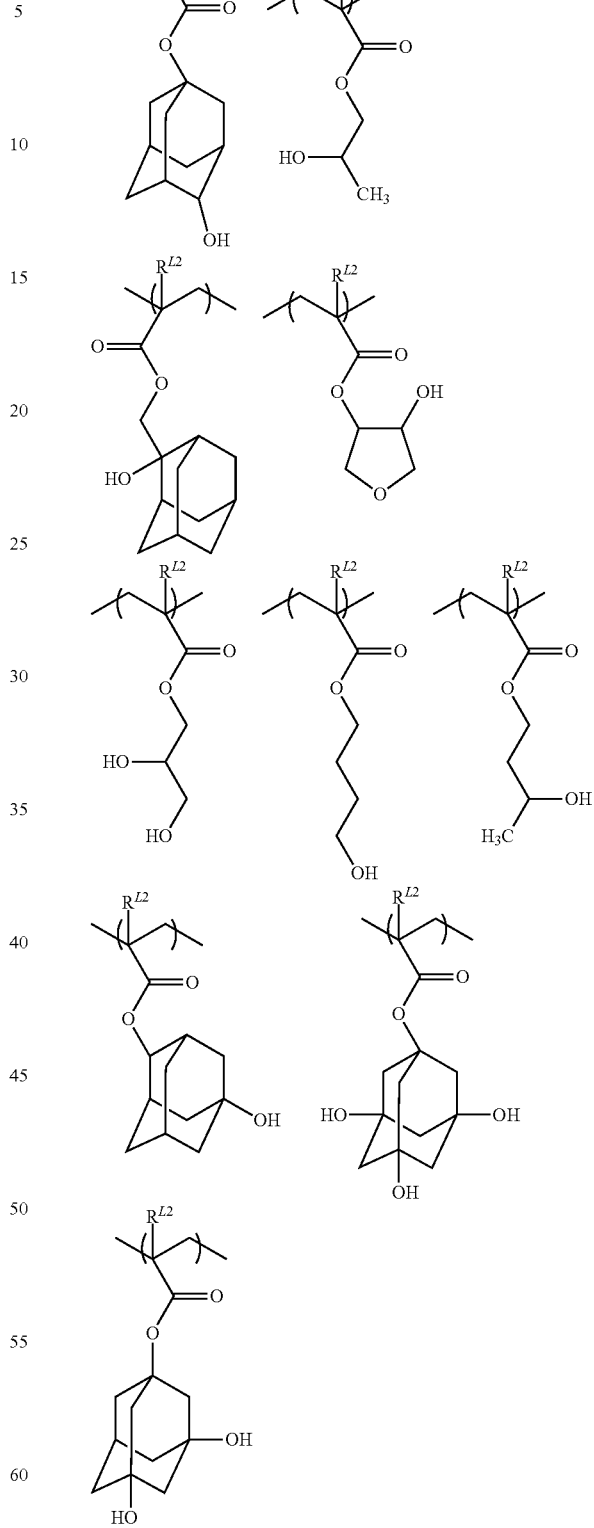

In the above formulae, $R^{L2}$ represents a hydrogen atom, a fluorine atom, a methyl group or a trifluoromethyl group.

The proportion of the structural unit (IV) in the polymer (A1) with respect to the total structural units constituting the polymer (A1) is preferably 0 mol % to 50 mol %, more preferably 0 mol % to 30 mol %, still more preferably 5 mol % to 25 mol %, and particularly preferably 10 mol % to 20 mol %.

When the proportion of the structural unit (IV) in the polymer (A) falls within the above range, the solubility of the polymer (A) in a developer solution can be adjusted more appropriately, and consequently the lithography performances of the resin composition can be more improved. Moreover, the adhesiveness between the substrate and the resist pattern formed from the resin composition can be more improved.

Structural Unit (V)

The structural unit (V) is a structural unit other than the structural unit (I) and has a fluorine atom. When the polymer (A) further has the structural unit (V) in addition to the structural unit (I), the percentage content of fluorine atoms of the polymer (A) can be adjusted, and consequently a dynamic contact angle on the surface of the resist film formed from the resin composition can be increased.

Examples of the structural unit (V) include the following structural unit (V-1), the following structural unit (V-2), and the like.

Structural Unit (V-1)

The structural unit (V-1) is represented by the following formula (4a).

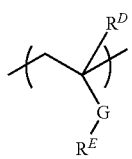

(4a)

In the above formula (4a), $R^D$ represents a hydrogen atom, a methyl group or a trifluoromethyl group; G represents a single bond, an oxygen atom, a sulfur atom, —CO—O—, —SO$_2$—O—NH—, —CO—NH— or —O—CO—NH—; $R^E$ represents a monovalent chain hydrocarbon group having 1 to 6 carbon atoms and having at least one fluorine atom or a monovalent aliphatic cyclic hydrocarbon group having 4 to 20 carbon atoms and having at least one fluorine atom.

Examples of the chain hydrocarbon group having 1 to 6 carbon atoms and having at least one fluorine atom which may be represented by $R^E$ include a trifluoromethyl group, a 2,2,2-trifluoroethyl group, a perfluoroethyl group, a 2,2,3,3,3-pentafluoropropyl group, a 1,1,1,3,3,3-hexafluoropropyl group, a perfluoro-n-propyl group, a perfluoro-i-propyl group, a perfluoro-n-butyl group, a perfluoro-i-butyl group, a perfluoro-t-butyl group, a 2,2,3,3,4,4,5,5-octafluoropentyl group, a perfluorohexyl group, and the like.

Examples of the aliphatic cyclic hydrocarbon group having 4 to 20 carbon atoms and having at least one fluorine atom which may be represented by $R^E$ include a monofluorocyclopentyl group, a difluorocyclopentyl group, a perfluorocyclopentyl group, a monofluorocyclohexyl group, a difluorocyclopentyl group, a perfluorocyclohexylmethyl group, a fluoronorbornyl group, a fluoroadamantyl group, a fluorobornyl group, a fluoroisobornyl group, a fluorotricyclodecyl group, a fluorotetracyclodecyl group, and the like.

Examples of the monomer that gives the structural unit (V-1) include (meth)acrylic acid trifluoromethyl ester, (meth)acrylic acid 2,2,2-trifluoroethyl ester, (meth)acrylic acid 2,2,2-trifluoroethyloxycarbonylmethyl ester, (meth)acrylic acid perfluoroethyl ester, (meth)acrylic acid perfluoro-n-propyl ester, (meth)acrylic acid perfluoro-i-propyl ester, (meth)acrylic acid perfluoro-n-butyl ester, (meth)acrylic acid perfluoro-i-butyl ester, (meth)acrylic acid perfluoro-t-butyl ester, (meth)acrylic acid 2-(1,1,1,3,3,3-hexafluoropropyl) ester, (meth)acrylic acid 1-(2,2,3,3,4,4,5,5-octafluoropentyl) ester, (meth)acrylic acid perfluorocyclohexylmethyl ester, (meth)acrylic acid 1-(2,2,3,3,3-pentafluoropropyl) ester, (meth)acrylic acid monofluorocyclopentyl ester, (meth)acrylic acid difluorocyclopentyl ester, (meth)acrylic acid perfluorocyclopentyl ester, (meth)acrylic acid monofluorocyclohexyl ester, (meth)acrylic acid difluorocyclopentyl ester, (meth)acrylic acid perfluorocyclohexylmethyl ester, (meth)acrylic acid fluoronorbornyl ester, (meth)acrylic acid fluoroadamantyl ester, (meth)acrylic acid fluorobornyl ester, (meth)acrylic acid fluoroisobornyl ester, (meth)acrylic acid fluorotricyclodecyl ester, (meth)acrylic acid fluorotetracyclodecyl ester, and the like.

Of these, (meth)acrylic acid 2,2,2-trifluoroethyloxycarbonylmethyl ester is preferred.

The proportion of the structural unit (V-1) in the polymer (A2) with respect to the total structural units constituting the polymer (A2) is preferably 0 mol % to 80 mol %, more preferably 0 mol % to 50 mol %, still more preferably 5 mol % to 30 mol %, and particularly preferably 8 mol % to 20 mol %.

When the proportion of the structural unit (V-1) falls within the above range, the polymer (A) can attain a greater dynamic contact angle on the surface of a resist film in liquid immersion lithography.

Structural Unit (V-2)

The structural unit (V-2) is represented by the following formula (4b).

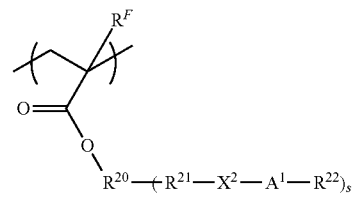

(4b)

In the above formula (4b), $R^F$ represents a hydrogen atom, a methyl group or a trifluoromethyl group; $R^{20}$ represents a hydrocarbon group having 1 to 20 carbon atoms and having a valency of (s+1) wherein the hydrocarbon group may have an oxygen atom, a sulfur atom, —NR'—, a carbonyl group, —CO—O— or bound to the end on the $R^{21}$ side of $R^{20}$, wherein R' represents a hydrogen atom or a monovalent organic group; $R^{21}$ represents a single bond, a divalent chain hydrocarbon group having 1 to 10 carbon atoms or a divalent aliphatic cyclic hydrocarbon group having 4 to 20 carbon atoms; $X^2$ represents a divalent chain hydrocarbon group having 1 to 20 carbon atoms and having at least one fluorine atom; $A^1$ represents an oxygen atom, —NR"—, —CO—O—* or —SO$_2$—O—*, wherein R" represents a hydrogen atom or a monovalent organic group, and * denotes a binding site to $R^{22}$; $R^{22}$ represents a hydrogen atom or a monovalent organic group; and s is an integer of 1 to 3, wherein s is 2 or 3, a plurality of $R^{21}$s may be identical or different with each other, a plurality of $X^2$s may be identical or different with each other, a plurality of $A^1$s may be identical or different with each other, and a plurality of $R^{22}$s may be identical or different with each other.

$R^{22}$ preferably represents a hydrogen atom since the solubility of the polymer (A) in an alkaline developer solution can be improved.

Examples of the monovalent organic group which may be represented by $R^{22}$ include hydrocarbon groups having 1 to 30 carbon atoms which may have an acid-labile group, an alkali-labile group or a substituent, and the like.

Examples of the structural unit (V-2) include structural units represented by the following formulae (4b-1) to (4b-3), and the like.

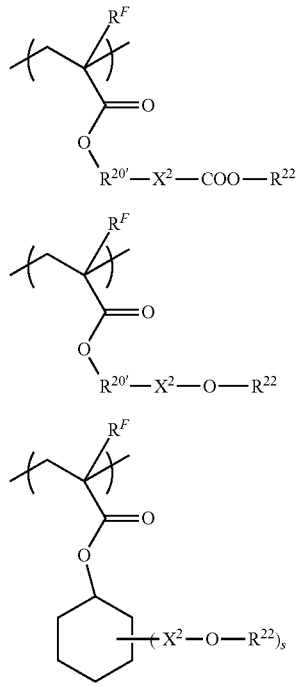

In the above formulae (4b-1) to (4b-3), $R^{20'}$ represents a divalent linear, branched or cyclic, saturated or unsaturated hydrocarbon group having 1 to 20 carbon atoms; and $R^F$, $X^2$, $R^{22}$ and s are as defined in the above formula (4b), wherein in a case where s is 2 or 3, a plurality of $X^2$s may be identical or different with each other, and a plurality of $R^{22}$s may be identical or different with each other.

The proportion of the structural unit (V-2) in the polymer (A2) with respect to the total structural units constituting the polymer (A2) is preferably 0 mol % to 80 mol %, more preferably 0 mol % to 60 mol %, and still more preferably 5 mol % to 40 mol %.

When the proportion of the structural unit (V-2) in the polymer (A) falls within the above range, the surface of the resist film formed from the resin composition can lead to a more improved extent of decrease of a dynamic contact angle in development with an alkali.

Structural Unit (VI)

The structural unit (VI) includes a group (z) having a hydroxy group at the end thereof and at least one fluorine atom or a fluorinated alkyl group on a carbon atom adjacent to the hydroxy group (except for the structural unit (I) and the structural unit (V)). When the polymer (A) has the structural unit (VI), the solubility of the polymer (A) in a developer solution can be adjusted more appropriately, and consequently the lithography performances of the resin composition can be more improved. Moreover, in the case of an exposure to EUV, the sensitivity of the resin composition can be increased.

The group (z) is exemplified by a group represented by the following formula (z-1), and the like.

In the above formula (z-1), $R^{f1}$ and $R^{f2}$ each independently represent an alkyl group having 1 to 10 carbon atoms or a fluorinated alkyl group having 1 to 10 carbon atoms, wherein at least any one of $R^{f1}$ and $R^{f2}$ represent a fluorinated alkyl group.

Examples of the fluorinated alkyl group having 1 to 10 carbon atoms which may be represented by $R^{f1}$ or $R^{f2}$ include a fluoromethyl group, a difluoromethyl group, a trifluoromethyl group, a fluoroethyl group, a difluoroethyl group, a trifluoroethyl group, a pentafluoroethyl group, a hexafluoropropyl group, a heptafluoropropyl group, a nonafluorobutyl group, and the like.

Of these, the trifluoromethyl group and the pentafluoroethyl group are preferred, and the trifluoromethyl group is more preferred.

As the group (z), a hydroxy-di(trifluoromethyl)methyl group, a hydroxy-di(pentafluoroethyl)methyl group and a hydroxy-methyl-trifluoromethylmethyl group are preferred, and a hydroxy-di(trifluoromethyl)methyl group is more preferred.

Examples of the structural unit (VI) include structural units represented by the following formulae (5-1) to (5-9) (hereinafter, may be also referred to as "structural units (VI-1) to (VI-9)"), and the like.

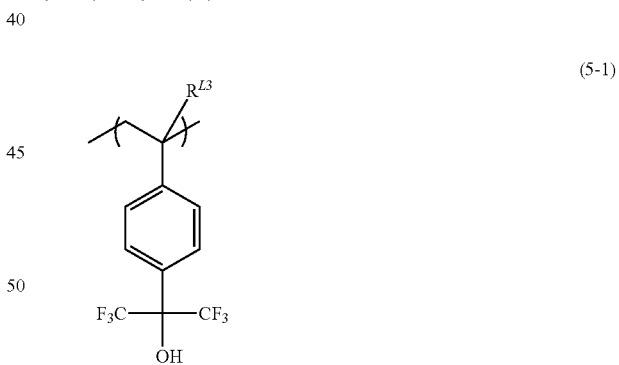

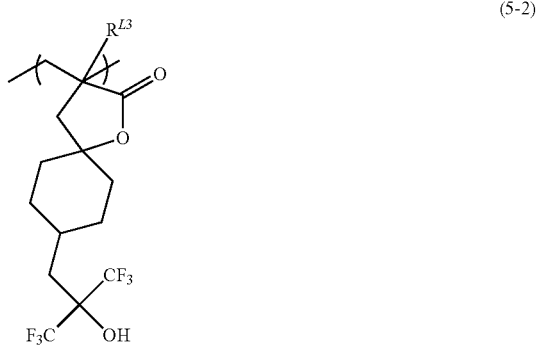

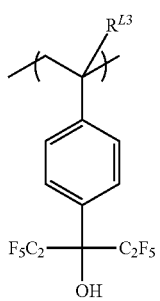
(5-3)

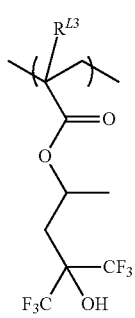
(5-4)

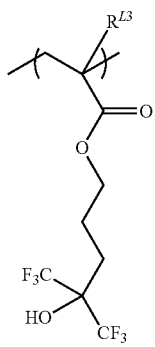
(5-5)

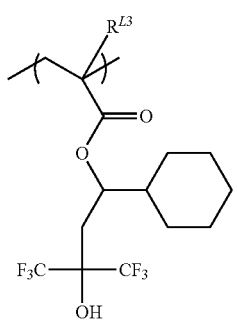
(5-6)

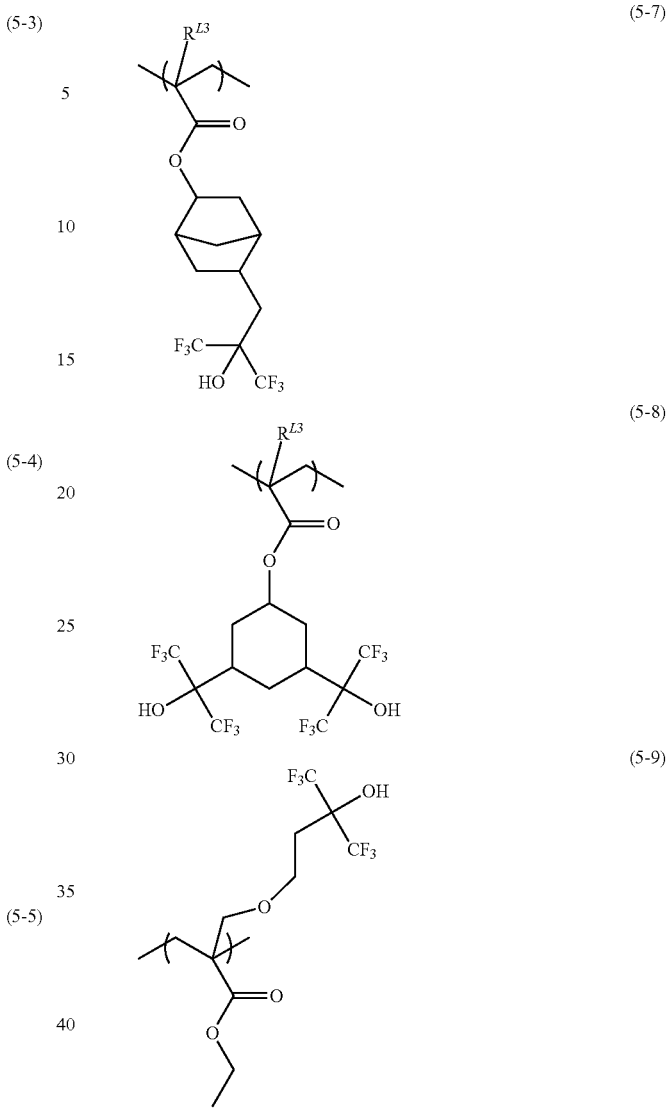

In the above formulae (5-1) to (5-9), $R^{L3}$s each independently represent a hydrogen atom or a methyl group.

Of these, the structural unit (VI-6) and the structural unit (VI-9) are preferred.

The proportion of the structural unit (VI) in the polymer (A3) with respect to the total structural units constituting the polymer (A3) is preferably 0 mol % to 80 mol %, more preferably 20 mol % to 70 mol %, and still more preferably 30 mol % to 60 mol %.

When the proportion of the structural unit (VI) in the polymer (A) falls within the above range, the solubility of the polymer (A) in a developer solution can be adjusted further appropriately, and consequently the lithography performances of the resin composition can be further improved. Moreover, in the case of an exposure to EUV, the sensitivity of the resin composition can be more increased.

Structural Unit (VII)

The structural unit (VII) includes a sulfo group. When the polymer (A) has the structural unit (VII), the adhesiveness to a substrate can be enhanced, and thus the polymer (A) can be suitably used as, for example, a resin composition for forming a protective film for liquid immersion lithography.

The structural unit (VII) is exemplified by a structural unit represented by the following formula (6), and the like.

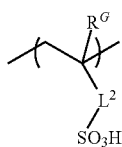

(6)

In the above formula (6), $R^G$ represents a hydrogen atom, a methyl group, a fluorine atom or a trifluoromethyl group; and $L^2$ represents a single bond, an oxygen atom, a sulfur atom, a divalent linear or branched hydrocarbon group having 1 to 6 carbon atoms, a divalent alicyclic hydrocarbon group having 4 to 12 carbon atoms, a divalent aromatic hydrocarbon group having 6 to 12 carbon atoms, or a —C(=O)—$X^4$—$R^g$— group, wherein $X^4$ represents an oxygen atom, a sulfur atom or an NH group, and $R^g$ represents a single bond, a divalent linear or branched hydrocarbon group having 1 to 6 carbon atoms, a divalent alicyclic hydrocarbon group having 4 to 12 carbon atoms or a divalent aromatic hydrocarbon group having 6 to 12 carbon atoms.

As the divalent linear or branched hydrocarbon group having 1 to 6 carbon atoms which may be represented by $L^2$ or $R^g$, saturated hydrocarbon groups are preferred, and examples thereof include a methylene group, an ethylene group, a 1,3-propylene group, a 1,2-propylene group, a 1,1-propylene group, a 2,2-propylene group, a tetramethylene group, a pentamethylene group, a hexamethylene group, a 1-methyl-1,3-propylene group, a 2-methyl-1,3-propylene group, a 2-methyl-1,2-propylene group, a 1-methyl-1,4-butylene group, a 2-methyl-1,4-butylene group, and the like.

The divalent alicyclic hydrocarbon group having 4 to 12 carbon atoms which may be represented by $L^2$ or $R^g$ may be monocyclic or polycyclic, and in the case of the divalent alicyclic hydrocarbon group being polycyclic, the divalent alicyclic hydrocarbon group may have a cross-linked structure. Examples of the monocyclic hydrocarbon group include: cyclobutylene groups such as a 1,3-cyclobutylene group; cyclopentylene groups such as a 1,3-cyclopentylene group; cyclohexylene groups such as a 1,4-cyclohexylene group; cyclooctylene groups such as 1,5-cyclooctylene group; and the like. The polycyclic hydrocarbon group is exemplified by a hydrocarbon group having a 2 to 4-membered ring, and examples thereof include: norbornylene groups such as a 1,4-norbornylene group and a 2,5-norbornylene group; adamantylene groups such as a 1,5-adamantylene group and a 2,6-adamantylene group; and the like.

Examples of the divalent aromatic hydrocarbon group having 6 to 12 carbon atoms which may be represented by $L^2$ or $R^g$ include arylene groups such as a phenylene group and a tolylene group, and the like.

$L^2$ represents preferably a single bond, a divalent linear or branched hydrocarbon group having 1 to 6 carbon atoms, a divalent aromatic hydrocarbon having 6 to 12 carbon atoms, or —C(=O)—NH—$R^7$, wherein $R^g$ represents a divalent linear or branched hydrocarbon group having 1 to 6 carbon atoms, and more preferably a single bond, a methylene group, a phenylene group, or —C(=O)—NH—C(CH$_3$)$_2$—CH$_2$—.

Examples of the structural unit (VII) include structural units represented by the following formulae (6-1) to (6-4) (hereinafter, may be also referred to as "structural units (VII-1) to (VII-4)"), and the like.

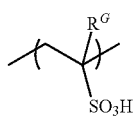

(6-1)

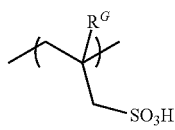

(6-2)

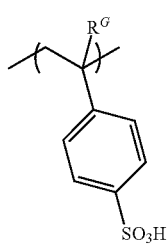

(6-3)

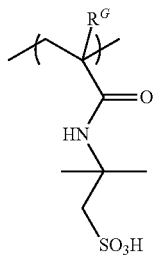

(6-4)

In the above formulae (6-1) to (6-4), $R^G$ is as defined in the above formula (6).

Of these, the structural unit (VII-1) is preferred.

The proportion of the structural unit (VII) in the polymer (A3) with respect to the total structural units constituting the polymer (A3) is preferably 0 mol % to 20 mol %, more preferably 0 mol % to 10 mol %, still more preferably 0.1 mol % to 5 mol %, and particularly preferably 0.5 mol % to 3 mol %.

When the proportion of the structural unit (VII) in the polymer (A) falls within the above range, the adhesiveness between the film formed from the resin composition and the substrate can be further improved.

Other Structural Unit

The polymer (A) may have other structural unit than the structural units (I) to (VII). Examples of the other structural unit include a structural unit that includes a nonlabile alicyclic hydrocarbon group, and the like. The proportion of the other structural unit with respect to the total structural units constituting the polymer (A) is preferably no greater than 20 mol %, and more preferably no greater than 10 mol %.

The resin composition may contain either one, or two or more types of the polymer (A).

Synthesis Method of Polymer (A)

The polymer (A) can be synthesized by, for example, polymerizing monomers that give each structural unit in an appropriate solvent using a radical polymerization initiator or the like.

Examples of the radical polymerization initiator include: azo radical initiators such as azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile) and dimethyl 2,2'-azobisisobutyrate; peroxide radical initiators such as benzoyl peroxide, t-butyl hydroperoxide and cumene hydroperoxide; and the like. Of these, AIBN and dimethyl 2,2'-azobisisobutyrate are preferred, and AIBN is more preferred. These radical initiators may be used either alone of one type, or as a mixture of two or more types thereof.

Examples of the solvent used in the polymerization include:

alkanes such as n-pentane, n-hexane, n-heptane, n-octane, n-nonane and n-decane;

cycloalkanes such as cyclohexane, cycloheptane, cyclooctane, decalin and norbornane;

aromatic hydrocarbons such as benzene, toluene, xylene, ethylbenzene and cumene;

halogenated hydrocarbons such as chlorobutanes, bromohexanes, dichloroethanes, hexamethylene dibromide and chlorobenzene;

saturated carboxylic acid esters such as ethyl acetate, n-butyl acetate, i-butyl acetate and methyl propionate;

ketones such as acetone, methyl ethyl ketone, 4-methyl-2-pentanone and 2-heptanone;

ethers such as tetrahydrofuran, dimethoxyethanes and diethoxyethanes;

alcohols such as methanol, ethanol, 1-propanol, 2-propanol and 4-methyl-2-pentanol; and the like. These solvents used in the polymerization may be used either alone, or two or more types thereof may be used in combination.

The reaction temperature in the polymerization is typically 40° C. to 150° C., and preferably 50° C. to 120° C. The reaction time period is typically 1 hour to 48 hrs, and preferably 1 hour to 24 hrs.

The polystyrene equivalent weight average molecular weight (Mw) of the polymer (A) as determined by gel permeation chromatography (GPC) is not particularly limited, and preferably no less than 1,000 and no greater than 50,000, more preferably no less than 2,000 and no greater than 30,000, still more preferably no less than 3,000 and no greater than 20,000, and particularly preferably no less than 5,000 and no greater than 15,000. When the Mw of the polymer (A) falls within the above range, the application property and inhibitory ability of development defects of the resin composition may be improved. When the Mw of the polymer (A) is less than the lower limit, a resist film exhibiting sufficient heat resistance may not be obtained. When the Mw of the polymer (A) is greater than the upper limit, developability of the resist film may be deteriorated.

The ratio (Mw/Mn) of the Mw to the polystyrene equivalent number average molecular weight (Mn) as determined by GPC of the polymer (A) is typically no less than 1 and no greater than 5, preferably no less than 1 and no greater than 3, and still more preferably no less than 1 and no greater than 2.

As used herein, the Mw and the Mn of the polymer are determined using gel permeation chromatography (GPC) under the following conditions.

GPC columns: "G2000 HXL"×2, "G3000 HXL"×1, and "G4000 HXL"×1 available from Tosoh Corporation;
column temperature: 40° C.;
elution solvent: tetrahydrofuran (available from Wako Pure Chemical Industries, Ltd.);
flow rate: 1.0 mL/min;
sample concentration: 1.0% by mass;
amount of injected sample: 100 μL;
detector: differential refractometer; and
standard substance: mono-dispersed polystyrene.

(B) Solvent

The resin composition according to the embodiment of the present invention contains the solvent (B). The solvent (B) is not particularly limited as long as the solvent (B) can dissolve or disperse at least the polymer (A), as well as the acid generator (C) and the acid diffusion controller (D), which are contained as needed, and the like.

The solvent (B) is exemplified by alcohol solvents, ether solvents, ketone solvents, amide solvents, ester solvents, hydrocarbon solvents, and the like.

Examples of the alcohol solvents include:

aliphatic monohydric alcohol solvents having 1 to 18 carbon atoms such as 4-methyl-2-pentanol and n-hexanol;

alicyclic monohydric alcohol solvents having 3 to 18 carbon atoms such as cyclohexanol;

polyhydric alcohol solvents having 2 to 18 carbon atoms such as 1,2-propylene glycol;

polyhydric alcohol partial ether solvents having 3 to 19 carbon atoms such as propylene glycol monomethyl ether; and the like.

Examples of the ether solvents include:

dialkyl ether solvents such as diethyl ether, dipropyl ether, dibutyl ether, dipentyl ether, diisoamyl ether, dihexyl ether and diheptyl ether;

cyclic ether solvents such as tetrahydrofuran and tetrahydropyran;

aromatic ring-containing ether solvents such as diphenyl ether and anisole; and the like.

Examples of the ketone solvents include:

chain ketone solvents such as acetone, methyl ethyl ketone, methyl n-propyl ketone, methyl n-butyl ketone, diethyl ketone, methyl iso-butyl ketone, 2-heptanone, ethyl n-butyl ketone, methyl n-hexyl ketone, di-iso-butyl ketone and trimethylnonanone;

cyclic ketone solvents such as cyclopentanone, cyclohexanone, cycloheptanone, cyclooctanone and methylcyclohexanone;

2,4-pentanedione, acetonylacetone and acetophenone; and the like.

Examples of the amide solvents include:

cyclic amide solvents such as N,N'-dimethylimidazolidinone and N-methylpyrrolidone;

chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvents include:

monocarboxylic acid ester solvents such as n-butyl acetate and ethyl lactate;

polyhydric alcohol carboxylate solvents such as propylene glycol acetate;

polyhydric alcohol partial ether carboxylate solvents such as propylene glycol monomethyl ether acetate;

polyhydric carboxylic acid diester solvents such as diethyl oxalate;

carbonate solvents such as dimethyl carbonate and diethyl carbonate; and the like.

Examples of the hydrocarbon solvents include:

aliphatic hydrocarbon solvents having 5 to 12 carbon atoms such as n-pentane and n-hexane;

aromatic hydrocarbon solvents having 6 to 16 carbon atoms such as toluene and xylene; and the like.

Of these, as the solvent (B) contained in the resin composition (A), the ester solvents and the ketone solvents are preferred, the polyhydric alcohol partial ether carboxylate solvents and the cyclic ketone solvents are more preferred, polyhydric alcohol partial alkyl ether acetates and cycloalkanones are still more preferred, and propylene glycol monomethyl ether acetate and cyclohexanone are particularly preferred.

As the solvent (B) contained in the resin composition (B), the alcohol solvents and the ether solvents are preferred, the aliphatic monohydric alcohol solvents and the diallyl ether solvents are more preferred, and 4-methyl-2-pentanol and diisoamyl ether are still more preferred.

The resin composition may contain either one, or two or more types of the solvent (B).

(C) Acid Generator

The acid generator (C) is a substance that generates an acid upon an exposure. The acid thus generated allows the acid-labile group included in the polymer (A) and/or the like to be dissociated, thereby generating a carboxy group or the like. As a result, the solubility of the polymer (A) in a developer solution is altered, whereby a resist pattern can be formed from the resin composition (A). The acid generator (C) may be contained in the resin composition either in the form of a low molecular weight compound as described later (hereinafter, may be also referred to as "(C) acid generating agent" or "acid generating agent (C)", as appropriate), or in the form incorporated as a part of the polymer, or in both of these forms.

The acid generating agent (C) is exemplified by onium salt compounds, N-sulfonyloxyimide compounds, halogen-containing compounds, diazo ketone compounds, and the like.

Examples of the onium salt compounds include sulfonium salts, tetrahydrothiophenium salts, iodonium salts, phosphonium salts, diazonium salts, pyridinium salts, and the like.

Specific examples of the acid generating agent (C) include the compounds disclosed in paragraphs [0080] to [0113] of Japanese Unexamined Patent Application, Publication No. 2009-134088, for example, and the like.

The acid generating agent (C) is preferably a compound represented by the following formula (7). When the acid generating agent (C) has the following structure, it is expected that a diffusion length of the acid generated upon the exposure in a resist film will be more properly decreased through e.g., an interaction with the structural unit (I) of the polymer (A) or the like, and consequently the lithography performances of the resin composition can be improved.

$$R^{23}-R^{24}-SO_3^-X^+ \quad (7)$$

In the above formula (7), $R^{23}$ represents a monovalent group that includes an alicyclic structure having 6 or more ring atoms or a monovalent group that includes an aliphatic heterocyclic structure having 6 or more ring atoms; $R^{24}$ represents a fluorinated alkanediyl group having 1 to 10 carbon atoms; and $X^+$ represents a monovalent radioactive ray-labile onium cation.

In regard to $R^{23}$, the number of "ring atoms" as referred to means the number of atoms constituting a ring of the alicyclic structure or the aliphatic heterocyclic structure, and in the case of polycyclic alicyclic structures and polycyclic aliphatic heterocyclic structures, the "ring atoms" means the number of atoms constituting the polycycle.

Examples of the monovalent group that includes an alicyclic structure having 6 or more ring atoms which may be represented by $R^{23}$ include:

monocyclic cycloalkyl groups such as a cyclohexyl group, a cycloheptyl group, a cyclooctyl group, a cyclononyl group, a cyclodecyl group and a cyclododecyl group;

monocyclic cycloalkenyl groups such as a cyclohexenyl group, a cycloheptenyl group, a cyclooctenyl group and a cyclodecenyl group;

polycyclic cycloalkyl group such as a norbornyl group, an adamantyl group, a tricyclodecyl group and a tetracyclodecyl group;

polycyclic cycloalkenyl groups such as a norbornenyl group and a tricyclodecenyl group; and the like.

Examples of the monovalent group that includes an aliphatic heterocyclic structure having 6 or more ring atoms which may be represented by $R^{23}$ include:

groups that have a lactone structure, such as a norbornanelactone-yl group;

groups that have a sultone structure, such as a norbornanesultone-yl group;

oxygen atom-containing heterocyclic groups such as an oxacycloheptyl group and an oxanorbornyl group;

nitrogen atom-containing heterocyclic groups such as an azacycloheptyl group and a diazabicyclooctan-yl group;

sulfur atom-containing heterocyclic groups such as a thiacycloheptyl group and a thianorbornyl group; and the like.

In light of attaining a further proper diffusion length of the acid described above, the number of ring atoms included in the group represented by $R^{23}$ is preferably no less than 8, more preferably 9 to 15, and still more preferably 10 to 13.

Of these, $R^{23}$ represents preferably a monovalent group that includes an alicyclic structure having 9 or more ring atoms, or a monovalent group that includes an aliphatic heterocyclic structure having 9 or more ring atoms, more preferably an adamantyl group, a hydroxyadamantyl group, a norbornanelactone-yl group, or a 5-oxo-4-oxatricyclo [4.3.1.1$^{3,8}$]undecan-yl group, and still more preferably an adamantyl group.

Examples of the fluorinated alkanediyl group having 1 to 10 carbon atoms represented by $R^{24}$ include groups obtained by substituting with a fluorine atom, one or more hydrogen atoms included in an alkanediyl group having 1 to 10 carbon atoms such as a methanediyl group, an ethanediyl group or a propanediyl group, and the like.

Of these, a fluorinated alkanediyl group in which a fluorine atom bonds to a carbon atom adjacent to the $SO_3^-$ group is preferred, a fluorinated alkanediyl group in which two fluorine atoms bond to a carbon atom adjacent to the $SO_3^-$ group is more preferred, and a 1,1-difluoromethanediyl group, a 1,1-difluoroethanediyl group, a 1,1,3,3,3-pentafluoro-1,2-propanediyl group, a 1,1,2,2-tetrafluoroethanediyl group, a 1,1,2,2-tetrafluorobutanediyl group and a 1,1,2,2-tetrafluorohexanediyl group are still more preferred.

The monovalent radioactive ray-labile onium cation represented by $X^+$ is a cation that is degraded upon an irradiation with exposure light. At light-exposed regions, a sulfonic acid is generated from the sulfonate anion and a proton generated through degradation of the radioactive ray-labile onium cation. The monovalent radioactive ray-labile onium cation represented by $X^+$ is exemplified by radioactive ray-labile onium cations that contain an element such as S, I, O, N, P, Cl, Br, F, As, Se, Sn, Sb, Te and Bi. Examples of the cation that contains S (sulfur) as the element include a sulfonium cation, tetrahydrothiophenium cation and the like, and examples of the cation that contains I (iodine) as the element include an iodonium cation and the like. Of these, a sulfonium cation represented by the following formula (X-1), a tetrahydrothiophenium cation represented by the following formula (X-2) and an iodonium cation represented by the following formula (X-3) are preferred.

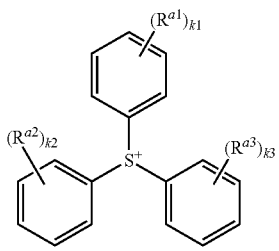

(X-1)

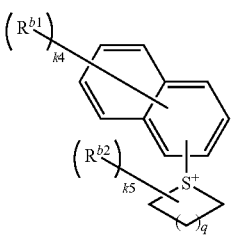

(X-2)

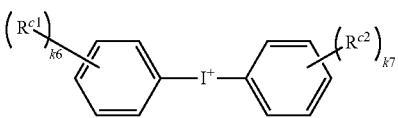

(X-3)

In the above formula (X-1), $R^{a1}$, $R^{a2}$ and $R^{a3}$ each independently represent a substituted or unsubstituted linear or branched alkyl group having 1 to 12 carbon atoms, a substituted or unsubstituted aromatic hydrocarbon group having 6 to 12 carbon atoms, $-OSO_2-R^P$ or $-SO_2-O$, or at least two of $R^{a1}$, $R^{a2}$ and $R^{a3}$ taken together represent a ring structure, and the rest of $R^{a1}$, $R^{a2}$ and $R^{a3}$ represents a substituted or unsubstituted linear or branched alkyl group having 1 to 12 carbon atoms, a substituted or unsubstituted aromatic hydrocarbon group having 6 to 12 carbon atoms, $-OSO_2-R^P$ or $-SO_2-R^Q$; $R^P$ and $R^Q$ each independently represent a substituted or unsubstituted linear or branched alkyl group having 1 to 12 carbon atoms, a substituted or unsubstituted alicyclic hydrocarbon group having 5 to 25 carbon atoms or a substituted or unsubstituted aromatic hydrocarbon group having 6 to 12 carbon atoms; and k1, k2 and k3 are each independently an integer of 0 to 5, wherein $R^{a1}$ to $R^{a3}$, $R^P$ and $R^Q$ are each present in a plurality of number, a plurality of $R^{a1}$s may be identical or different with each other, a plurality of $R^{a2}$s may be identical or different with each other, a plurality of $R^{a3}$s may be identical or different with each other, a plurality of $R^P$s may be identical or different with each other, and a plurality of $R^Q$s may be identical or different with each other.

In the above formula (X-2), $R^{b1}$ represents a substituted or unsubstituted linear or branched alkyl group having 1 to 8 carbon atoms, or a substituted or unsubstituted aromatic hydrocarbon group having 6 to 8 carbon atoms; k4 is an integer of 0 to 7, wherein in a case where $R^{b1}$ is present in a plurality of number, a plurality of $R^{b1}$s may be identical or different with each other, or the plurality of $R^{b1}$s may taken together represent a ring structure; $R^{b2}$ represents a substituted or unsubstituted linear or branched alkyl group having 1 to 7 carbon atoms, or a substituted or unsubstituted aromatic hydrocarbon group having 6 or 7 carbon atoms; k5 is an integer of 0 to 6, wherein in a case where $R^{b2}$ is present in a plurality of number, a plurality of $R^{b2}$s may be identical or different with each other, or the plurality of $R^{b2}$s may taken together represent a ring structure; and q is an integer of 0 to 3.

In the above formula (X-3), $R^{c1}$ and $R^{c2}$ each independently represent a substituted or unsubstituted linear or branched alkyl group having 1 to 12 carbon atoms, a substituted or unsubstituted aromatic hydrocarbon group having 6 to 12 carbon atoms, $-OSO_2-R^R$ or $-SO_2-R^S$, or at least two of these groups may taken together represent a ring structure; $R^R$ and $R^S$ each independently represent a substituted or unsubstituted linear or branched alkyl group having 1 to 12 carbon atoms, a substituted or unsubstituted alicyclic hydrocarbon group having 5 to 25 carbon atoms or a substituted or unsubstituted aromatic hydrocarbon group having 6 to 12 carbon atoms; k6 and k7 are each independently an integer of 0 to 5, wherein in a case where $R^{c1}$, $R^{c2}$, $R^R$ and $R^S$ are each a plurality of number, a plurality of $R^{c1}$s may be identical or different with each other, a plurality of $R^{c2}$s may be identical or different with each other, a plurality of $R^R$s may be identical or different with each other, and a plurality of $R^S$s may be identical or different with each other.

Examples of the unsubstituted linear alkyl group which may be represented by $R^{a1}$, $R^{a2}$, $R^{a3}$, $R^{b1}$, $R^{b2}$, $R^{c1}$ or $R^{c2}$ include a methyl group, an ethyl group, a n-propyl group, a n-butyl group, and the like.

Examples of the unsubstituted branched alkyl group which may be represented by $R^{a1}$, $R^{a2}$, $R^{a3}$, $R^{b1}$, $R^{b2}$, $R^{c1}$ or $R^{c2}$ include an i-propyl group, an i-butyl group, a sec-butyl group, a t-butyl group, and the like.

Examples of the unsubstituted aromatic hydrocarbon group which may be represented by $R^{a1}$, $R^{a2}$, $R^{a3}$, $R^{b1}$, $R^{b2}$, $R^{c1}$ or $R^{c2}$ include: aryl groups such as a phenyl group, a tolyl group, a xylyl group, a mesityl group and a naphthyl group; aralkyl groups such as a benzyl group and a phenethyl group; and the like.

Examples of the unsubstituted aromatic hydrocarbon group which may be represented by $R^{b1}$ or $R^{b2}$ include a phenyl group, a tolyl group, a benzyl group, and the like.

Examples of the substituent which may substitute for a hydrogen atom included in the alkyl group or aromatic hydrocarbon group include halogen atoms such as a fluorine atom, a chlorine atom, a bromine atom and an iodine atom, a hydroxy group, a carboxy group, a cyano group, a nitro group, an alkoxy group, an alkoxycarbonyl group, an alkoxycarbonyloxy group, an acyl group, an acyloxy group, and the like.

Of these, the halogen atoms are preferred, and the fluorine atom is more preferred.

$R^{a1}$ to $R^{a3}$, $R^{b1}$, $R^{b2}$, $R^{c1}$ and $R^{c2}$ each independently represent preferably an unsubstituted linear or branched alkyl group, a fluorinated alkyl group, an unsubstituted monovalent aromatic hydrocarbon group, $-OSO_2-R''$, or $-SO_2-R''$, more preferably a fluorinated alkyl group or an unsubstituted monovalent aromatic hydrocarbon group, and still more preferably a fluorinated alkyl group, wherein R'' represents an unsubstituted monovalent alicyclic hydrocarbon group or an unsubstituted monovalent aromatic hydrocarbon group.

In the above formula (X-1), k1, k2 and k3 are each preferably an integer of 0 to 2, more preferably 0 or 1, and still more preferably 0.

In the above formula (X-2), k4 is preferably an integer of 0 to 2, more preferably 0 or 1, and still more preferably 1; and k5 is preferably an integer of 0 to 2, more preferably 0 or 1, and still more preferably 0.

In the above formula (X-3), k6 and k7 are each preferably an integer of 0 to 2, more preferably 0 or 1, and still more preferably 0.

X+ represents preferably a cation represented by the above formula (X-1), and more preferably a triphenylsulfonium cation.

Examples of the acid generating agent represented by the above formula (7) include compounds represented by the following formulae (7-1) to (7-13) (hereinafter, may be also referred to as "compounds (7-1) to (7-13)"), and the like.

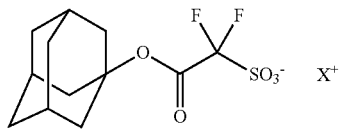
(7-1)

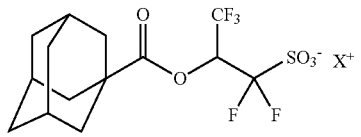
(7-2)

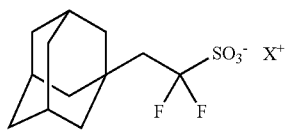
(7-3)

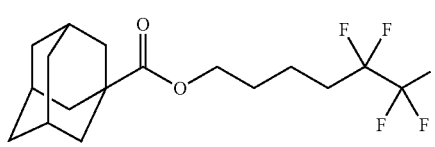
(7-4)

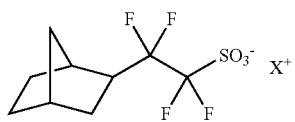
(7-5)

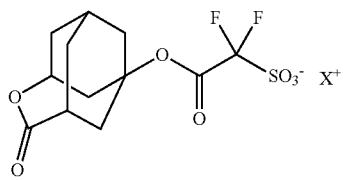
(7-6)

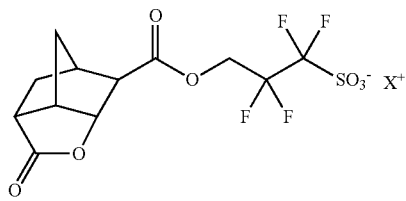
(7-7)

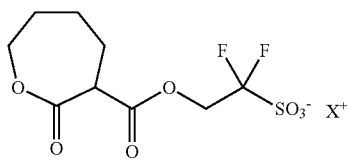
(7-8)

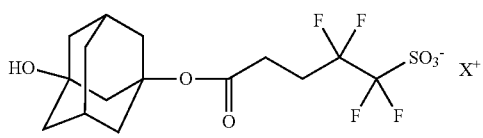
(7-9)

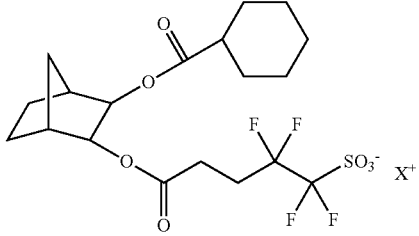
(7-10)

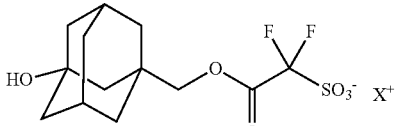
(7-11)

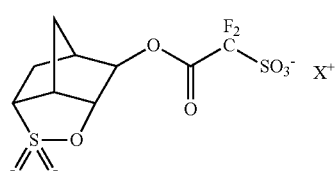
(7-12)

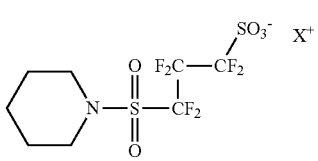
(7-13)

In the above formulae (7-1) to (7-13), X+ is as defined in the above formula (7).

Of these, as the acid generating agent (C), onium salt compounds are preferred, sulfonium salts and tetrahydrothiophenium salts are more preferred, and the compound (7-1), the compound (7-2), the compound (7-12) and the compound (7-13) are still more preferred.

In a case where the acid generator (C) is the acid generating agent (C), the content of the acid generator (C) with respect to 100 parts by mass of the polymer (A) is, in light of ensuring the sensitivity of the resin composition, preferably no less than 0.1 parts by mass and no greater than 30 parts by mass, more preferably no less than 0.5 parts by mass and no greater than 20 parts by mass, and still more preferably no less than 1 part by mass and no greater than 15 parts by mass. When the content of the acid generating agent (C) falls within the above range, the sensitivity of the resin composition may be improved. The resin composition may contain either one, or two or more types of the acid generator (C).

(D) Acid Diffusion Controller

The resin composition may contain the acid diffusion controller (D), as needed.

The acid diffusion controller (D) achieves the effect of controlling a diffusion phenomenon of the acid generated from the acid generator (C) upon an exposure in the resist film, and inhibiting unfavorable chemical reactions at light-unexposed regions, whereby the storage stability of the resulting resin composition is further improved. Furthermore, a resolution for use as a resist is further improved, while variation of the line width of the resist pattern caused by variation of post exposure time delay from the exposure until a development treatment can be inhibited, which enables a resin composition with superior process stability to be obtained. The acid diffusion controller (D) may be contained in the resin composition in the form of a free compound (hereinafter, may be also referred to as "(D) acid diffusion control agent" or "acid diffusion control agent (D)", as appropriate), or in the form incorporated as a part of the polymer, or in both of these forms.

The acid diffusion control agent (D) is exemplified by a compound represented by the following formula (8) (hereinafter, may be also referred to as "nitrogen-containing compound (I)"), a compound having two nitrogen atoms in a single molecule (hereinafter, may be also referred to as "nitrogen-containing compound (II)"), a compound having three nitrogen atoms (hereinafter, may be also referred to as "nitrogen-containing compound (III)"), an amide group-containing compound, a urea compound, a nitrogen-containing heterocyclic compound, and the like.

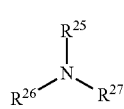

(8)

In the above formula (8), $R^{25}$, $R^{26}$ and $R^{27}$ each independently represent a hydrogen atom, an unsubstituted or substituted linear, branched or cyclic alkyl group, an unsubstituted or substituted aryl group or an unsubstituted or substituted aralkyl group.

Examples of the nitrogen-containing compound (I) include: monoalkylamines such as n-hexylamine; dialkylamines such as di-n-butylamine; trialkylamines such as triethylamine; aromatic amines such as aniline; and the like. Examples of the nitrogen-containing compound (II) include ethylenediamine, N,N,N',N'-tetramethylethylenediamine, and the like.

Examples of the nitrogen-containing compound (III) include: polyamine compounds such as polyethyleneimine and polyallylamine; polymers of dimethylaminoethylacrylamide, etc.; and the like.

Examples of the amide group-containing compound include formamide, N-methylformamide, N,N-dimethylformamide, acetamide, N-methylacetamide, N,N-dimethylacetamide, propionamide, benzamide, pyrrolidone, N-methylpyrrolidone, and the like.

Examples of the urea compound include urea, methylurea, 1,1-dimethylurea, 1,3-dimethylurea, 1,1,3,3-tetramethylurea, 1,3-diphenylurea, tributylthiourea, and the like.

Examples of the nitrogen-containing heterocyclic compound include: pyridines such as pyridine and 2-methylpyridine; morpholines such as N-propylmorpholine and N-(undecylcarbonyloxyethyl)morpholine; pyrazines; pyrazoles; and the like.

A compound having an acid-labile group may also be used as the nitrogen-containing organic compound. Examples of the nitrogen-containing organic compound having an acid-labile group include N-t-butoxycarbonylpiperidine, N-t-butoxycarbonylimidazole, N-t-butoxycarbonylbenzimidazole, N-t-butoxycarbonyl-2-phenylbenzimidazole, N-(t-butoxycarbonyl)di-n-octylamine, N-(t-butoxycarbonyl)diethanolamine, N-(t-butoxycarbonyl)dicyclohexylamine, N-(t-butoxycarbonyl)diphenylamine, N-t-butoxycarbonyl-4-hydroxypiperidine, N-t-amyloxycarbonyl-4-hydroxypiperidine, and the like.

A photolabile base which is sensitized upon an exposure to generate a weak acid may also be used as the acid diffusion control agent (D). The photolabile base is exemplified by an onium salt compound that loses acid diffusion controllability through degradation upon an exposure, and the like. The onium salt compound is exemplified by a sulfonium salt compound represented by the following formula (9-1), an iodonium salt compound represented by the following formula (9-2), and the like.

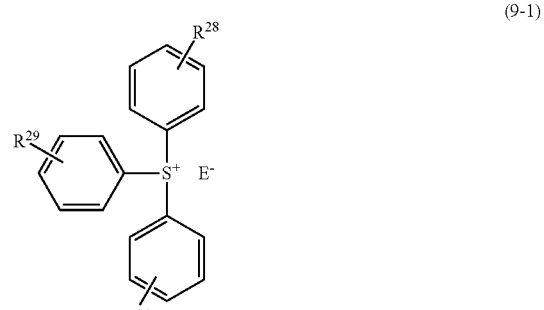

(9-1)

(9-2)

In the above formulae (9-1) and (9-2), $R^{28}$ to $R^{32}$ each independently represent a hydrogen atom, an alkyl group, an alkoxy group, a hydroxy group or a halogen atom; $E^-$ and $Q^-$ each independently represent $OH^-$, $R^\beta$—$COO^-$, $R^\beta$—$SO_3^-$ or an anion represented by the following formula (9-3), wherein $R^\beta$ represents an alkyl group, an aryl group or an aralkyl group.

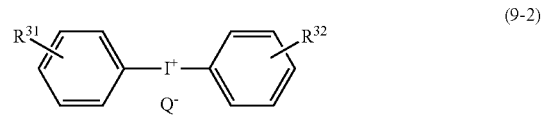

(9-3)

In the above formula (9-3), $R^{33}$ represents a linear or branched alkyl group having 1 to 12 carbon atoms, or a linear or branched alkoxyl group having 1 to 12 carbon atoms, wherein a part or all of hydrogen atoms included in the linear or branched alkyl group or the linear or branched alkoxyl group may be substituted with a fluorine atom; and u is an integer of 0 to 2.

Examples of the photolabile base include compounds represented by the following formulae, and the like.

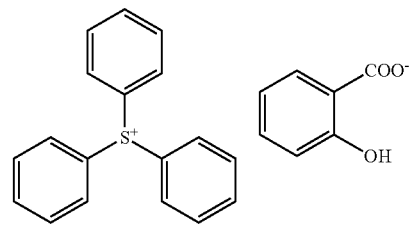

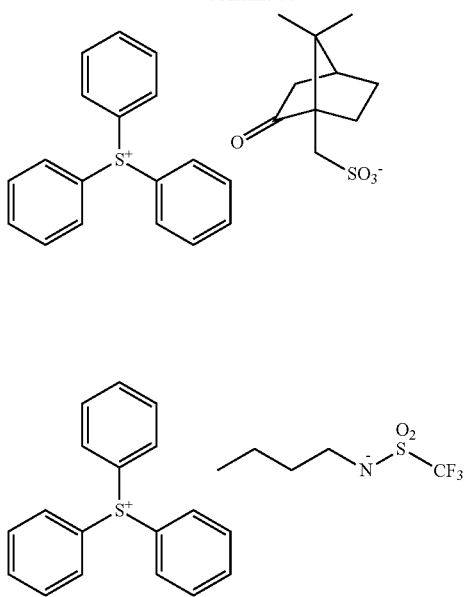
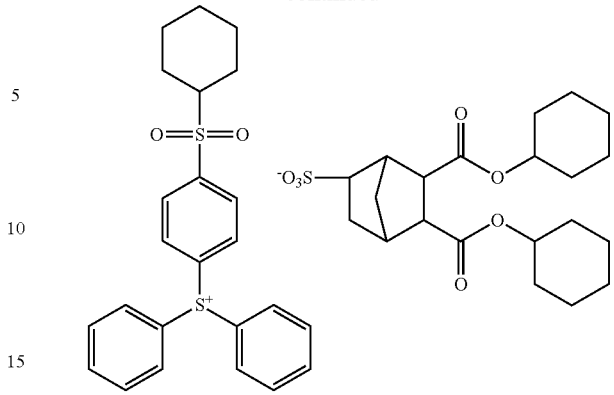
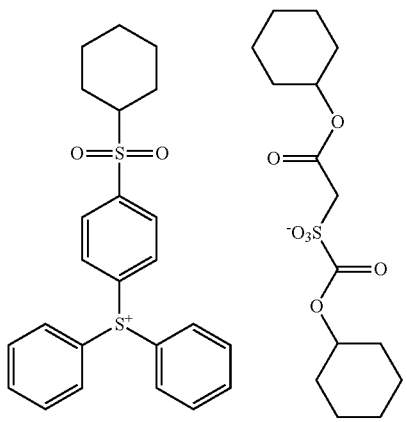
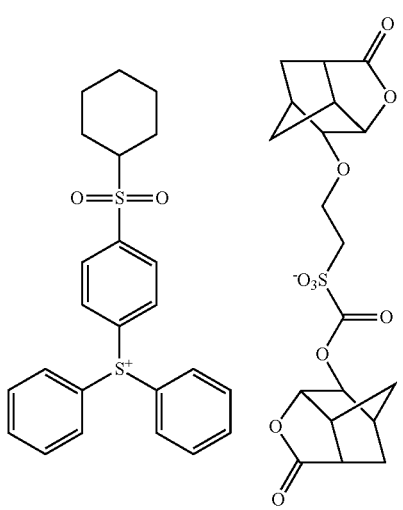

Of these, as the photolabile base, sulfonium salts are preferred, triaryl sulfonium salts are more preferred, and triphenylsulfonium salicylate and triphenylsulfonium 10-camphorsulfonate are still more preferred.

In a case where the acid diffusion controller (D) is the acid diffusion control agent (D), the content of the acid diffusion controller (D) with respect to 100 parts by mass of the polymer (A) is preferably 0 to 20 parts by mass, more preferably 0.1 parts by mass to 15 parts by mass, and still more preferably 0.3 parts by mass to 10 parts by mass. When the content of the acid diffusion control agent (D) falls within the above range, the lithography performances of the resin composition can be improved. When the content of the acid diffusion control agent (D) is greater than the upper limit, the sensitivity of the resin composition may be deteriorated. The resin composition may contain either one, or two or more types of the acid diffusion controller (D).

(E) Polymer

The polymer (E) is a fluorine atom-containing polymer other than the polymer (A). The polymer (E) has a structural unit that includes a fluorine atom.

In a case where the resin composition (A) contains the polymer (A) as the base polymer, and the resin composition (A) is used for liquid immersion lithography, the resin composition (A) preferably contains the polymer (E) (hereinafter, may be also referred to as "(E1) polymer" or "polymer (E1)").

In light of the adjustment of the water repellency of the formed protective film for liquid immersion lithography, the resin composition (B) preferably contains in addition to the polymer (A), the polymer (E) (hereinafter, may be also referred to as "(E2) polymer" or "polymer (E2)").

(E1) Polymer

In the case where the resin composition (A) contains the polymer (E1), when a resist film is formed, the polymer (E1) tends to be localized in the surface region of the resist film due to oil repellent characteristics of the polymer (E1) in the resist film, and consequently the elution of the acid generating agent, the acid diffusion control agent and/or the like into a liquid immersion medium may be inhibited in the liquid immersion lithography. In addition, due to water repellent characteristics of the polymer (E1), an advancing contact angle of a liquid immersion medium on the resist film can be controlled to fall within a desired range, whereby generation of bubble defects can be inhibited. Further, a greater receding contact angle of the liquid immersion medium on the resist film is attained, whereby an exposure by high speed scanning without being accompanied by residual water beads is enabled. Thus, when the resin composition contains the polymer (E1), a resist film suitable for liquid immersion lithography processes can be provided.

The polymer (E1) is not particularly limited as long as the polymer (E1) has a fluorine atom, and the polymer (E1) preferably has a greater percentage content (% by mass) of fluorine atoms than that of the polymer (A) as the base polymer in the resin composition. When the polymer (E1) has a greater percentage content (% by mass) of fluorine atoms than that of the polymer (A) as the base polymer, a higher degree of the abovementioned localization may be attained, leading to an improvement of characteristics such as water repellency and elution inhibitory ability of the resulting resist film.

The percentage content of fluorine atoms of the polymer (E1) is preferably no less than 1% by mass, more preferably 2% by mass to 60% by mass, still more preferably 4% by mass to 40% by mass, and particularly preferably 7% by mass to 30% by mass. When the percentage content of fluorine atoms of the polymer (E1) is less than the lower limit, the hydrophobicity of the surface of the resist film may be deteriorated. It is to be noted that the percentage content (% by mass) of fluorine atoms of the polymer can be calculated based on the structure of the polymer determined by $^{13}$C-NMR spectroscopy.

The polymer (E1) preferably has as the structural unit that includes a fluorine atom, at least one selected from the group consisting of the structural unit (V-1) and the structural unit (V-2) which may be included in the polymer (A). The polymer (E1) may have either one, or two or more types of each of the structural unit (V-1) and the structural unit (V-2).

The proportion of the structural unit (V-1) and the structural unit (V-2) with respect to the total structural units constituting the polymer (E1) is preferably 10 mol % to 90 mol %, more preferably 20 mol % to 85 mol %, and still more preferably 30 mol % to 80 mol %.

The polymer (E1) also preferably has a structural unit that includes an acid-labile group. The structural unit that includes an acid-labile group is exemplified by the structural unit (II) which may be included in the polymer (A), and the like.

The proportion of the structural unit that includes an acid-labile group with respect to the total structural units constituting the polymer (E1) is preferably 10 mol % to 90 mol %, more preferably 15 mol % to 85 mol %, and still more preferably 20 mol % to 50 mol %.

Other Structural Unit

Moreover, the polymer (E1) may have other structural unit in addition to the structural units described above, and examples of the other structural unit include: a structural unit that includes an alkali-soluble group; a structural unit that includes at least one selected from the group consisting of a lactone structure, a cyclic carbonate structure and a sultone structure; a structural unit that includes an alicyclic group; and the like. Examples of the alkali-soluble group include a carboxy group, a sulfonamide group, a sulfo group, and the like. Examples of the structural unit that includes at least one selected from the group consisting of a lactone structure, a cyclic carbonate structure and a sultone structure include the structural unit (III) which may be included in the polymer (A), and the like.

The proportion of the other structural unit with respect to the total structural units constituting the polymer (E1) is typically no greater than 30 mol %, preferably no greater than 20 mol %. When the proportion of the other structural unit is greater than the upper limit, the pattern formability of the resin composition may be deteriorated.

The content of the polymer (E1) in the resin composition (A) with respect to 100 parts by mass of the polymer (A) is preferably 0 parts by mass to 20 parts by mass, more preferably 0.5 parts by mass to 15 parts by mass, and still more preferably 1 part by mass to 10 parts by mass. When the content of the polymer (E1) is greater than the upper limit, the pattern formability of the resin composition may be deteriorated. The resin composition may contain either one, or two or more types of the polymer (E).

(E2) Polymer

The structural unit that includes a fluorine atom, which may be included in the polymer (E2) of the resin composition (B), is exemplified by the structural unit (V) and the structural unit (VI) which may be included in the polymer (A), and the like.

The proportion of the structural unit (V) and the structural unit (VI) with respect to the total structural units constituting the polymer (E2) is preferably 20 mol % to 100 mol %, more preferably 40 mol % to 90 mol %, and still more preferably 60 mol % to 90 mol %.

The polymer (E2) also preferably has, in addition to the structural units described above, the structural unit (VII) which may be included in the polymer (A). When the polymer (E2) has the structural unit (VII), the protective film for liquid immersion lithography formed from the resin composition (B) exhibits superior adhesiveness to a substrate.

The proportion of the structural unit (VII) with respect to the total structural units constituting the polymer (E2) is preferably 0 mol % to 50 mol %, preferably 5 mol % to more 30 mol %, and still more preferably 10 mol % to 20 mol %.

The polymer (E2) may have other structural unit than the structural units described above. The proportion of the other structural unit with respect to the total structural units constituting the polymer (E2) is preferably 0 mol % to 30 mol %, and more preferably 0 mol % to 10 mol %.

The content of the polymer (E2) in the resin composition (B) with respect to 100 parts by mass of the polymer (A) is preferably 0 parts by mass to 300 parts by mass, more preferably 20 parts by mass to 200 parts by mass, and still more preferably 50 parts by mass to 150 parts by mass. When the content of the polymer (E2) is greater than the upper limit, the affinity of the protective film for liquid immersion lithography formed from the resin composition for a developer solution may be deteriorated. The resin composition (B) may contain either one, or two or more types of the polymer (E2).

(F) Polymer

The polymer (F) has a lower percentage content of fluorine atoms than that of the polymer (A) and has a structural unit that includes an acid-labile group. For example, in a case where the polymer (A) is used as the water repellent polymer additive (i.e., polymer (A2)) in the resin composition, the resin composition preferably contains the polymer (F) as a base polymer. The polymer (F) preferably has the structural unit (II) and the structural unit (III) which may be included in the polymer (A), and may have the structural units (IV) to (VI).

The proportion of the structural unit (II) with respect to the total structural units constituting the polymer (F) is preferably 10 mol % to 70 mol %, and more preferably 20 mol % to 60 mol %.

The proportion of the structural unit (III) with respect to the total structural units constituting the polymer (F) is preferably 20 mol % to 70 mol %, and more preferably 30 mol % to 60 mol %.

The proportions of the structural units (IV) to (VI) with respect to the total structural units constituting the polymer (F) are each preferably 0 mol % to 40 mol %, and more preferably 10 mol % to 30 mol %.

The Mw of the polymer (F) is preferably no less than 1,000 and no greater than 50,000, more preferably no less than 2,000 and no greater than 30,000, still more preferably no less than 3,000 and no greater than 20,000, and particularly preferably no less than 5,000 and no greater than 15,000.

The Mw/Mn of the polymer (F) is typically no less than 1 and no greater than 5, preferably no less than 1 and no greater than 3, and still more preferably no less than 1 and no greater than 2.

In light of the facilitation of the localization of the polymer (A2) in the resist film surface region and a consequent improvement of the lithography performances of the resin composition (A2), the content of the polymer (F) in the resin composition (A2) with respect to 100 parts by mass of the polymer (A2) is preferably 500 parts by mass to 100,000 parts by mass, more preferably 700 parts by mass to 20,000 parts by mass, and still more preferably 1,000 parts by mass to 10,000 parts by mass. The resin composition may contain either one, or two or more types of the polymer (F).

Other Optional Component

The resin composition may contain other optional component in addition to the components (A) to (F) described above. The other optional component is exemplified by a localization accelerator, a polymer other than the polymers (A), (E) and (F), a surfactant, an alicyclic skeleton-containing compound, a sensitizing agent, and the like. These other optional components each may be used either alone of one type, or two or more types thereof in combination.

Localization Accelerator

The localization accelerator achieves the effect that for example, in the case of the resin composition (A) containing a water repellent polymer additive as the polymer (A) and/or the polymer (E), the water repellent polymer additive is more efficiently segregated in the surface region of the resist film. When the resin composition contains the localization accelerator, the amount of the water repellent polymer additive added can be decreased than ever before. Therefore, elution of the component(s) from the resist film into a liquid immersion liquid is further inhibited, and quicker liquid immersion lithography is enabled by high speed scanning, without impairing the resolution, the LWR performance and the inhibitory ability of defects. As a result, the hydrophobicity of the surface of the resist film can be improved, whereby defects caused by the liquid immersion such as watermark defects can be inhibited. As the localization accelerator, a low molecular weight compound having a relative permittivity of no less than 30 and no greater than 200, and having a boiling point at 1 atmospheric pressure of no less than 100° C. may be used. Specifically, such a compound is exemplified by a lactone compound, a carbonate compound, a nitrile compound, a polyhydric alcohol, and the like.

Examples of the lactone compound include γ-butyrolactone, valerolactone, mevalonic lactone, norbornanelactone, and the like.

Examples of the carbonate compound include propylene carbonate, ethylene carbonate, butylene carbonate, vinylene carbonate, and the like.

Examples of the nitrile compound include succinonitrile, and the like.

Examples of the polyhydric alcohol include glycerin, and the like.

The content of the localization accelerator with respect to 100 parts by mass of the total amount of the polymer in the resin composition is preferably 10 parts by mass to 500 parts by mass, more preferably 15 parts by mass to 300 parts by mass, still more preferably 20 parts by mass to 200 parts by mass, and particularly preferably 25 parts by mass to 100 parts by mass.

Surfactant

The surfactant achieves the effect of improving the application property, striation, developability, and the like. Examples of the surfactant include: nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate and polyethylene glycol distearate; commercially available products such as KP341 (manufactured by Shin-Etsu Chemical Co., Ltd.); Polyflow No.75 and Polyflow No.95 (each manufactured by Kyoeisha Chemical Co., Ltd.); EFTOP EF301, EFTOP EF303 and EFTOP EF352 (each manufactured by Tochem Products Co. Ltd.); Megaface F171 and Megaface F173 (each manufactured by DIC); Fluorad FC430 and Fluorad FC431 (each manufactured by Sumitomo 3M Limited); ASAHI GUARD AG710, Surflon S-382, Surflon SC-101, Surflon SC-102, Surflon SC-103, Surflon SC-104, Surflon SC-105 and Surflon SC-106 (each manufactured by Asahi Glass Co., Ltd.); and the like. The content of the surfactant in the resin composition with respect to 100 parts by mass of the polymer (A) is typically no greater than 2 parts by mass.

Alicyclic Skeleton-Containing Compound

The alicyclic skeleton-containing compound achieves the effect of improving dry etching resistance, a pattern configuration, adhesiveness to a substrate, and the like.

Examples of the alicyclic skeleton-containing compound include:

adamantane derivatives such as 1-adamantanecarboxylic acid, 2-adamantanone and t-butyl 1-adamantanecarboxylate;

deoxycholic acid esters such as t-butyl deoxycholate, t-butoxycarbonylmethyl deoxycholate and 2-ethoxyethyl deoxycholate;

lithocholic acid esters such as t-butyl lithocholate, t-butoxycarbonylmethyl lithocholate and 2-ethoxyethyl lithocholate;

3-[2-hydroxy-2,2-bis(trifluoromethyl)ethyl]tetracyclo[$4.4.0.1^{2,5}.1^{7,10}$]dodecane, 2-hydroxy-9-methoxycarbonyl-5-oxo-4-oxa-tricyclo[$4.2.1.0^{3,7}$]nonane; and the like. The content of the alicyclic skeleton-containing compound in the resin composition with respect to 100 parts by mass of the polymer (A) is typically no greater than 5 parts by mass.

Sensitizing Agent

The sensitizing agent exhibits the action of increasing the amount of the acid generated from the acid generating agent (C) or the like, and achieves the effect of improving "apparent sensitivity" of the resin composition.

Examples of the sensitizing agent include carbazoles, acetophenones, benzophenones, naphthalenes, phenols, biacetyl, eosin, rose bengal, pyrenes, anthracenes, phenothiazines, and the like. These sensitizing agents may be used either alone, or two or more types thereof may be used in combination. The content of the sensitizing agent in the resin composition with respect to 100 parts by mass of the polymer (A) is typically no greater than 2 parts by mass.

Preparation Method of Resin Composition

The resin composition may be prepared, for example, by mixing the polymer (A), and the optional component which is added as needed with the solvent (B) in a certain ratio. After the mixing, the resin composition is preferably filtered through a filter having a pore size of about 0.2 μm, for example. The solid content concentration of the resin composition typically 0.1% by mass to 50% by mass, preferably 0.5% by mass to 30% by mass, and more preferably 1% by mass to 20% by mass.

Resist Pattern-Forming Method

A resist pattern-forming method carried out by using the resin composition (A) (hereinafter, may be also referred to as "resist pattern-forming method (A)") includes the steps of:

forming a resist film (hereinafter, may be also referred to as "resist film-forming step");

exposing the resist film (hereinafter, may be also referred to as "exposure step"); and developing the resist film exposed (hereinafter, may be also referred to as "development step"), wherein the resist film is formed from the resin composition described above.

Alternatively, a resist pattern-forming method carried out by using the resin composition (B) (hereinafter, may be also referred to as "resist pattern-forming method (B)") includes the steps of:

forming a resist film (hereinafter, may be also referred to as "resist film-forming step");

overlaying a protective film on the resist film (hereinafter, may be also referred to as "protective film-overlaying step");

subjecting the resist film having a protective film overlaid thereon to liquid immersion lithography (hereinafter, may be also referred to as "liquid immersion lithography step"); and developing the resist film subjected to the liquid immersion lithography (hereinafter, may be also referred to as "development step"), wherein the protective film is formed from the resin composition described above.

According to the resist pattern-forming methods, since the resin composition described above is used, a resist pattern exhibiting low LWR and superior CDU, a high resolution, and superior rectangularity of cross-sectional shape can be formed, while a great depth of focus and exposure latitude. Hereinafter, each step of the two resist pattern-forming methods will be described.

Resist Pattern-Forming Method (A)

Resist Film-Forming Step

In this step, a resist film is formed using the resin composition described above. The substrate on which the resist film is formed is exemplified by a conventionally well-known substrate such as a silicon wafer, a wafer coated with silicon dioxide or aluminum, and the like. In addition, an organic or inorganic antireflective film disclosed in, for example, Japanese Examined Patent Application, Publication No. H6-12452, Japanese Unexamined Patent Application, Publication No. S59-93448, or the like may be formed on the substrate. An application procedure is exemplified by spin-coating, cast coating, roll-coating, and the like. After the application, prebaking (PB) may be carried out as needed for evaporating the solvent remaining in the coating film. The temperature for PB is typically 60° C. to 140° C., and preferably 80° C. to 120° C. The time period for PB is typically 5 sec to 600 sec, and preferably 10 sec to 300 sec. The film thickness of the formed resist film is preferably 10 nm to 1,000 nm, and more preferably 10 nm to 500 nm.

Exposure Step

In this step, the resist film formed in the resist film-forming step is exposed by irradiating the resist film with exposure light through a photomask or the like (through a liquid immersion medium such as water, as needed). Examples of the exposure light include: electromagnetic waves such as visible light rays, ultraviolet rays, far ultraviolet rays, extreme ultraviolet rays (EUV), X-rays and γ radiations; charged particle beams or charged particle rays such as electron beams and α-rays; and the like, in accordance with the line width of the intended pattern. Of these, far ultraviolet rays, EUV and electron beams are preferred, an ArF excimer laser beam (wavelength: 193 nm), a KrF excimer laser beam (wavelength: 248 nm), EUV and electron beams are more preferred, and an ArF excimer laser beam, EUV and electron beams are still more preferred.

In a case where the exposure is carried out by liquid immersion lithography, examples of the liquid immersion liquid for use in the exposure include water, fluorine-containing inert liquids, and the like. It is preferred that the liquid immersion liquid is transparent to an exposure wavelength, and has a temperature coefficient of the refractive index as small as possible so that distortion of an optical image projected onto the film is minimized. In particular, when an ArF excimer laser beam (wavelength: 193 nm) is used as an exposure light source, it is preferred to use water in light of availability and ease of handling thereof in addition to the aforementioned considerations. When water is used, a slight amount of an additive which reduces the surface tension of water and imparts enhanced surfactant power may be added. It is preferred that the additive hardly dissolves a resist film on a wafer and has a negligible influence on an optical coating of an inferior face of a lens. The water for use is preferably distilled water.

It is preferred that post exposure baking (PEB) is carried out after the exposure to promote dissociation of the acid-labile group included in the polymer (A), etc. mediated by the acid generated from the acid generator (C) upon the exposure at exposed regions of the resist film. This PEB produces a difference in solubility of the resist film in a developer solution between the light-exposed regions and light-unexposed regions. The temperature for PEB is typically 50° C. to 180° C., and preferably 80° C. to 130° C. The time period for PEB is typically 5 sec to 600 sec, and preferably 10 sec to 300 sec.

Development Step

In this step, the resist film exposed in the exposure step is developed. This permits a predetermined resist pattern to be formed. The development is generally followed by washing with a rinse agent such as water or an alcohol, and drying.

In the case of a development with an alkali, the developer solution for use in the development is exemplified by alkaline aqueous solutions prepared by dissolving at least one alkaline compound such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide (TMAH), pyrrole, piperidine, choline, 1,8-diazabicyclo-[5.4.0]-7-undecene, 1,5-diazabicyclo-[4.3.0]-5-nonene, and the like. Of these, an aqueous TMAH solution is preferred, a 2.38% by mass aqueous TMAH solution is more preferred.

Alternatively, in the case of a development with an organic solvent, the developer solution for use in the development is exemplified by an organic solvent such as a hydrocarbon solvent, an ether solvent, an ester solvent, a ketone solvent and an alcohol solvent, and a solvent containing the organic solvent. Examples of the organic solvent include one, or two or more types of the solvents exemplified in connection with the solvent (B) of the abovementioned resin composition, and the like. Of these, the ester solvent and the ketone solvent are preferred. The ester solvent is preferably an acetic acid ester solvent, and more preferably n-butyl acetate. The ketone solvent is preferably a chain ketone, and more preferably 2-heptanone. The content of the organic solvent in the developer solution is preferably no less than 80% by mass, more preferably no less than 90% by mass, still more preferably no less than 95% by mass, and particularly preferably no less than 99% by mass. A component other than the organic solvent in the developer solution is exemplified by water, silicone oil, and the like.

Examples of the development procedure include: a dipping procedure in which the substrate is immersed for a given time period in the developer solution charged in a container; a puddle procedure in which the developer solution is placed to form a dome-shaped bead by way of the surface tension on the surface of the substrate for a given time period to conduct a development; a spraying procedure in which the developer solution is sprayed onto the surface of the substrate; a dynamic dispensing procedure in which the developer solution is continuously applied onto the substrate that is rotated at a constant speed while scanning with a developer solution-application nozzle at a constant speed; and the like.

Resist Pattern-Forming Method (B)
Resist Film-Forming Step

In this step, a resist film is formed. The resist film is formed, for example, using a radiation-sensitive resin composition containing a polymer having a structural unit that includes an acid-labile group, and a radiation-sensitive acid generator, and the like. The procedure for forming the resist film is exemplified by a procedure similar to that which may be employed in the resist film-forming step of the Resist Pattern-Forming Method (A) described above.

Protective Film-Overlaying Step

In this step, a protective film is overlaid on the resist film resist formed in the film-forming step. The application procedure of the resin composition (B) is exemplified by a procedure similar to the application procedure of the resin composition (A) which may be employed in the resist film-forming step of the Resist Pattern-Forming Method (A) described above. In this step, it is preferred that prebaking (PB) is carried out after the resin composition (B) is applied. Since direct contact of the resist film with the liquid immersion liquid can be avoided after the protective film is provided on the resist film, the impairment of the lithography performances of the resist film caused by penetration of the liquid immersion liquid into the resist film, and the contamination of a lens of a projection aligner caused by the component eluted from the resist film into the liquid immersion liquid are effectively inhibited.

It is preferred that the formed protective film has a thickness as closer to an odd multiple of $\lambda/4$ m as possible, wherein $\lambda$ represents a wavelength of the radioactive ray, and m represents a refractive index of the protective film. When the formed protective film has such a thickness, the effect of inhibiting reflection on an upper interface of the resist film can be enhanced.

Liquid Immersion Lithography Step

In this step, the resist film having the protective film overlaid thereon, which is formed in the protective film-overlaying step, is subjected to liquid immersion lithography. The liquid immersion lithography may be carried out by placing a liquid immersion liquid on the overlaid protective film, and conducting an exposure through the liquid immersion liquid.

The liquid immersion liquid, the exposure light for use in the exposure and the procedure for the liquid immersion lithography are exemplified by a liquid immersion liquid, an exposure light and a procedure for the liquid immersion lithography similar to those for the liquid immersion lithography which may be employed in the exposure step of the Resist Pattern-Forming Method (A) described above, and the like.

In order to improve the resolution, pattern configuration, developability and the like of the resultant resist pattern, post exposure baking (PEB) is preferably carried out after the liquid immersion lithography. The PEB temperature can be appropriately selected in accordance with the type of the radiation-sensitive composition and/or the resin composition (B) employed, and the like, and is typically 30° C. to 200° C., and preferably 50° C. to 150° C. The PEB time period is typically 5 sec to 600 sec, and preferably 10 sec to 300 sec.

Development Step

In this step, the resist film subjected to the liquid immersion lithography in the liquid immersion lithography step is developed. A predetermined resist pattern can be thereby formed. The procedure for conducting this step is exemplified by a procedure similar to that which may be employed in the development step of the Resist Pattern-Forming Method (A) described above, and the like.

Polymer

The polymer according to still another embodiment of the present invention has a structural unit that includes the group represented by the above formula (1).

The polymer can be suitably used as a polymer component of the resin composition described above.

The polymer has been described in connection with the polymer (A) in the resin composition.

EXAMPLES

Hereinafter, the embodiments of the present invention will be described in more detail by way of Examples, but the present invention is not in any way limited to these Examples. Measurement of each physical property in Examples was carried out according to the following method.

Weight Average Molecular Weight (Mw) and Number Average Molecular Weight (Mn)

The Mw and the Mn were determined by gel permeation chromatography (GPC) using GPC columns (available from Tosoh Corporation "G2000 HXL"×2, "G3000 HXL"×1, "G4000 HXL"×1), a differential refractometer as a detector, and mono-dispersed polystyrene as a standard under analytical conditions involving a flow rate of 1.0 mL/min, an elution solvent of tetrahydrofuran (available from Wako Pure Chemical Industries, Ltd.), a sample concentration of 1.0% by mass, an amount of injected sample of 100 µL, and a column temperature of 40° C. Moreover, the dispersity index (Mw/Mn) was calculated based on the results of the determination of the Mw and the Mn.

$^{13}$C-NMR Analysis

An analysis for determining the proportions (mol %) of structural units in each polymer was carried out using a nuclear magnetic resonance apparatus ("JNM-ECX400" available from JEOL, Ltd.) and deuterochloroform as a solvent for measurement.

Synthesis of Compound

Synthesis Example 1

Synthesis of Compound (M-1)

Into a 1,000 mL round-bottom flask were charged 34.8 g (300 mmol) of diacetone alcohol, 39.5 g (390 mmol) of triethylamine, 10.1 g (90.0 mmol) of 1,4-diazabicyclo[2.2.2]octane (DABCO) and 300 g of acetonitrile as a solvent, and the mixture was stirred under a nitrogen atmosphere with cooling in an ice bath. To this mixture was slowly added dropwise 63.8 g (330 mmol) of bromodifluoroacetyl chloride. This mixture was stirred in an ice bath for 1 hour, and then at room temperature for 18 hrs. Water was added to stop the reaction, and then an extraction with ethyl acetate was carried out. Purification by column chromatography was made to give 63.9 g of a compound represented by the following formula (A) (yield: 78% based on diacetone alcohol). According to an LC-MS measurement, the compound (A) gave M$^+$ of 273.

Next, 17.0 g (260 mmol) of zinc powder and 250 g of dry tetrahydrofuran were charged into a 1,000 mL round-bottom flask, then 2.17 g (20.0 mmol) of trimethylsilyl chloride was added thereto, and this mixture was stirred at room temperature for 20 min. This mixture was stirred with slow dropwise addition of a solution prepared by dissolving 54.6 g (200 mmol) of the compound (A) obtained as described above in 100 g of dry tetrahydrofuran. The internal temperature was elevated upon the dropwise addition, and the rate of the dropwise addition was controlled such that the internal temperature was maintained at 35° C. to 40° C. After the completion of the dropwise addition, the mixture was stirred at room temperature for 6 hrs, and then acetic acid was added to stop the reaction. Insoluble substances were removed by filtration through Celite, and the filtrate was washed with water and dried over anhydrous sodium sulfate. After the solvent was distilled off, purification by column chromatography was made to give 31.8 g of a compound represented by the following formula (B) (yield: 82% based on the compound (A)). According to an LC-MS measurement, the compound (B) gave M$^+$ of 194.

Thereafter, 19.4 g (100 mmol) of the compound (B) obtained as described above, 13.2 g (130 mmol) of triethylamine, 3.37 g (30.0 mmol) of 1,4-diazabicyclo[2.2.2]octane and 100 g of acetonitrile as a solvent were charged into a 500 mL round-bottom flask, and this mixture was stirred under a nitrogen atmosphere with cooling in an ice bath. To this mixture was slowly added dropwise 12.5 g (120 mmol) of methacryloyl chloride. This mixture was stirred in an ice bath for 1 hour, and then at room temperature for 18 hrs. Water was added to stop the reaction, and then an extraction with ethyl acetate was carried out. Purification by column chromatography was made to give 18.9 g of a compound represented by the following formula (M-1) (yield: 72% based on the compound (B)). According to an LC-MS measurement, the compound (M-1) gave M$^+$ of 262.

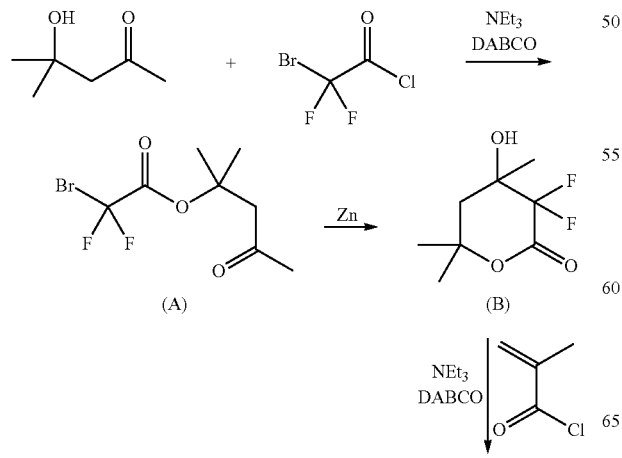

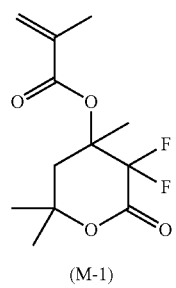

(M-1)

Synthesis Examples 2 to 17

Synthesis of Compounds (M-2) to (M-17)

Compounds represented by the following formulae (M-2) to (M-17) were synthesized by appropriately selecting a precursor and conducting an operation similar manner to that of Synthesis Example 1.

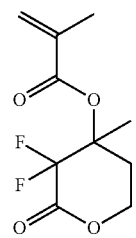

(M-2)

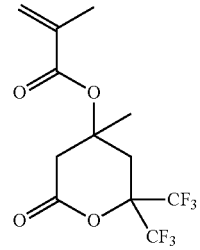

(M-3)

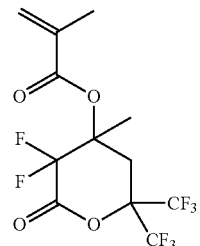

(M-4)

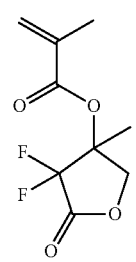

(M-5)

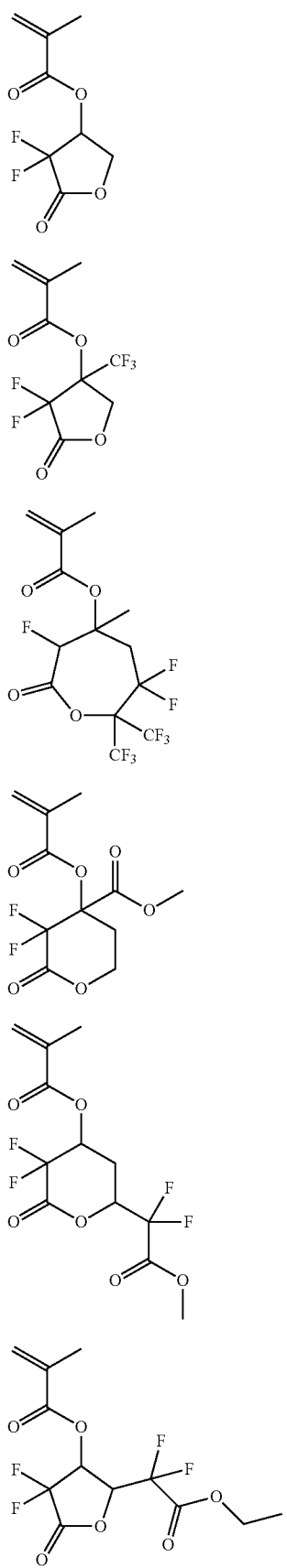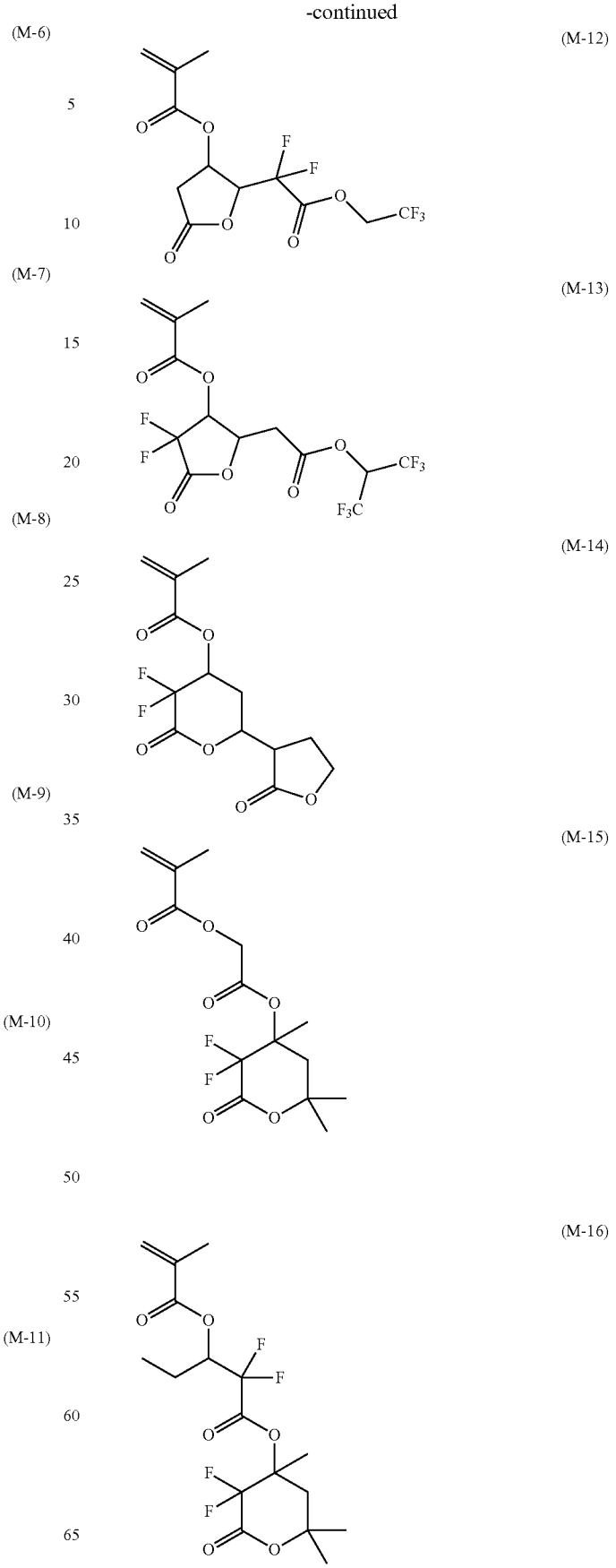

(M-17)

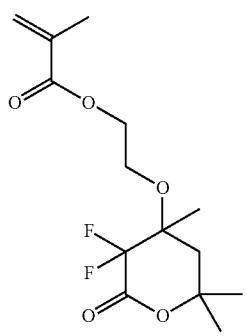

Synthesis of Polymer

Synthesis of Polymer (A), Polymer (E) and Polymer (F)

As the polymer (A), the polymer (A1) used as a base polymer, the polymer (A2) used as a water repellent polymer additive, and the polymer (A3) used in a resin composition for forming a protective film for liquid immersion lithography were synthesized. As the polymer (E), the polymer (E1) used as a water repellent polymer additive, the polymer (E2) used in a resin composition for forming a protective film for liquid immersion lithography were synthesized. Furthermore, the polymer (F) used as a base polymer was synthesized.

Monomers which were used for the synthesis of polymers and were other than the compounds (M-1) to (M-17) synthesized as described above are shown below.

(M'-1)

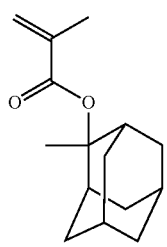

(M'-2)

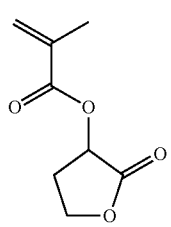

(M'-3)

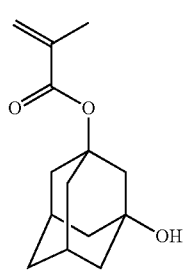

(M'-4)

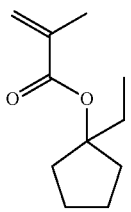

(M'-5)

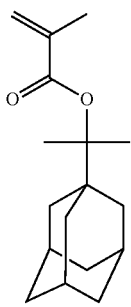

(M'-6)

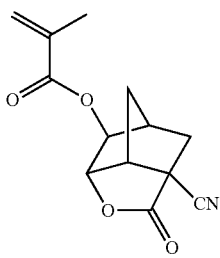

(M'-7)

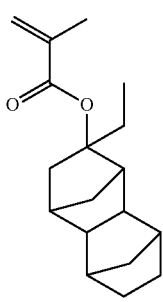

(M'-8)

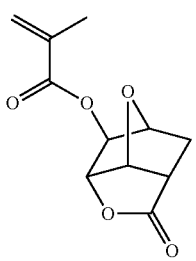

(M'-9)

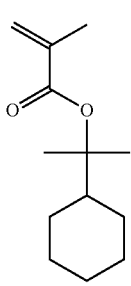

(M'-10) 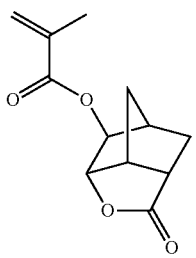

(M'-11) 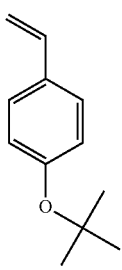

(M'-12) 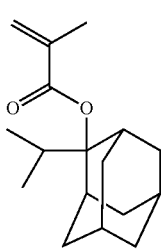

(M'-13) 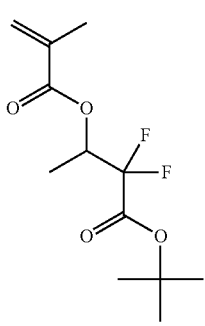

(M'-14) 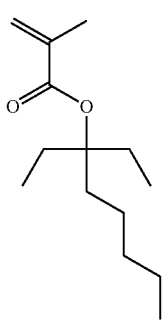

(M'-15) 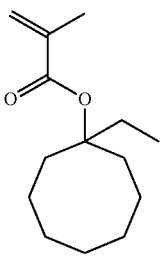

(M'-16) 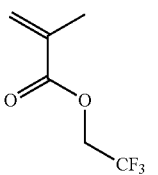

(M'-17) 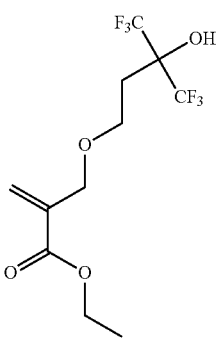

(M'-18) 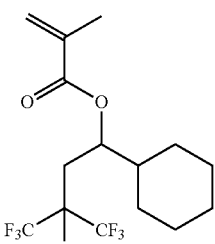

(M'-19)

$$O=S=O$$
$$\quad|\quad$$
$$OH$$

(with CH$_2$=CH– attached to S)

Synthesis of Polymer (A1) and Polymer (F)

Example 1

A monomer solution was prepared by dissolving 7.54 g (35 mol %) of the compound (M'-1), 5.47 g (35 mol %) of the compound (M'-2), 2.17 g (10 mol %) of the compound (M'-3) and 4.82 g (20 mol %) of the compound (M-1) in 40 g of 2-butanone, and further adding thereto 0.75 g (5 mol % with respect to the total number of moles of the compounds) of AIBN as a radical polymerization initiator. Next, a 100 mL three-neck flask containing 20 g of 2-butanone was purged with nitrogen for 30 min, then heated to 80° C. with stirring, and the monomer solution prepared as described above was added dropwise over 3 hrs using a dropping funnel. The time of the start of the dropwise addition was regarded as the time of the start of the polymerization reaction, and the polymerization reaction was allowed to proceed for 6 hrs. After the completion of the polymerization reaction, the polymerization reaction mixture was water-cooled to 30° C. or below. The cooled polymerization reaction mixture was poured into 400 g of methanol, and a precipitated white powder was filtered off. The collected white powder was washed twice with 80 g of methanol, followed by separation by filtration, and dried at 50° C. for 17 hrs to synthesize a polymer (A1-1) as a white powder (15.2 g, yield: 76%). The polymer (A1-1) had an Mw of 7,300 and an Mw/Mn of 1.53. In addition, the result of $^{13}$C-NMR analysis indicated that the proportions of the structural units derived from (M'-1), (M'-2), (M'-3) and (M-1) were respectively 35.1 mol %, 35.2 mol %, 10.2 mol % and 19.5 mol %.

Examples 2 to 19 and Synthesis Example 18

Polymers (A1-2) to (A1-19) and (F-1) were synthesized by a similar operation to that of Example 1 except that the type and the amount of the monomers used were as shown in Table 1 below. The total mass of the monomers used was 20 g. The symbol "-" in Table 1 indicates that the corresponding monomer was not used.

Synthesis of Polymer (A2) and Polymer (E1)

Example 20

A monomer solution was prepared by dissolving 30.01 g (30 mol %) of the compound (M'-12) and 69.99 g (70 mol %) of the compound (M-1) in 100 g of 2-butanone, and further dissolving therein 3.13 g (5 mol % with respect to the total number of moles of the compounds) of AIBN as a radical polymerization initiator. Next, a 1,000 mL three-neck flask containing 100 g of 2-butanone was purged with nitrogen for 30 min, then heated to 80° C. with stirring, and the monomer solution prepared as described above was added dropwise over 3 hrs using a dropping funnel. The time of the start of the dropwise addition was regarded as the time of the start of the polymerization reaction, and the polymerization reaction was allowed to proceed for 6 hrs. After the completion of the polymerization reaction, the polymerization reaction mixture was water-cooled to 30° C. or below. The polymerization reaction mixture was transferred to a 2 L separatory funnel, and then the polymerization reaction mixture was homogeneously diluted with 150 g of n-hexane. After the addition of 600 g of methanol, the components

TABLE 1

| | (A1) Polymer/ (F) polymer | Monomer that gives structural unit (I) | | Monomer that gives structural unit (II) | | Monomer that gives structural unit (III) or (IV) | | Yield (%) | Mw | Mw/Mn |
|---|---|---|---|---|---|---|---|---|---|---|
| | | type | amount (mol %) | proportion of structural unit (mol %) | type | amount (mol %) | proportion of structural unit (mol %) | type | amount (mol %) | proportion of structural unit (mol %) | | | |
| Example 1 | A1-1 | M-1 | 20 | 19.5 | M'-1 | 35 | 35.1 | M'-2 M'-3 | 35 10 | 35.2 10.2 | 76 | 7,300 | 1.53 |
| Example 2 | A1-2 | M-2 | 20 | 19.2 | M'-1 | 35 | 35.2 | M'-2 M'-3 | 35 10 | 35.3 10.3 | 77 | 7,500 | 1.90 |
| Example 3 | A1-3 | M-3 | 20 | 19.1 | M'-1 | 35 | 35.2 | M'-2 M'-3 | 35 10 | 35.4 10.3 | 75 | 7,400 | 1.54 |
| Example 4 | A1-4 | M-4 | 20 | 19.4 | M'-1 | 35 | 35.1 | M'-2 M'-3 | 35 10 | 35.3 10.2 | 76 | 7,400 | 1.53 |
| Example 5 | A1-5 | M-5 | 15 | 14.3 | M'-4 M'-5 | 40 10 | 40.3 10.1 | M'-6 | 35 | 35.3 | 77 | 7,500 | 1.54 |
| Example 6 | A1-6 | M-6 | 15 | 14.1 | M'-4 M'-5 | 40 10 | 40.3 10.2 | M'-6 | 35 | 35.4 | 76 | 7,600 | 1.53 |
| Example 7 | A1-7 | M-7 | 15 | 14.5 | M'-4 M'-5 | 40 10 | 40.2 10.2 | M'-6 | 35 | 35.1 | 75 | 7,400 | 1.88 |
| Example 8 | A1-8 | M-8 | 15 | 14.2 | M'-4 M'-5 | 40 10 | 40.3 10.2 | M'-6 | 35 | 35.3 | 76 | 7,800 | 1.76 |
| Example 9 | A1-9 | M-9 | 15 | 14.5 | M'-4 M'-7 | 20 15 | 20.2 15.1 | M'-8 M'-3 | 30 20 | 30.1 20.1 | 75 | 7,400 | 1.52 |
| Example 10 | A1-10 | M-10 | 15 | 14.4 | M'-4 M'-7 | 20 15 | 20.1 15.2 | M'-8 M'-3 | 30 20 | 30.2 20.1 | 76 | 7,400 | 1.53 |
| Example 11 | A1-11 | M-11 | 15 | 14.5 | M'-4 M'-7 | 20 15 | 20.1 15.2 | M'-8 M'-3 | 30 20 | 30.1 20.1 | 75 | 7,300 | 1.53 |
| Example 12 | A1-12 | M-12 | 15 | 14.3 | M'-4 M'-7 | 20 15 | 20.2 15.2 | M'-8 M'-3 | 30 20 | 30.1 20.2 | 76 | 7,300 | 1.54 |
| Example 13 | A1-13 | M-13 | 10 | 9.6 | M'-9 | 50 | 50.3 | M'-10 | 40 | 40.1 | 76 | 7,400 | 1.53 |
| Example 14 | A1-14 | M-14 | 10 | 9.6 | M'-9 | 50 | 50.4 | M'-10 | 40 | 40.0 | 75 | 7,400 | 1.52 |
| Example 15 | A1-15 | M-15 | 10 | 9.4 | M'-9 | 50 | 50.3 | M'-10 | 40 | 40.3 | 77 | 7,300 | 1.53 |
| Example 16 | A1-16 | M-1 M-16 | 5 5 | 4.8 4.7 | M'-9 | 50 | 50.2 | M'-10 | 40 | 40.3 | 74 | 7,500 | 1.53 |
| Example 17 | A1-17 | M-1 M-17 | 10 5 | 9.6 4.4 | M'-9 | 50 | 50.6 | M'-10 | 35 | 40.4 | 75 | 7,400 | 1.54 |
| Example 18 | A1-18 | M-1 | 50 | 49.2 | M'-1 M'-11 | 20 20 | 20.2 20.3 | M'-10 | 10 | 10.3 | 74 | 7,300 | 1.55 |
| Example 19 | A1-19 | M-2 | 50 | 49.1 | M'-11 | 50 | 50.9 | — | — | — | 73 | 7,300 | 1.56 |
| Synthesis Example 18 | F-1 | — | — | — | M'-1 | 35 | 34.8 | M'-2 M'-3 | 45 20 | 45.1 20.1 | 76 | 7.500 | 1.52 | were mixed. Then, after the addition of 30 g of distilled water, the mixture was further stirred, and then allowed to stand for 30 min. Thereafter, the lower layer was collected to obtain a propylene glycol monomethyl ether acetate solution containing a polymer (A2-1) as a solid content (yield: 60%). The polymer (A2-1) had an Mw of 4,200 and an Mw/Mn of 1.62. In addition, the result of $^{13}$C-NMR analysis indicated that the proportions of the structural units derived from (M'-12) and (M-1) were respectively 30.7 mol % and 69.3 mol %.

Examples 21 to 36 and Synthesis Example 19

Polymers (A2-2) to (A2-17) and (E1-1) were synthesized by a similar operation to that of Example 20 except that the type and the amount of the monomers used were as shown in Table 2 below. The total mass of the monomers used was 100 g. The symbol "-" in Table 2 indicates that the corresponding monomer was not used.

added dropwise over 5 min using a dropping funnel, and the mixture was aged for 360 min. Thereafter, the mixture was cooled to 30° C. or below to obtain a polymerization reaction mixture. Then, the polymerization reaction mixture thus obtained was concentrated to 44 g, and then transferred to a separatory funnel. To this separatory funnel were charged 44 g of methanol and 220 g of n-hexane, and purification through liquid separation was carried out. After the separation, the lower layer liquid was collected. To the collected lower layer liquid was added 220 g of n-hexane, and purification through liquid separation was carried out. After the separation, the lower layer liquid was collected. The liquid phase of the collected lower layer liquid was replaced by 4-methyl-2-pentanol to obtain a solution containing a polymer (A3-1) as a solid content (yield: 72%). The polymer (A3-1) had an Mw of 10,000 and an Mw/Mn of 2.1. In addition, the result of $^{13}$C-NMR analysis indicated that

TABLE 2

| | (A2) Polymer/ (E1) polymer | Monomer that gives structural unit (I) | | | Monomer that gives structural unit (II) | | | Monomer that gives structural unit (V) | | | Yield (%) | Mw | Mw/ Mn |
|---|---|---|---|---|---|---|---|---|---|---|---|---|---|
| | | type | amount (mol %) | proportion of structural unit (mol %) | type | amount (mol %) | proportion of structural unit (mol %) | type | amount (mol %) | proportion of structural unit (mol %) | | | |
| Example 20 | A2-1 | M-1 | 70 | 69.3 | M'-12 | 30 | 30.7 | — | — | — | 60 | 4,200 | 1.62 |
| Example 21 | A2-2 | M-2 | 70 | 69.3 | M'-12 | 30 | 30.7 | — | — | — | 62 | 4,200 | 1.61 |
| Example 22 | A2-3 | M-3 | 70 | 69.1 | M'-12 | 30 | 30.9 | — | — | — | 61 | 4,300 | 1.59 |
| Example 23 | A2-4 | M-4 | 70 | 69.4 | M'-12 | 30 | 30.6 | — | — | — | 58 | 4,000 | 1.61 |
| Example 24 | A2-5 | M-5 | 70 | 69.2 | M'-12 | 30 | 30.8 | — | — | — | 60 | 4,200 | 1.62 |
| Example 25 | A2-6 | M-6 | 70 | 69.5 | M'-5 | 30 | 30.5 | — | — | — | 66 | 4,300 | 1.63 |
| Example 26 | A2-7 | M-7 | 70 | 69.4 | M'-5 | 30 | 30.6 | — | — | — | 65 | 4,400 | 1.62 |
| Example 27 | A2-8 | M-8 | 70 | 69.4 | M'-5 | 30 | 30.6 | — | — | — | 65 | 4,400 | 1,62 |
| Example 28 | A2-9 | M-9 | 70 | 69.6 | M'-14 | 30 | 30.4 | — | — | — | 65 | 4,500 | 1.63 |
| Example 29 | A2-10 | M-10 | 70 | 69.5 | M'-14 | 30 | 30.5 | — | — | — | 63 | 4,300 | 1.63 |
| Example 30 | A2-11 | M-11 | 70 | 69.5 | M'-15 | 30 | 30.5 | — | — | — | 64 | 4,400 | 1.62 |
| Example 31 | A2-12 | M-12 | 70 | 69.4 | M'-15 | 30 | 30.6 | — | — | — | 64 | 4,500 | 1.61 |
| Example 32 | A2-13 | M-13 | 50 | 49.5 | M'-4 | 40 | 40.6 | M'-16 | 10 | 9.9 | 65 | 4,500 | 1.63 |
| Example 33 | A2-14 | M-14 | 50 | 49.4 | M'-4 | 40 | 40.8 | M'-16 | 10 | 9.8 | 64 | 4,400 | 1.62 |
| Example 34 | A2-15 | M-15 | 45 | 44.7 | M'-4 | 35 | 35.5 | — | — | — | 63 | 4,300 | 1.63 |
| | | M-1 | 30 | 29.8 | | | | | | | | | |
| Example 35 | A2-16 | M-16 | 45 | 44.5 | M'-4 | 35 | 35.9 | — | — | — | 65 | 4,500 | 1.64 |
| | | M-2 | 30 | 29.6 | | | | | | | | | |
| Example 36 | A2-17 | M-17 | 45 | 44.3 | M'-4 | 35 | 36.2 | — | — | — | 62 | 4,400 | 1.63 |
| | | M-3 | 30 | 29.5 | | | | | | | | | |
| Synthesis Example 19 | E1-1 | — | — | — | M'-12 | 30 | 29.9 | M'-13 | 70 | 70.1 | 60 | 4,300 | 1.59 |

Synthesis of Polymer (A3) and Polymer (E2)

Example 37

A polymerization initiator solution was prepared by dissolving 0.79 g (5 mol % with respect to the total number of moles of the compounds) of dimethyl 2,2-azobis(2-methylpropionate) as a radical polymerization initiator in 0.7 g of 2-butanone. Separately, into a 200 mL three-neck flask equipped with a thermometer and a dropping funnel were charged 11.06 g (50 mol %) of the compound (M'-17), 8.94 g (50 mol %) of the compound (M-1), and 19.3 g of 2-butanone, and the contents of the flask were purged with nitrogen for 30 min. After purging with nitrogen, the contents of the flask were heated so as to reach 75° C. with stirring with a magnetic stirrer. Subsequently, the polymerization initiator solution prepared as described above was the proportions of the structural units derived from (M'-17) and (M-1) were respectively 50.2 mol %, 49.8 mol %.

Examples 38 to 53 and Synthesis Examples 20 and 21

Synthesis of Polymers (A3-2) to (A3-17), (E2-1) and (E2-2)

Polymers (A3-2) to (A3-17) and (E2-1) and (E2-2) were synthesized by a similar operation to that of Example 37 except that the type and the amount of the monomers used were as shown in Table 3 below. The total mass of the monomers used was 20 g. The symbol "-" in Table 3 indicates that the corresponding monomer was not used.

TABLE 3

| | (A3) Polymer/ (E2) polymer | Monomer that gives structural unit (I) | | | Monomer that gives structural unit (V) to (VII) | | Yield (%) | Mw | Mw/Mn |
|---|---|---|---|---|---|---|---|---|---|
| | | type | amount (mol %) | proportion of structural unit (mol %) | type | amount (mol %) | proportion of structural unit (mol %) | | | |
| Example 37 | A3-1 | M-1 | 50 | 49.8 | M'-17 | 50 | 50.2 | 72 | 10,000 | 2.00 |
| Example 38 | A3-2 | M-2 | 50 | 49.9 | M'-17 | 50 | 50.1 | 69 | 9,900 | 2.10 |
| Example 39 | A3-3 | M-3 | 50 | 49.7 | M'-17 | 50 | 50.3 | 68 | 9,900 | 2.20 |
| Example 40 | A3-4 | M-4 | 50 | 49.7 | M'-17 | 50 | 50.3 | 70 | 11,000 | 2.10 |
| Example 41 | A3-5 | M-5 | 50 | 49.9 | M'-17 | 50 | 50.1 | 71 | 10,000 | 1.90 |
| Example 42 | A3-6 | M-6 | 50 | 49.9 | M'-17 | 50 | 50.1 | 72 | 9,800 | 2.10 |
| Example 43 | A3-7 | M-7 | 50 | 50.1 | M'-17 | 50 | 49.9 | 72 | 9,900 | 2.00 |
| Example 44 | A3-8 | M-8 | 50 | 49.7 | M'-17 | 50 | 50.3 | 67 | 10,000 | 2.00 |
| Example 45 | A3-9 | M-9 | 50 | 50.3 | M'-17 | 50 | 49.7 | 69 | 11,000 | 2.10 |
| Example 46 | A3-10 | M-10 | 50 | 49.1 | M'-17 | 50 | 50.9 | 73 | 9,800 | 2.10 |
| Example 47 | A3-11 | M-11 | 50 | 49.4 | M'-17 | 50 | 50.6 | 74 | 9,900 | 2.10 |
| Example 48 | A3-12 | M-12 | 50 | 49.3 | M'-17 | 50 | 50.7 | 69 | 9,800 | 1.90 |
| Example 49 | A3-13 | M-13 | 50 | 50.1 | M'-17 | 50 | 49.9 | 70 | 10,000 | 2.00 |
| Example 50 | A3-14 | M-14 M-1 | 35 15 | 35.1 15.1 | M'-17 | 50 | 49.8 | 72 | 10,000 | 2.10 |
| Example 51 | A3-15 | M-15 | 50 | 49.8 | M'-17 | 50 | 50.2 | 68 | 9,800 | 1.90 |
| Example 52 | A3-16 | M-16 | 40 | 40.1 | M'-17 M'-16 | 50 10 | 50.0 9.9 | 66 | 9,900 | 2.00 |
| Example 53 | A3-17 | M-17 | 40 | 40.3 | M'-17 M'-16 | 50 10 | 49.6 10.1 | 68 | 9,900 | 2.10 |
| Synthesis Example 20 | E2-1 | — | — | — | M'-17 M'-18 | 50 50 | 50.5 49.5 | 73 | 10,100 | 2.10 |
| Synthesis Example 21 | E2-2 | — | — | — | M'-18 M'-19 | 85 15 | 97.9 2.1 | 78 | 10,000 | 1.70 |

Preparation of Resin Composition

The solvent (B), the acid generating agent (C), the acid diffusion control agent (D) and the localization accelerator (G) which were used in the preparation of resin compositions are shown below.

(B) Solvent

B-1: propylene glycol monomethyl ether acetate

B-2: cyclohexanone

B-3: 4-methyl-2-pentanol

B-4: diisoamyl ether (C) Acid Generating Agent

Each structure formula is shown below.

C-1: triphenylsulfonium 2-(adamantan-1-ylcarbonyloxy)-1,1,3,3,3-pentafluoropropane-1-sulfonate C-2: triphenylsulfonium norbornanesultone-2-yloxycarbonyl difluoromethanesulfonate C-3: triphenylsulfonium 3-(piperidin-1-ylsulfonyl)-1,1,2,2,3,3-hexafluoropropane-1-sulfonate C-4: triphenylsulfonium adamantan-1-yloxycarbonyl difluoromethanesulfonate

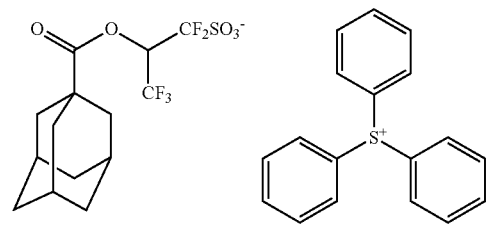

(C-1)

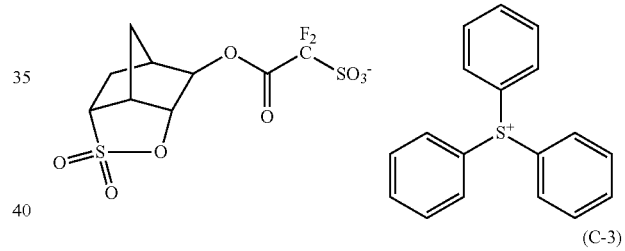

(C-2)

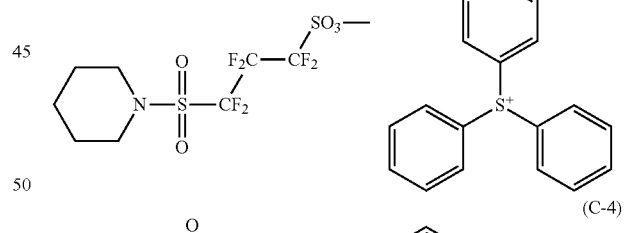

(C-3)

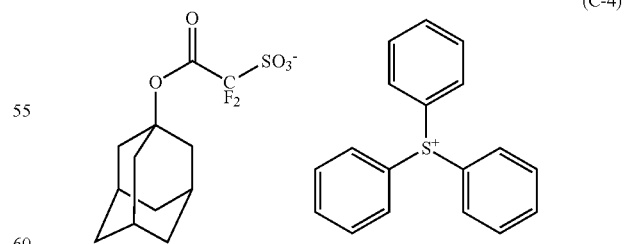

(C-4)

(D) Acid Diffusion Control Agent
Each structure formula is shown below.
D-1: triphenylsulfonium salicylate
D-2: triphenylsulfonium 10-camphorsulfonate
D-3: N-(n-undecan-1-ylcarbonyloxyethyl)morpholine
D-4: 2,6-di-i-propylaniline D-5: tri-n-pentylamine

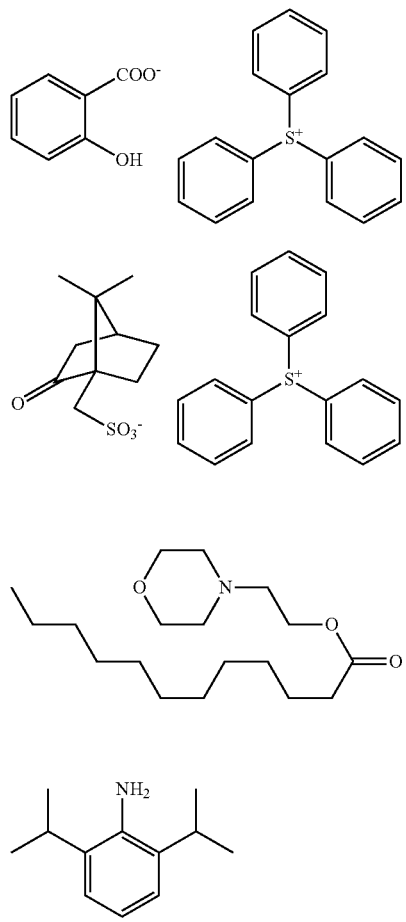

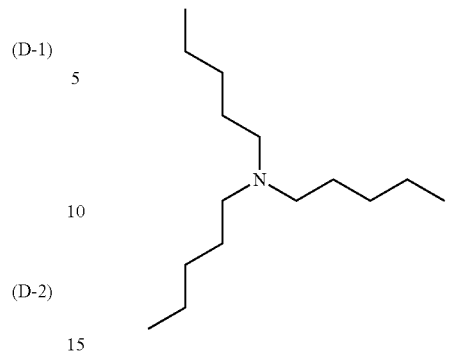

(G) Localization Accelerator
G-1: γ-butyrolactone

Preparation of Resin Composition (A) (Radiation-Sensitive Resin Composition)

Preparation of Resin Composition (J1): Resin Composition (A) for ArF Exposure Containing Polymer (A1) as Base Polymer Example 54

A resin composition (J1-1) was prepared by mixing 100 parts by mass of (A1-1) as the polymer (A1), 2,240 parts by mass of (B-1) and 960 parts by mass of (B-2) as the solvent (B), 8.5 parts by mass of (C-1) as the acid generating agent (C), 2.3 parts by mass of (D-1) as the acid diffusion control agent (D), 3 parts by mass of (E1-1) as the polymer (E), and 30 parts by mass of (G-1) as the localization accelerator (G), followed by filtration through a membrane filter having a pore size of 0.2 μm.

Examples 55 to 74 and Comparative Example 1

Resin compositions (J1-2) to (J1-21) and (CJ1-1) were prepared by a similar operation to that of Example 54 except that the type and the content of each component used were as shown in Table 4 below.

TABLE 4

| | Resin composition (I) | (A1) Component type | content (parts by mass) | (B) Solvent type | content (parts by mass) | (C) Acid generating agent type | content (parts by mass) | (D) Acid diffusion control agent type | content (parts by mass) | (E) Polymer type | content (parts by mass) | (G) Localization accelerator type | content (parts by mass) |
|---|---|---|---|---|---|---|---|---|---|---|---|---|---|
| Example 54 | J1-1 | A1-1 | 100 | B-1/B-2 | 2,240/960 | C-1 | 8.5 | D-1 | 2.3 | E1-1 | 3 | G-1 | 30 |
| Example 55 | J1-2 | A1-2 | 100 | B-1/B-2 | 2,240/960 | C-2 | 8.5 | D-2 | 2.3 | E1-1 | 3 | G-1 | 30 |
| Example 56 | J1-3 | A1-3 | 100 | B-1/B-2 | 2,240/960 | C-3 | 8.5 | D-3 | 2.3 | E1-1 | 3 | G-1 | 30 |
| Example 57 | J1-4 | A1-4 | 100 | B-1/B-2 | 2,240/960 | C-4 | 8.5 | D-4 | 2.3 | E1-1 | 3 | G-1 | 30 |
| Example 58 | J1-5 | A1-5 | 100 | B-1/B-2 | 2,240/960 | C-1 | 8.5 | D-5 | 2.3 | E1-1 | 3 | G-1 | 30 |
| Example 59 | J1-6 | A1-6 | 100 | B-1/B-2 | 2,240/960 | C-2 | 8.5 | D-1 | 2.3 | E1-1 | 3 | G-1 | 30 |
| Example 60 | J1-7 | A1-7 | 100 | B-1/B-2 | 2,240/960 | C-3 | 8.5 | D-2 | 2.3 | E1-1 | 3 | G-1 | 30 |
| Example 61 | J1-8 | A1-8 | 100 | B-1/B-2 | 2,240/960 | C-4 | 8.5 | D-3 | 2.3 | E1-1 | 3 | G-1 | 30 |
| Example 62 | J1-9 | A1-9 | 100 | B-1/B-2 | 2,240/960 | C-1 | 8.5 | D-4 | 2.3 | E1-1 | 3 | G-1 | 30 |
| Example 63 | J1-10 | A1-10 | 100 | B-1/B-2 | 2,240/960 | C-2 | 8.5 | D-5 | 2.3 | E1-1 | 3 | G-1 | 30 |
| Example 64 | J1-11 | A1-11 | 100 | B-1/B-2 | 2,240/960 | C-3 | 8.5 | D-1 | 2.3 | E1-1 | 3 | G-1 | 30 |
| Example 65 | J1-12 | A1-12 | 100 | B-1/B-2 | 2,240/960 | C-4 | 8.5 | D-2 | 2.3 | E1-1 | 3 | G-1 | 30 |
| Example 66 | J1-13 | A1-13 | 100 | B-1/B-2 | 2,240/960 | C-1 | 8.5 | D-3 | 2.3 | E1-1 | 3 | G-1 | 30 |
| Example 67 | J1-14 | A1-14 | 100 | B-1/B-2 | 2,240/960 | C-2 | 8.5 | D-4 | 2.3 | E1-1 | 3 | G-1 | 30 |
| Example 68 | J1-15 | A1-15 | 100 | B-1/B-2 | 2,240/960 | C-3 | 8.5 | D-5 | 2.3 | E1-1 | 3 | G-1 | 30 |
| Example 69 | J1-16 | A1-16 | 100 | B-1/B-2 | 2,240/960 | C-4 | 8.5 | D-1 | 2.3 | E1-1 | 3 | G-1 | 30 |
| Example 70 | J1-17 | A1-17 | 100 | B-1/B-2 | 2,240/960 | C-1 | 8.5 | D-2 | 2.3 | E1-1 | 3 | G-1 | 30 |
| Example 71 | J1-18 | A1-18 | 100 | B-1/B-2 | 2,240/960 | C-2 | 8.5 | D-3 | 2.3 | E1-1 | 3 | G-1 | 30 |
| Example 72 | J1-19 | A1-19 | 100 | B-1/B-2 | 2,240/960 | C-3 | 8.5 | D-4 | 2.3 | E1-1 | 3 | G-1 | 30 |
| Example 73 | J1-20 | A1-1 | 100 | B-1/B-2 | 2,240/960 | C-1 C-2 | 4.0 4.5 | D-1 | 2.3 | E1-1 | 3 | G-1 | 30 |

TABLE 4-continued

| | Resin composition (I) | (A1) Component type | content (parts by mass) | (B) Solvent type | content (parts by mass) | (C) Acid generating agent type | content (parts by mass) | (D) Acid diffusion control agent type | content (parts by mass) | (E) Polymer type | content (parts by mass) | (G) Localization accelerator type | content (parts by mass) |
|---|---|---|---|---|---|---|---|---|---|---|---|---|---|
| Example 74 | J1-21 | A1-1 | 50 | B-1/B-2 | 2,240/960 | C-4 | 8.5 | D-1 | 1.1 | E1-1 | 3 | G-1 | 30 |
| | | A1-17 | 50 | | | | | D-2 | 1.2 | | | | |
| Comparative Example 1 | CJ1-1 | F-1 | 100 | B-1/B-2 | 2,240/960 | C-1 | 8.5 | D-1 | 2.3 | E1-1 | 3 | G-1 | 30 |

Preparation of Resin Composition (J1'): Resin Composition (A) for Exposure to EUV or Electron Beam Containing Polymer (A1) as Base Polymer Example 75

A resin composition (J1'-1) was prepared by mixing 100 parts by mass of (A1-1) as the polymer (A1), 4,280 parts by mass of (B-1) and 1,830 parts by mass of (B-2) as the solvent (B), 20 parts by mass of (C-1) as the acid generating agent (C), and 3.6 parts by mass of (D-1) as the acid diffusion control agent (D), followed by filtration through a membrane filter having a pore size of 0.2 μm.

Examples 76 to 95 and Comparative Example 2

Resin compositions (J1'-1) to (J1'-21) and (CJ1'-1) were prepared by a similar operation to that of Example 75 except that the type and the content of is each component used were as shown in Table 5 below.

Preparation of Resin Composition (J2): Resin Composition (A) Containing Polymer (A2) as Water Repellent Polymer Additive Example 96

A resin composition (J2-1) was prepared by mixing 3 parts by mass of (A2-1) as the polymer (A2), 2,240 parts by mass of (B-1) and 960 parts by mass of (B-2) as the solvent (B), 8.5 parts by mass of (C-1) as the acid generating agent (C), 2.3 parts by mass of (D-1) as the acid diffusion control agent (D), 100 parts by mass of (F-1) as the polymer (F), and 30 parts by mass of (G-1) as the localization accelerator (G), followed by filtration through a membrane filter having a pore size of 0.2 μm.

TABLE 5

| | Resin composition (I) | (A1) Component type | content (parts by mass) | (B) Solvent type | content (parts by mass) | (C) Acid generating agent type | content (parts by mass) | (D) Acid diffusion control agent type | content (parts by mass) |
|---|---|---|---|---|---|---|---|---|---|
| Example 75 | J1'-1 | A1-1 | 100 | B-1/B-2 | 4,280/1,830 | C-1 | 20 | D-1 | 3.6 |
| Example 76 | J1'-2 | A1-2 | 100 | B-1/B-2 | 4,280/1,830 | C-2 | 20 | D-2 | 3.6 |
| Example 77 | J1'-3 | A1-3 | 100 | B-1/B-2 | 4,280/1,830 | C-3 | 20 | D-3 | 3.6 |
| Example 78 | J1'-4 | A1-4 | 100 | B-1/B-2 | 4,280/1,830 | C-4 | 20 | D-4 | 3.6 |
| Example 79 | J1'-5 | A1-5 | 100 | B-1/B-2 | 4,280/1,830 | C-1 | 20 | D-5 | 3.6 |
| Example 80 | J1'-6 | A1-6 | 100 | B-1/B-2 | 4,280/1,830 | C-2 | 20 | D-1 | 3.6 |
| Example 81 | J1'-7 | A1-7 | 100 | B-1/B-2 | 4,280/1,830 | C-3 | 20 | D-2 | 3.6 |
| Example 82 | J1'-8 | A1-8 | 100 | B-1/B-2 | 4,280/1,830 | C-4 | 20 | D-3 | 3.6 |
| Example 83 | J1'-9 | A1-9 | 100 | B-1/B-2 | 4,280/1,830 | C-1 | 20 | D-4 | 3.6 |
| Example 84 | J1'-10 | A1-10 | 100 | B-1/B-2 | 4,280/1,830 | C-2 | 20 | D-5 | 3.6 |
| Example 85 | J1'-11 | A1-11 | 100 | B-1/B-2 | 4,280/1,830 | C-3 | 20 | D-1 | 3.6 |
| Example 86 | J1'-12 | A1-12 | 100 | B-1/B-2 | 4,280/1,830 | C-4 | 20 | D-2 | 3.6 |
| Example 87 | J1'-13 | A1-13 | 100 | B-1/B-2 | 4,280/1,830 | C-1 | 20 | D-3 | 3.6 |
| Example 88 | J1'-14 | A1-14 | 100 | B-1/B-2 | 4,280/1,830 | C-2 | 20 | D-4 | 3.6 |
| Example 89 | J1'-15 | A1-15 | 100 | B-1/B-2 | 4,280/1,830 | C-3 | 20 | D-5 | 3.6 |
| Example 90 | J1'-16 | A1-16 | 100 | B-1/B-2 | 4,280/1,830 | C-4 | 20 | D-1 | 3.6 |
| Example 91 | J1'-17 | A1-17 | 100 | B-1/B-2 | 4,280/1,830 | C-1 | 20 | D-2 | 3.6 |
| Example 92 | J1'-18 | A1-18 | 100 | B-1/B-2 | 4,280/1,830 | C-2 | 20 | D-3 | 3.6 |
| Example 93 | J1'-19 | A1-19 | 100 | B-1/B-2 | 4,280/1,830 | C-3 | 20 | D-4 | 3.6 |
| Example 94 | J1'-20 | A1-1 | 100 | B-1/B-2 | 4,280/1,830 | C-1 | 10 | D-1 | 3.6 |
| | | | | | | C-2 | 10 | | |
| Example 95 | J1'-21 | A1-1 | 50 | B-1/B-2 | 4,280/1,830 | C-4 | 20 | D-1 | 1.8 |
| | | A1-17 | 50 | | | | | D-2 | 1.8 |
| Comparative Example 2 | CJ1'-1 | F-1 | 100 | B-1/B-2 | 4,280/1,830 | C-1 | 20 | D-1 | 3.6 |

Examples 97 to 112 and Comparative Example 3

Resin compositions (J2-2) to (J2-17) and (CJ2-1) were prepared by a similar operation to that of Example 96 except that the type and the content of each component used were as shown in Table 6 below.

except that the type and the content of each component used were as shown in Table 7 below.

Preparation of Radiation-Sensitive Resin Composition for Use in Combination with Resin Composition (B) (Resin Composition for Forming Protective Film for Liquid Immersion Lithography)

TABLE 6

| | Resin composition (II) | (A2) Component type | content (parts by mass) | (B) Solvent type | content (parts by mass) | (C) Acid generating agent type | content (parts by mass) | (D) Acid diffusion control agent type | content (parts by mass) | (F) Polymer type | content (parts by mass) | (G) Localization accelerator type | content (parts by mass) |
|---|---|---|---|---|---|---|---|---|---|---|---|---|---|
| Example 96 | J2-1 | A2-1 | 3 | B-1/B-2 | 2,240/960 | C-1 | 8.5 | D-1 | 2.3 | F-1 | 100 | G-1 | 30 |
| Example 97 | J2-2 | A2-2 | 3 | B-1/B-2 | 2,240/960 | C-1 | 8.5 | D-1 | 2.3 | F-1 | 100 | G-1 | 30 |
| Example 98 | J2-3 | A2-3 | 3 | B-1/B-2 | 2,240/960 | C-1 | 8.5 | D-1 | 2.3 | F-1 | 100 | G-1 | 30 |
| Example 99 | J2-4 | A2-4 | 3 | B-1/B-2 | 2,240/960 | C-1 | 8.5 | D-1 | 2.3 | F-1 | 100 | G-1 | 30 |
| Example 100 | J2-5 | A2-5 | 3 | B-1/B-2 | 2,240/960 | C-1 | 8.5 | D-1 | 2.3 | F-1 | 100 | G-1 | 30 |
| Example 101 | J2-6 | A2-6 | 3 | B-1/B-2 | 2,240/960 | C-1 | 8.5 | D-1 | 2.3 | F-1 | 100 | G-1 | 30 |
| Example 102 | J2-7 | A2-7 | 3 | B-1/B-2 | 2,240/960 | C-1 | 8.5 | D-1 | 2.3 | F-1 | 100 | G-1 | 30 |
| Example 103 | J2-8 | A2-8 | 3 | B-1/B-2 | 2,240/960 | C-1 | 8.5 | D-1 | 2.3 | F-1 | 100 | G-1 | 30 |
| Example 104 | J2-9 | A2-9 | 3 | B-1/B-2 | 2,240/960 | C-1 | 8.5 | D-1 | 2.3 | F-1 | 100 | G-1 | 30 |
| Example 105 | J2-10 | A2-10 | 3 | B-1/B-2 | 2,240/960 | C-1 | 8.5 | D-1 | 2.3 | F-1 | 100 | G-1 | 30 |
| Example 106 | J2-11 | A2-11 | 3 | B-1/B-2 | 2,240/960 | C-1 | 8.5 | D-1 | 2.3 | F-1 | 100 | G-1 | 30 |
| Example 107 | J2-12 | A2-12 | 3 | B-1/B-2 | 2,240/960 | C-1 | 8.5 | D-1 | 2.3 | F-1 | 100 | G-1 | 30 |
| Example 108 | J2-13 | A2-13 | 3 | B-1/B-2 | 2,240/960 | C-1 | 8.5 | D-1 | 2.3 | F-1 | 100 | G-1 | 30 |
| Example 109 | J2-14 | A2-14 | 3 | B-1/B-2 | 2,240/960 | C-1 | 8.5 | D-1 | 2.3 | F-1 | 100 | G-1 | 30 |
| Example 110 | J2-15 | A2-15 | 3 | B-1/B-2 | 2,240/960 | C-1 | 8.5 | D-1 | 2.3 | F-1 | 100 | G-1 | 30 |
| Example 111 | J2-16 | A2-16 | 3 | B-1/B-2 | 2,240/960 | C-1 | 8.5 | D-1 | 2.3 | F-1 | 100 | G-1 | 30 |
| Example 112 | J2-17 | A2-17 | 3 | B-1/B-2 | 2,240/960 | C-1 | 8.5 | D-1 | 2.3 | F-1 | 100 | G-1 | 30 |
| Comparative Example 3 | CJ2-1 | E1-1 | 3 | B-1/B-2 | 2,240/960 | C-1 | 8.5 | D-1 | 2.3 | F-1 | 100 | G-1 | 30 |

Preparation of Resin Composition (B) (Resin Composition for Forming Protective Film for Liquid Immersion Lithography)

Preparation of Resin Composition (J3): Resin Composition (B) Containing Polymer (A3)

Example 113

A resin composition (J3-1) was prepared by mixing 50 parts by mass of (A3-1) as the polymer (A3), 1,000 parts by mass of (B-3) and 4,000 parts by mass of (B-4) as the solvent (B), and 50 parts by mass of (E2-2) as the polymer (E), followed by filtration through a membrane filter having a pore size of 0.2 μm.

Examples 114 to 129 and Comparative Example 4

Resin compositions (J3-2) to (J3-17) and (CJ3-17) were prepared by a similar operation to that of Example 113

Synthesis Example 22

A radiation-sensitive resin composition (a) was prepared by mixing 100 parts by mass of (F-1) as the polymer (F), 2,240 parts by mass of (B-1) and 960 parts by mass of (B-2) as the solvent (B), 8.5 parts by mass of (C-1) as the acid generating agent (C), and 2.3 parts by mass of (D-1) as the acid diffusion control agent (D), followed by filtration through a membrane filter having a pore size of 0.2 μm.

TABLE 7

| | Resin composition (III) | (A3) Component type | content (parts by mass) | (B) Solvent type | content (parts by mass) | (E2) Polymer type | content (parts by mass) |
|---|---|---|---|---|---|---|---|
| Example 113 | J3-1 | A3-1 | 50 | B-3/B-4 | 1,000/4,000 | E2-2 | 50 |
| Example 114 | J3-2 | A3-2 | 50 | B-3/B-4 | 1,000/4,000 | E2-2 | 50 |
| Example 115 | J3-3 | A3-3 | 50 | B-3/B-4 | 1,000/4,000 | E2-2 | 50 |
| Example 116 | J3-4 | A3-4 | 50 | B-3/B-4 | 1,000/4,000 | E2-2 | 50 |
| Example 117 | J3-5 | A3-5 | 50 | B-3/B-4 | 1,000/4,000 | E2-2 | 50 |
| Example 118 | J3-6 | A3-6 | 50 | B-3/B-4 | 1,000/4,000 | E2-2 | 50 |
| Example 119 | J3-7 | A3-7 | 50 | B-3/B-4 | 1,000/4,000 | E2-2 | 50 |
| Example 120 | J3-8 | A3-8 | 50 | B-3/B-4 | 1,000/4,000 | E2-2 | 50 |
| Example 121 | J3-9 | A3-9 | 50 | B-3/B-4 | 1,000/4,000 | E2-2 | 50 |

TABLE 7-continued

|  | Resin composition (III) | (A3) Component | | (B) Solvent | | (E2) Polymer | |
|---|---|---|---|---|---|---|---|
|  |  | type | content (parts by mass) | type | content (parts by mass) | type | content (parts by mass) |
| Example 122 | J3-10 | A3-10 | 50 | B-3/B-4 | 1,000/4,000 | E2-2 | 50 |
| Example 123 | J3-11 | A3-11 | 50 | B-3/B-4 | 1,000/4,000 | E2-2 | 50 |
| Example 124 | J3-12 | A3-12 | 50 | B-3/B-4 | 1,000/4,000 | E2-2 | 50 |
| Example 125 | J3-13 | A3-13 | 50 | B-3/B-4 | 1,000/4,000 | E2-2 | 50 |
| Example 126 | J3-14 | A3-14 | 50 | B-3/B-4 | 1,000/4,000 | E2-2 | 50 |
| Example 127 | J3-15 | A3-15 | 50 | B-3/B-4 | 1,000/4,000 | E2-2 | 50 |
| Example 128 | J3-16 | A3-16 | 50 | B-3/B-4 | 1,000/4,000 | E2-2 | 50 |
| Example 129 | J3-17 | A3-17 | 50 | B-3/B-4 | 1,000/4,000 | E2-2 | 50 |
| Comparative Example 4 | CJ3-1 | E2-1 | 50 | B-3/B-4 | 1,000/4,000 | E2-2 | 50 |

Formation of Resist Pattern

Formation of Resist Pattern Using Resin Composition (A) by ArF Exposure

Formation of Resist Pattern (1)

An underlayer antireflective film having a film thickness of 105 nm was formed on the surface of a 12-inch silicon wafer by applying a composition for forming an underlayer antireflective film ("ARC66" available from Brewer Science) on the surface of the 12-inch silicon wafer using a spin-coater ("CLEAN TRACK ACT12" available from Tokyo Electron Limited), and thereafter heating the composition at 205° C. for 60 sec. The resin composition (A) prepared as described above was applied on the underlayer antireflective film using the spin-coater, and subjected to PB at 90° C. for 60 sec. Thereafter, cooling was carried out at 23° C. for 30 sec to form a resist film having a film is thickness of 90 nm. Next, the resist film was exposed using an ArF excimer laser Immersion Scanner ("NSR-S610C" available from NIKON) through a 40 nm line-and-space (1L1S) mask pattern, under optical conditions involving NA of 1.3 and dipole (Sigma: 0.977/0.782). After the exposure, PEB was carried out at 90° C. for 60 sec. Thereafter, a development was carried out with a 2.38% by mass aqueous TMAH solution as an alkaline developer solution, followed by washing with water and drying to form a positive resist pattern. In this resist pattern formation, an exposure dose at which a 1:1 line-and-space with a line width of 40 nm was formed through a mask for a 1:1 line-and-space with a target dimension of 40 nm was defined as "optimum exposure dose (Eop)".

Formation of Resist Pattern (2)

A negative resist pattern was formed by a similar operation to that of the Formation of Resist Pattern (1) described above except that: n-butyl acetate was used in place of the aqueous TMAH solution used in Formation of Resist Pattern (1) described above to execute a development with an organic solvent; and washing with water was not carried out.

Formation of Resist Pattern Using Resin Composition (A) by Exposure to Electron Beam Formation of Resist Pattern (3)

The resin composition (A) prepared as described above was applied on the surface of an 8-inch silicon wafer using a spin-coater ("CLEAN TRACK ACT8" available from Tokyo Electron Limited), and subjected to PB at 90° C. for 60 sec. Thereafter, cooling was carried out at 23° C. for 30 sec to form a resist film having a film thickness of 50 nm. Next, this resist film was irradiated with an electron beam using a simplified electron beam writer ("HL800D" available from Hitachi, Ltd.; output: 50 KeV, electric current density: 5.0 A/cm$^2$). After the irradiation, PEB was carried out at 120° C. for 60 sec. Thereafter, a development was carried out using a 2.38% by mass aqueous TMAH solution as an alkaline developer solution at 23° C. for 30 sec, followed by washing with water and drying to form a positive resist pattern.

Formation of Resist Pattern (4)

A negative resist pattern was formed by a similar operation to that of the Formation of Resist Pattern (3) described above except that: n-butyl acetate was used in place of the aqueous TMAH solution used in the Formation of Resist Pattern (3) described above to execute a development with an organic solvent; and washing with water was not carried out.

Formation of Resist Pattern Using Resin Composition (B) by ArF Exposure

Formation of Resist Pattern (5)

An underlayer antireflective film having a film thickness of 105 nm was formed on the surface of a 12-inch silicon wafer by applying a composition for forming an underlayer antireflective film ("ARC66" available from Brewer Science) on the surface of the 12-inch silicon wafer using a spin-coater ("CLEAN TRACK ACT12" available from Tokyo Electron Limited), and thereafter heating the composition at 205° C. for 60 sec. The radiation-sensitive resin composition (a) prepared as described above was applied on the underlayer antireflective film using the spin-coater, and subjected to PB at 90° C. for 60 sec. Thereafter, cooling was carried out at 23° C. for 30 sec to form a resist film having a film thickness of 90 nm. Next, the composition (B) prepared as described above resin was applied on the resist film followed by PB at 90° C. for 60 sec to form a resist upper layer film having a film thickness of 30 nm. Next, the resist film was exposed using an ArF excimer laser Immersion Scanner ("NSR-S610C" available from NIKON) through a 40 nm line-and-space (1L1S) mask pattern, under optical conditions involving NA of 1.3 and dipole (Sigma: 0.977/0.782). After the exposure, PEB was carried out at 90° C. for 60 sec. Thereafter, a development was carried out with a 2.38% by mass aqueous TMAH solution as an alkaline developer solution, followed by washing with water and drying to form a positive resist pattern. In this resist pattern formation, an exposure dose at which a 1:1 line-and-space with a line width of 40 nm was formed through a mask for a 1:1 line-and-space with a target dimension of 40 nm was defined as "optimum exposure dose (Eop)".

Evaluations

Determinations were carried out on the resist patterns formed using the resin compositions as described above in accordance with the following methods to evaluate the resin compositions in terms of an LWR performance, a CDU performance, a resolution, rectangularity of cross-sectional shape, a depth of focus and exposure latitude. The results of the evaluations are shown in Tables 8 to 11. For a line-width measurement of the resist patterns, a scanning electron microscope ("S-9380" available from Hitachi High-Technologies Corporation) was used. It is to be noted that comparisons were made with, as decision criteria of the LWR performance, the CDU performance, the resolution, the depth of focus and the exposure latitude: Comparative Example 1 for Examples 54 to 74; Comparative Example 2 for Examples 75 to 95; Comparative Example 3 for Examples 96 to 112; and Comparative Example 4 for Examples 113 to 129.

LWR Performance

The resist pattern formed through an irradiation at the exposure dose of the Eop was observed from above the pattern using the scanning electron microscope. The line width was measured at arbitrary points of 50 in total, then a 3 Sigma value was determined from the distribution of the measurements, and the value was designated as "LWR performance". The smaller value is more favorable since a better LWR performance is indicated, revealing a less irregularity. By comparing the "LWR performance" with that for the Comparative Example which served as a control, the LWR performance was evaluated to be: "A" (favorable) in the case of an improvement by no less than 10% being found (i.e., the "LWR performance" value accounting for no greater than 90% of the value for the criterion Comparative Example); and "B" (unfavorable) in the case of an improvement by less than 10% being found (i.e., the "LWR performance" value accounting for greater than 90%).

CDU Performance

The resist pattern formed through an irradiation at the exposure dose of the Eop was observed from above the pattern using the scanning electron microscope. The line width was measured at 20 points within the range of 400 nm, and an averaged value of the width was determined. The averaged value was determined at arbitrary points of 500 in total, and a 3 Sigma value was determined from the distribution of the averaged values. The 3 Sigma value was defined as CDU performance. The smaller value is more favorable since a better CDU performance is indicated, revealing a less variance of the line widths even in cases of sparse patterns. By comparing the "CDU performance" with that for the Comparative Example which served as a control, the CDU performance was evaluated to be: "A" (favorable) in the case of an improvement by no less than 10% being found (i.e., the "CDU performance" value accounting for no greater than 90% of of the value for the criterion Comparative Example); and "B" (unfavorable) in the case of an improvement by less than 10% being found (i.e., the "CDU performance" value accounting for greater than 90%).

Resolution

A dimension of the minimum resist pattern which was resolved through an irradiation at the exposure dose of the Eop was measured, and the measurement value was designated as "resolution". The smaller value is more favorable since a better resolution is indicated, revealing that a finer pattern can be formed. By comparing the "resolution" with that for the Comparative Example which served as a control, the resolution was evaluated to be: "A" (favorable) in the case of an improvement by no less than 10% being found (i.e., the "resolution" value accounting for no greater than 90% of the value for the criterion Comparative Example); and "B" (unfavorable) in the case of an improvement by less than 10% being found (i.e., the "resolution" value accounting for 90%).

Rectangularity of Cross-Sectional Shape

The cross-sectional shape of the resist pattern which was resolved through an irradiation at the exposure dose of the Eop was observed, and a line width Lb in the middle portion of the resist pattern along the height direction, and a line width La on the top of the resist pattern were measured. The value closer to 1 is more favorable since better "rectangularity of cross-sectional shape" is indicated, revealing a more rectangular resist pattern. The rectangularity of cross-sectional shape was evaluated to be: "A" (favorable) in a case where $0.9 \leq (La/Lb) \leq 1.1$; and "B" (unfavorable) in a case where $(La/Lb)<0.9$ or $1.1<(La/Lb)$.

Depth of Focus

On the resist pattern which was resolved through an irradiation at the exposure dose of the Eop, the dimension of a pattern formed when the focus was shifted along the depth direction was observed, a latitude in the depth direction in which the pattern dimension falls within the range of 90% to 110% of the basis without being accompanied by a bridge and/or residue was determined, and the measurement value was defined as "depth of focus". The greater depth of focus indicates a less variation of the dimension of the resulting pattern with the shift of the position of the focal point, leading to a higher process yield in the production of devices. By comparing the "depth of focus" with that for the Comparative Example, the depth of focus was evaluated to be:

"A" (favorable) in the case of an improvement by no less than 10% being found (i.e., the "depth of focus" value accounting for no less than 110% of the value for the criterion Comparative Example); and "B" (unfavorable) in the case of an improvement by less than 10% being found (i.e., the "depth of focus" value accounting for less than 110%).

Exposure Latitude

An exposure dose was varied in step of 1 mJ/cm$^2$ within an exposure dose range including the Eop, and a resist pattern was formed at each exposure dose. The line width of each resist pattern was measured using the scanning electron microscope. The exposure dose E (44) at which the line width of 44 nm was attained and the exposure dose E (36) at which the line width of 36 nm was attained were determined from the relationship between the line width obtained and the exposure dose, and the exposure latitude (%) was calculated using the following equation: exposure latitude= [E(36)−E(44)]×100/(optimum exposure dose). The greater "exposure latitude" value indicates a less variation of the dimension of the formed pattern with a variation of the exposure dose, leading to a higher process yield in the production of devices. By comparing the "exposure latitude" with that for the Comparative Example, the exposure latitude was evaluated to be: "A" (favorable) in the case of an improvement by no less than 10% being found (i.e., the "exposure latitude" value accounting for no less than 110% of of the value for the criterion Comparative Example); and "B" (unfavorable) in the case of an improvement by less than 10% being found (i.e., the "exposure latitude" value accounting for less than 110%).

TABLE 8

| | Resin composition (I) | Development with alkali | | | | | | Development with organic solvent | | | | | |
|---|---|---|---|---|---|---|---|---|---|---|---|---|---|
| | | LWR performance | CDU performance | Resolution | Rectangularity of cross-sectional shape | depth of focus | Exposure latitude | LWR performance | CDU performance | Resolution | Rectangularity of cross-sectional shape | depth of focus | Exposure latitude |
| Example 54 | J1-1 | A | A | A | A | A | A | A | A | A | A | A | A |
| Example 55 | J1-2 | A | A | A | A | A | A | A | A | A | A | A | A |
| Example 56 | J1-3 | A | A | A | A | A | A | A | A | A | A | A | A |
| Example 57 | J1-4 | A | A | A | A | A | A | A | A | A | A | A | A |
| Example 58 | J1-5 | A | A | A | A | A | A | A | A | A | A | A | A |
| Example 59 | J1-6 | A | A | A | A | A | A | A | A | A | A | A | A |
| Example 60 | J1-7 | A | A | A | A | A | A | A | A | A | A | A | A |
| Example 61 | J1-8 | A | A | A | A | A | A | A | A | A | A | A | A |
| Example 62 | J1-9 | A | A | A | A | A | A | A | A | A | A | A | A |
| Example 63 | J1-10 | A | A | A | A | A | A | A | A | A | A | A | A |
| Example 64 | J1-11 | A | A | A | A | A | A | A | A | A | A | A | A |
| Example 65 | J1-12 | A | A | A | A | A | A | A | A | A | A | A | A |
| Example 66 | J1-13 | A | A | A | A | A | A | A | A | A | A | A | A |
| Example 67 | J1-14 | A | A | A | A | A | A | A | A | A | A | A | A |
| Example 68 | J1-15 | A | A | A | A | A | A | A | A | A | A | A | A |
| Example 69 | J1-16 | A | A | A | A | A | A | A | A | A | A | A | A |
| Example 70 | J1-17 | A | A | A | A | A | A | A | A | A | A | A | A |
| Example 71 | J1-18 | A | A | A | A | A | A | A | A | A | A | A | A |
| Example 72 | J1-19 | A | A | A | A | A | A | A | A | A | A | A | A |
| Example 73 | J1-20 | A | A | A | A | A | A | A | A | A | A | A | A |
| Example 74 | J1-21 | A | A | A | A | A | A | A | A | A | A | A | A |
| Comparative Example 1 | CJ1-1 | — | — | — | B | — | — | — | — | — | B | — | — |

TABLE 9

| | Resin composition (I) | Development with alkali | | | | | | Development with organic solvent | | | | | |
|---|---|---|---|---|---|---|---|---|---|---|---|---|---|
| | | LWR performance | CDU performance | Resolution | Rectangularity of cross-sectional shape | depth of focus | Exposure latitude | LWR performance | CDU performance | Resolution | Rectangularity of cross-sectional shape | depth of focus | Exposure latitude |
| Example 75 | J1'-1 | A | A | A | A | A | A | A | A | A | A | A | A |
| Example 76 | J1'-2 | A | A | A | A | A | A | A | A | A | A | A | A |
| Example 77 | J1'-3 | A | A | A | A | A | A | A | A | A | A | A | A |
| Example 78 | J1'-4 | A | A | A | A | A | A | A | A | A | A | A | A |
| Example 79 | J1'-5 | A | A | A | A | A | A | A | A | A | A | A | A |
| Example 80 | J1'-6 | A | A | A | A | A | A | A | A | A | A | A | A |
| Example 81 | J1'-7 | A | A | A | A | A | A | A | A | A | A | A | A |
| Example 82 | J1'-8 | A | A | A | A | A | A | A | A | A | A | A | A |
| Example 83 | J1'-9 | A | A | A | A | A | A | A | A | A | A | A | A |
| Example 84 | J1'-10 | A | A | A | A | A | A | A | A | A | A | A | A |
| Example 85 | J1'-11 | A | A | A | A | A | A | A | A | A | A | A | A |
| Example 86 | J1'-12 | A | A | A | A | A | A | A | A | A | A | A | A |
| Example 87 | J1'-13 | A | A | A | A | A | A | A | A | A | A | A | A |
| Example 88 | J1'-14 | A | A | A | A | A | A | A | A | A | A | A | A |
| Example 89 | J1'-15 | A | A | A | A | A | A | A | A | A | A | A | A |
| Example 90 | J1'-16 | A | A | A | A | A | A | A | A | A | A | A | A |
| Example 91 | J1'-17 | A | A | A | A | A | A | A | A | A | A | A | A |
| Example 92 | J1'-18 | A | A | A | A | A | A | A | A | A | A | A | A |
| Example 93 | J1'-19 | A | A | A | A | A | A | A | A | A | A | A | A |
| Example 94 | J1'-20 | A | A | A | A | A | A | A | A | A | A | A | A |
| Example 95 | J1'-21 | A | A | A | A | A | A | A | A | A | A | A | A |
| Comparative Example 2 | CJ1'-1 | — | — | — | B | — | — | — | — | — | B | — | — |

TABLE 10

| | Resin composition (II) | Development with alkali | | | | | | Development with organic solvent | | | | | |
|---|---|---|---|---|---|---|---|---|---|---|---|---|---|
| | | LWR performance | CDU performance | Resolution | Rectangularity of cross-sectional shape | depth of focus | Exposure latitude | LWR performance | CDU performance | Resolution | Rectangularity of cross-sectional shape | depth of focus | Exposure latitude |
| Example 96 | J2-1 | A | A | A | A | A | A | A | A | A | A | A | A |
| Example 97 | J2-2 | A | A | A | A | A | A | A | A | A | A | A | A |

TABLE 10-continued

|  | Resin composition (II) | Development with alkali | | | | | | Development with organic solvent | | | | | |
|---|---|---|---|---|---|---|---|---|---|---|---|---|---|
|  |  | LWR perfor- mance | CDU perfor- mance | Resolu- tion | Rectangu- larity of cross-sec- tional shape | depth of focus | Exposure latitude | LWR perfor- mance | CDU perfor- mance | Resolu- tion | Rectangu- larity of cross-sec- tional shape | depth of focus | Exposure latitude |
| Example 98 | J2-3 | A | A | A | A | A | A | A | A | A | A | A | A |
| Example 99 | J2-4 | A | A | A | A | A | A | A | A | A | A | A | A |
| Example 100 | J2-5 | A | A | A | A | A | A | A | A | A | A | A | A |
| Example 101 | J2-6 | A | A | A | A | A | A | A | A | A | A | A | A |
| Example 102 | J2-7 | A | A | A | A | A | A | A | A | A | A | A | A |
| Example 103 | J2-8 | A | A | A | A | A | A | A | A | A | A | A | A |
| Example 104 | J2-9 | A | A | A | A | A | A | A | A | A | A | A | A |
| Example 105 | J2-10 | A | A | A | A | A | A | A | A | A | A | A | A |
| Example 106 | J2-11 | A | A | A | A | A | A | A | A | A | A | A | A |
| Example 107 | J2-12 | A | A | A | A | A | A | A | A | A | A | A | A |
| Example 108 | J2-13 | A | A | A | A | A | A | A | A | A | A | A | A |
| Example 109 | J2-14 | A | A | A | A | A | A | A | A | A | A | A | A |
| Example 110 | J2-15 | A | A | A | A | A | A | A | A | A | A | A | A |
| Example 111 | J2-16 | A | A | A | A | A | A | A | A | A | A | A | A |
| Example 112 | J2-17 | A | A | A | A | A | A | A | A | A | A | A | A |
| Comparative Example 3 | CJ2-1 | — | — | — | B | — | — | — | — | — | B | — | — |

TABLE 11

|  | Resin composition (III) | Development with alkali | | | | | |
|---|---|---|---|---|---|---|---|
|  |  | LWR performance | CDU performance | resolution | rectangularity of cross- sectional shape | depth of focus | exposure latitude |
| Example 113 | J3-1 | A | A | A | A | A | A |
| Example 114 | J3-2 | A | A | A | A | A | A |
| Example 115 | J3-3 | A | A | A | A | A | A |
| Example 116 | J3-4 | A | A | A | A | A | A |
| Example 117 | J3-5 | A | A | A | A | A | A |
| Example 118 | J3-6 | A | A | A | A | A | A |
| Example 119 | J3-7 | A | A | A | A | A | A |
| Example 120 | J3-8 | A | A | A | A | A | A |
| Example 121 | J3-9 | A | A | A | A | A | A |
| Example 122 | J3-10 | A | A | A | A | A | A |
| Example 123 | J3-11 | A | A | A | A | A | A |
| Example 124 | J3-12 | A | A | A | A | A | A |
| Example 125 | J3-13 | A | A | A | A | A | A |
| Example 126 | J3-14 | A | A | A | A | A | A |
| Example 127 | J3-15 | A | A | A | A | A | A |
| Example 128 | J3-16 | A | A | A | A | A | A |
| Example 129 | J3-17 | A | A | A | A | A | A |
| Comparative Example 4 | CJ3-1 | — | — | — | B | — | — |

As is clear from the results shown in Tables 8 to 10, when the resin compositions of Examples were used as the radiation-sensitive resin composition, the resin compositions of Examples were superior in LWR performance, CDU performance, resolution, rectangularity of cross-sectional shape, depth of focus and exposure latitude in the case of the ArF exposure and the exposure to an electron beam, and in both cases of the development carried out with an alkali or an organic solvent. In addition, as is clear from the results shown in Table 11, when the resin compositions of Examples were used as the resin composition for forming a protective film for liquid immersion lithography, the resist patterns formed therefrom were superior in LWR performance, CDU performance, resolution and rectangularity of cross-sectional shape in the case of the ArF exposure and the development with an alkali, while a great depth of focus and exposure latitude were exhibited. It is to be noted that an exposure to electron beam is generally known to give a tendency similar to that in the case of the exposure to EUV. Therefore, the resin compositions of Examples are expected to be superior in lithography performances in the case of an exposure to EUV.

The resin composition and the resist pattern-forming methods according to the embodiments of the present invention enable a resist pattern having low LWR and superior CDU, a high resolution, and superior rectangularity of cross-sectional shape to be formed while a great depth of focus and exposure latitude are exhibited. The polymer according to the embodiments of the present invention can be suitably used as a polymer component of the resin composition. Therefore, these can be suitably used for pattern formation in production of semiconductor devices, and the like, in which further progress of miniaturization is expected in the future.

Obviously, numerous modifications and variations of the present invention are possible in light of the above teachings. It is therefore to be understood that within the scope of the appended claims, the invention may be practiced otherwise than as specifically described herein.

The invention claimed is:

1. A resin composition comprising:
   a solvent; and
   a fluorine-containing polymer comprising a structural unit represented by at least one selected from the group consisting of formula (2-1-1), formula (2-1-2), formula (2-1-3), formula (2-1-4), formula (2-1-5), formula (2-1-7) and formula (2-1-8):

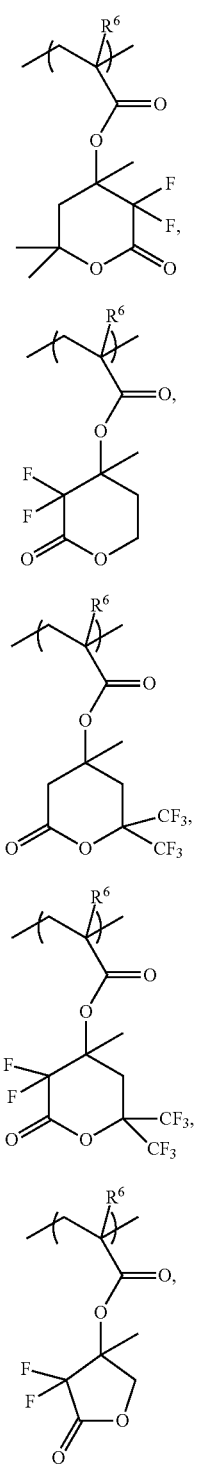

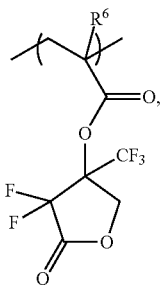

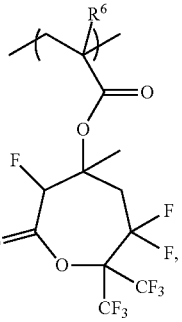

wherein R⁶ represents a hydrogen atom, a fluorine atom, a methyl group or a trifluoromethyl group.

2. The resin composition according to claim 1, further comprising a radiation-sensitive acid generator.

3. The resin composition according to claim 2, further comprising a polymer comprising a structural unit that comprises an acid-labile group, and having a lower percentage content of fluorine atoms than a percentage content of fluorine atoms of the fluorine-containing polymer.

4. A resist pattern-forming method comprising:
   applying the resin composition according to claim 2 directly or indirectly on a substrate to form a resist film;
   exposing the resist film; and
   developing the resist film exposed.

5. A laminate structure comprising:
   a resist film; and
   a protective film which is a cured product of the resin composition according to claim 1, and which is overlaid on the resist film.

6. The resin composition according to claim 1, wherein the fluorine-containing polymer further comprises: a structural unit comprising an acid-labile group; and a structural unit comprising at least one selected from the group consisting of a lactone structure, a cyclic carbonate structure and a sultone structure.

7. The resin composition according to claim 6, wherein an amount of the structural unit represented by at least one selected from the group consisting of formula (2-1-1), formula (2-1-2), formula (2-1-3), formula (2-1-4), formula (2-1-5), formula (2-1-7) and formula (2-1-8) in the fluorine-containing polymer with respect to total structural units constituting the fluorine-containing polymer is from 10 to 30 mol %.

8. The resin composition according to claim 1, wherein the fluorine-containing polymer further comprises: a structural unit comprising an acid-labile group; and a structural unit which has a fluorine atom and which is not the structural unit comprising a group represented by formula (1):

(1)

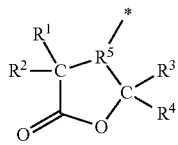

wherein, in the formula (1), $R^1$ to $R^4$ each independently represent a hydrogen atom, a fluorine atom or a monovalent organic group having 1 to 20 carbon atoms, wherein at least one of $R^1$ to $R^4$ represents the fluorine atom or a group comprising the fluorine atom, $R^5$ represents a substituted or unsubstituted trivalent chain hydrocarbon group having 1 to 7 carbon atoms, and * denotes a binding site to other moiety of the structural unit.

9. The resin composition according to claim 8, wherein an amount of the structural unit represented by at least one selected from the group consisting of formula (2-1-1), formula (2-1-2), formula (2-1-3), formula (2-1-4), formula (2-1-5), formula (2-1-7) and formula (2-1-8) in the fluorine-containing polymer with respect to total structural units constituting the fluorine-containing polymer is from 60 to 80 mol %.

10. The resin composition according to claim 1, wherein the fluorine-containing polymer further comprises: a structural unit comprising a group having a hydroxy group at the end thereof and at least one fluorine atom or a fluorinated alkyl group on a carbon atom adjacent to the hydroxy group.

11. The resin composition according to claim 10, wherein an amount of the structural unit represented by at least one selected from the group consisting of formula (2-1-1), formula (2-1-2), formula (2-1-3), formula (2-1-4), formula (2-1-5), formula (2-1-7) and formula (2-1-8) in the fluorine-containing polymer with respect to total structural units constituting the fluorine-containing polymer is from 35 to 60 mol %.

12. A polymer comprising a structural unit represented by at least one selected from the group consisting of formula (2-1-1), formula (2-1-2), formula (2-1-3), formula (2-1-4), formula (2-1-5), formula (2-1-7) and formula (2-1-8):

(2-1-1)

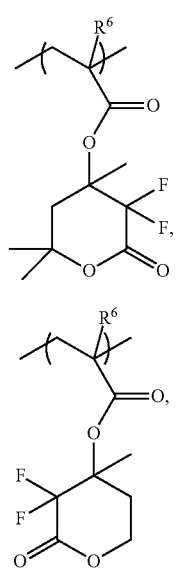

(2-1-2)

(2-1-3)

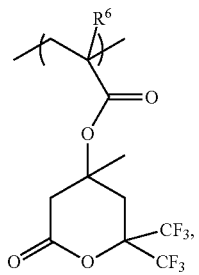

(2-1-4)

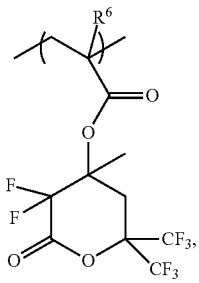

(2-1-5)

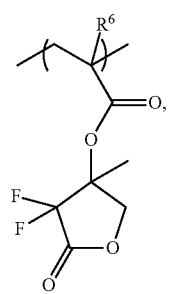

(2-1-7)

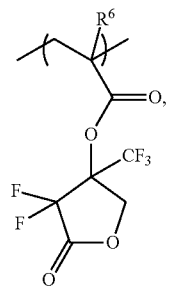

(2-1-8)

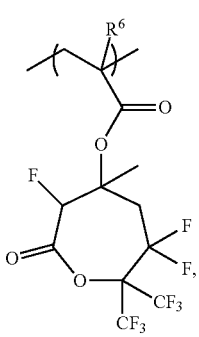

wherein $R^6$ represents a hydrogen atom, a fluorine atom, a methyl group or a trifluoromethyl group.

* * * * *